United States Patent
Kanda

(10) Patent No.: US 10,678,132 B2
(45) Date of Patent: Jun. 9, 2020

(54) RESIN FOR HYDROPHOBILIZING RESIST SURFACE, METHOD FOR PRODUCTION THEREOF, AND POSITIVE RESIST COMPOSITION CONTAINING THE RESIN

(75) Inventor: Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 764 days.

(21) Appl. No.: 12/048,629

(22) Filed: Mar. 14, 2008

(65) Prior Publication Data

US 2008/0227025 A1   Sep. 18, 2008

(30) Foreign Application Priority Data

Mar. 14, 2007 (JP) ................. P2007-065324
Jan. 22, 2008 (JP) ................. P2008-011716

(51) Int. Cl.
| | | |
|---|---|---|
| *G03F 7/004* | (2006.01) | |
| *G03F 7/30* | (2006.01) | |
| *C08F 210/00* | (2006.01) | |
| *C08F 220/24* | (2006.01) | |
| *C08F 220/40* | (2006.01) | |
| *C08F 214/18* | (2006.01) | |
| *G03F 7/039* | (2006.01) | |
| *G03F 7/075* | (2006.01) | |
| *G03F 7/11* | (2006.01) | |
| *G03F 7/20* | (2006.01) | |

(52) U.S. Cl.
CPC .......... *G03F 7/0046* (2013.01); *C08F 210/00* (2013.01); *C08F 214/18* (2013.01); *C08F 220/24* (2013.01); *C08F 220/40* (2013.01); *G03F 7/0397* (2013.01); *G03F 7/0758* (2013.01); *G03F 7/11* (2013.01); *G03F 7/2041* (2013.01); *G03F 7/30* (2013.01)

(58) Field of Classification Search
CPC ........ G03F 7/0397; G03F 7/30; G03F 7/0046; G03F 7/2041; G03F 7/0758; C08F 210/00; C08F 220/24; C08F 214/18; C08F 220/40
USPC ....... 430/270.1, 905, 907, 910, 326; 526/88, 526/78, 79, 82, 85, 86, 87, 242, 245, 251, 526/262, 269, 319, 346
See application file for complete search history.

(56) References Cited

U.S. PATENT DOCUMENTS

| | | | | |
|---|---|---|---|---|
| 7,635,554 B2 * | 12/2009 | Fukuhara | ............... | G03F 7/0045 430/270.1 |
| 7,968,268 B2 * | 6/2011 | Wang | ................... | G03F 7/0046 430/270.1 |
| 8,871,421 B2 | 10/2014 | Kanda et al. | | |
| 9,057,952 B2 | 6/2015 | Kanda et al. | | |
| 2004/0167298 A1 * | 8/2004 | Yamagishi et al. | ............. | 526/72 |
| 2005/0014090 A1 | 1/2005 | Hirayama et al. | | |
| 2006/0008736 A1 | 1/2006 | Kanda et al. | | |
| 2006/0246373 A1 | 11/2006 | Wang | | |
| 2007/0054217 A1 | 3/2007 | Kodama et al. | | |
| 2007/0134588 A1 * | 6/2007 | Kanda et al. | ............... | 430/270.1 |
| 2007/0148589 A1 * | 6/2007 | Kanda et al. | ............... | 430/270.1 |
| 2007/0178405 A1 * | 8/2007 | Kanda | ................... | G03F 7/0046 430/270.1 |
| 2008/0305433 A1 | 12/2008 | Kanda et al. | | |
| 2012/0115085 A1 | 5/2012 | Kanda et al. | | |
| 2015/0185609 A1 | 7/2015 | Kanda et al. | | |

FOREIGN PATENT DOCUMENTS

| | | |
|---|---|---|
| EP | 1754999 A2 | 2/2007 |
| EP | 1903394 A1 | 3/2008 |
| JP | 6-172456 A | 6/1994 |
| JP | 10-303114 A | 11/1998 |
| JP | 2006-48029 A | 2/2006 |
| JP | 2006-58842 A | 3/2006 |
| JP | 2006282686 A * | 10/2006 |
| JP | 2006-309245 A | 11/2006 |
| KR | 10-2004-0075742 A | 8/2004 |
| KR | 10-2007-0014086 A | 1/2007 |
| WO | 98/01478 A1 | 1/1998 |
| WO | 2004/068242 A1 | 8/2004 |
| WO | 2005/031462 A1 | 4/2005 |

OTHER PUBLICATIONS

B.J. Lin, "Semiconductor Foundry, Lithography, and Partners", Emerging Lithographic Technologies VI, 2002, pp. 11-24, vol. 4688, Proceedings of SPIE.
J.A. Hoffnagle et al., "Liquid immersion deep-ultraviolet interferometric lithography", J. Vac. Sci. Technol. B, Nov./Dec. 1999, pp. 3306-3309, vol. 17, No. 6, American Vacuum Society.
Extended European Search Report dated Aug. 7, 2008.
Office Action issued on Dec. 17, 2010 in counterpart European Application No. 08004852.3.
Office Action dated May 22, 2012 on Japanese Application No. 2008-066747.
Office Action dated May 7, 2013 issued by the Japanese Patent Office in counterpart Japanese Patent Application No. 2008-066747.
Office Action issued by the Taiwanese Patent Office dated Jun. 24, 2013 in corresponding Taiwan Application No. 097108959.
Office Action dated Dec. 26, 2013, issued by the Korean Intellectual Property Office in counterpart Korean Application No. 10-2008-0023974.
Office Action, Issued by the Korean Intellectual Property Office, dated Sep. 25, 2014, in counterpart Korean Application No. 10-2008-0023974.
Office Action dated Jul. 14, 2015, issued by the Korean Intellectual Property Office in counterpart Korean Application No. 10-2008-0023974.
Office Action dated Nov. 10, 2015 issued by the Korean Intellectual Property Office in counterpart Korean Patent Application No. 10-2008-0023974.

(Continued)

*Primary Examiner* — John S Chu
(74) *Attorney, Agent, or Firm* — Sughrue Mion, PLLC

(57) ABSTRACT

A resin is to be added to a resist composition and localized on a surface of a resist film so as to hydrophobilize the surface of a resist film and has a peak area of a high molecular weight component having a molecular weight of 30,000 or more is 0.1% or less of a total peak area in a molecular weight distribution measured by gel permeation chromatography.

13 Claims, 1 Drawing Sheet

(56) References Cited

OTHER PUBLICATIONS

Office Action dated Jun. 7, 2016 issued by Korean Intellectual Property Office in counterpart Korean Application No. 10-2016-0030502.
Trial Decision dated Aug. 19, 2016, issued by the Korean Intellectual Property Office in counterpart Korean Application No. 10-2008-0023974.
Office Action dated Feb. 27, 2017, issued by the Korean Intellectual Property Office in counterpart Korean Application No. 10-2016-0030502.
Communication dated Apr. 22, 2019, issued by the Korean Patent Office in counterpart Korean Application No. 10-2016-0030502.

* cited by examiner

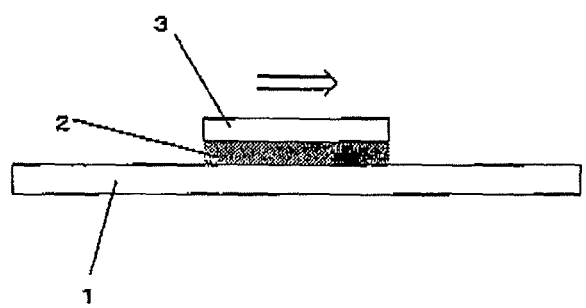

RESIN FOR HYDROPHOBILIZING RESIST SURFACE, METHOD FOR PRODUCTION THEREOF, AND POSITIVE RESIST COMPOSITION CONTAINING THE RESIN

FIELD OF THE INVENTION

The present invention relates to a positive resist composition for use in a lithography process for production of semiconductor devices, for example, IC, production of circuit substrates for liquid crystals, thermal heads and the like, and other photo-fabrications, a resin for use in the positive resist composition, a compound for use in synthesis of the resin, and a pattern-forming method using the positive resist composition. In particular, the invention relates to a positive resist composition suitable for exposure by an immersion projection exposure apparatus with a far ultraviolet ray having a wavelength of 300 nm or less as a light source, a resin for use in the positive resist composition, a compound for use in synthesis of the resin, and a pattern-forming method using the positive resist composition.

BACKGROUND OF THE INVENTION

With the progress of miniaturization of semiconductor element, shortening of the wavelength of exposure light source and increasing of the numerical aperture (high NA) of projection lens have advanced, and now an exposure apparatus using an ArF excimer laser having a wavelength of 193 nm as the light source have been developed. In recent years, as a method for achieving the formation of a finer pattern, immersion lithography to which a technique for increasing resolution as to an optical microscope is applied has been known. According to the immersion lithography, the exposure is performed while filling a liquid of high refractive index (hereinafter also referred to as an "immersion liquid") between a projection lens and a sample.

The recent technical progress of immersion exposure is reported, for example, in *SPIE Proc.*, 4688, 11 (2002), *J. Vac. Sci. Technol. B*, 17 (1999) and JP-A-10-303114 (the term "JP-A" as used herein means an "unexamined published Japanese patent application"). When an ArF excimer laser is used as the light source, it is believed that pure water (having a refractive index of 1.44 at 193 nm) is most promising as the immersion liquid in view of the safety in handling and the transmittance and refractive index at 193 nm.

In WO 2004/068242 (corresponding to US2005/0014090A1), an example is described wherein the resist performance changes by the immersion of a resist for ArF exposure in water before and after exposure and it is pointed out that this is a problem in the immersion exposure. Also, in JP-A-2006-58842, a problem is pointed out in that a component, for example, an acid, in the resist dissolves from the resist layer in the immersion liquid to cause contamination on the surface of lens.

As a means of solving the problems, it is proposed that the migration (dissolution) of resist component in the immersion liquid during the contact of the resist layer with the immersion liquid in the exposure step can be prevented by adding a substance which moves to the upper portion of the resist layer after coating in JP-A-2006-48029 (corresponding to US2006/0008736A1) and JP-A-2006-309245 (corresponding to US2006/0246373A1).

Further, as a result of intensive investigations, it has been found that the addition of a hydrophobic resin to the resist layer not only can prevent the dissolution of resist component but also can hydrophobilize the surface layer so that a receding contact angle of the surface of resist layer against water can be increased to improve the followability of immersion liquid when the resist layer is brought into contact with water in case of using water as the immersion liquid medium.

However, in case of coating a resist to which a resin including a high molecular weight component is added, a phase separation occurs at the formation of a layer on the surface thereby degrading coating property. Also, since the high molecular weight component is insoluble in alkali, it is necessary to improve development defect.

SUMMARY OF THE INVENTION

Therefore, an object of the present invention is to provide a resin which favorably hydrophobilizes the surface of resist film to improve the followability of immersion liquid in patterning by immersion exposure and which exhibits an effect of preventing coating defect and development defect, a method for production of the resin, and a positive resist composition containing the resin.

The object of the present invention can be achieved by a resin having the composition described below, a method for production of the resin, and a positive resist composition containing the resin.

<1> A resin which is to be added to a resist composition and localized on a surface of a resist film so as to hydrophobilize the surface of a resist film and in which a peak area of a high molecular weight component having a molecular weight of 30,000 or more is 0.1% or less of a total peak area in a molecular weight distribution measured by gel permeation chromatography (GPC).

<2> The resin as described in <1> above which has a group or structure selected from a perfluoroalkyl group having from 1 to 4 carbon atoms, a fluorinated alcohol group, an alkylsilyl structure, a cyclic siloxane structure, a sulfonimido group and a bis(carbonyl)methylene group, particularly, the resin as described in <1> above which has a fluorinated alcohol group (preferably, a hexafluoroisopropanol group).

<3> A method for production of the resin which is to be added to a resist composition as described in <1> or <2> above comprising supplying continuously or intermittently a solution containing a polymerizable monomer and a solution containing a polymerization initiator from tanks separated from each other to a polymerization system heated at polymerization temperature to undergo radical polymerization.

<4> The method for production of the resin as described in <3> above, wherein a polymerization inhibitor in an amount of 20 mol ppm or more based on the monomer or oxygen in an amount of 400 mol ppm or more based on the monomer coexists in the solution containing a polymerizable monomer.

<5> The method for production of the resin as described in <3> or <4> above, wherein the solution containing a polymerizable monomer contains a chain transfer agent.

<6> The method for production of the resin as described in any one of <3> to <5> above, which further comprises being precipitated the resin formed to purify, redissolving the resin obtained by solid-liquid separation in an organic solvent and concentrating a resin solution obtained to distill off a low boiling point solvent contained in the resin solution.

<7> A positive resist composition comprising (A) a resin which has a monocyclic or polycyclic alicyclic hydrocarbon structure and increases solubility in an alkali developer by an action of an acid, (B) a compound which generates an acid upon irradiation of an actinic ray or radiation, (C) the resin as described in <1> or <2> above, and (D) a solvent.
<8> The positive resist composition as described in <7> above, wherein the resin (C) is a resin produced by the method as described in any one of <3> to <6> above.
<9> A pattern-forming method comprising forming a resist film using the positive resist composition as described in <7> or <8> above, and exposing and developing the resist film.

According to the present invention, a resin in which a high molecular weight component is removed can be synthesized, a resin preferable for a resin which favorably hydrophobilizes the surface of resist film in patterning by immersion exposure is obtained, and a positive resist composition which hydrophobilizes the surface of resist film to improve the followability of immersion liquid, which is prevented from the occurrence of coating defect and development defect, and which is suitable for patterning by immersion exposure can be provided.

BRIEF DESCRIPTION OF THE DRAWINGS

FIG. 1 is a schematic view illustrating an evaluation method of water followability.

DESCRIPTION OF REFERENCE NUMERALS AND SIGNS

1: Wafer
2: Pure water
3: Quartz glass substrate

DETAILED DESCRIPTION OF THE INVENTION

The invention will be described in more detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

[1] Hydrophobilizing Resin (HR) and Method for Synthesis Thereof

As the hydrophobilizing resin (HR) which is to be added to a resist composition so as to hydrophobilize the surface of a resist film in patterning by immersion exposure, a resin in which a peak area of a high molecular weight component having a molecular weight of 30,000 or more is 0.1% or less of a total peak area in a molecular weight distribution measured by gel permeation chromatography (GPC) is preferable. When the peak area of a high molecular weight component having a molecular weight of 30,000 or more exceeds 0.1% of the total peak area, the coating defect and development defect may tend to occur.

In the specification of the invention, a ratio (%) of the peak area of a high molecular weight component having a molecular weight of 30,000 or more to the total peak area in the resin which is to be added to a resist composition is a value calculated using the following method. Specifically, Solution (A) of a resin which is to be added to a resist composition having a certain concentration is prepared and a molecular weight distribution of the resin is measured by GPC to determine a peak area Ap of the resin. Then, Solution (B) of the resin which is to be added to a resist composition having a concentration of ten times the concentration of Solution (A) is prepared and a molecular weight distribution of the resin is measured by GPC to determine a peak area Ah of a polymer component corresponding to a high molecular weight having a molecular weight of 30,000 or more.

Using Ap and Ah thus-obtained, the ratio (%) of the peak area of a high molecular weight component having a molecular weight of 30,000 or more to the total peak area in the resin which is to be added to a resist composition is calculated according to the following calculation formula:

$$[Ah/((Ap\times10)+Ah)]\times100(\%)$$

The ratio (%) of the peak area of a high molecular weight component having a molecular weight of 30,000 or more to the total peak area in the resin can be calculated with accuracy by using the method described above, even when the amount of the high molecular weight component having a molecular weight of 30,000 or more is minimal.

The molecular weight distribution by GPC is measured using a refractive index detector (RI) as a detector and calculated based on a calibration curve prepared using a commercially available polystyrene standard sample.

<Method for Synthesis of Resin (HR)>

The resin (HR) can be synthesized by supplying continuously or intermittently a solution (hereinafter, also referred to as a "monomer solution") containing a polymerizable monomer and a solution (hereinafter, also referred to as a "initiator solution") containing a polymerization initiator stored separately to a polymerization system to undergo radical polymerization, whereby a formation of the high molecular weight component having a molecular weight of 30,000 or more is restrained to control the content of the high molecular weight component to 0.1% or less.

The component other than the monomer in the monomer solution includes, for example, a solvent, a polymerization inhibitor, oxygen or a chain transfer agent. The component other than the polymerization initiator in the initiator solution includes, for example, a solvent.

<Polymerization Concentration>

The polymerization concentration may vary a combination of the solute and the solvent in each solution, but ordinarily, it is preferably from 5 to 60% by weight, more preferably from 30 to 50% by weight, in terms of final concentration of the solutes (the monomer and polymerization initiator) at the termination of supplying the monomer solution and the initiator solution.

A concentration of the monomer in the monomer solution is preferably from 5 to 60% by weight, more preferably from 30 to 50% by weight.

The monomer is preferably a monomer having a low metal content, for example, a monomer having a metal content of 100 weight ppb or less, is preferable.

A concentration of the polymerization initiator in the initiator solution is preferably from 5 to 60% by weight, more preferably from 30 to 50% by weight.

<Polymerization Restraining Component>

It is preferred that a polymerization inhibitor in an amount of 20 mol ppm or more based on the monomer or oxygen in an amount of 400 mol ppm or more based on the monomer exists as the polymerization restraining component in the solution containing the monomer as a raw material.

By the coexistence of the polymerization restraining component in the solution containing the monomer, the formation of the high molecular weight component is restrained at the radical polymerization.

The polymerization restraining component coexisting in the solution containing the monomer according to the invention includes compounds ordinarily used as polymerization inhibitors and oxygen.

As the polymerization inhibitor, any known polymerization inhibitor can be used. Specific examples of the polymerization inhibitor include hydroquinone and a hydroquinone derivative, for example, 4-methyoxyphenol, tert-butylhydroquinone or 2,5-di-tert-butylhydroquinone; benzoquinone and a benzoquinone derivative, for example, methylbenzoquinone or tert-butylbenzoquinone; catechol and a catechol derivative, for example, 4-tert-butylcatecol; phenothiazine and a derivative thereof; N-nitrosophenylhydroxylamine and a derivative thereof; and 2,2,6,6-tetramethylpiperizine-1-oxyl free radical and a derivative thereof. The polymerization inhibitors my be used individually or as a mixture.

The polymerization restraining component is preferably at least one compound selected from hydroquinone, benzoquinone, catechol, N-nitrosophenylhydroxylamine, 2,2,6,6-tetramethylpiperizine-1-oxyl free radical and derivatives thereof.

It is preferred that the polymerization restraining component is previously present in the monomer solution prior to the preparation of the monomer solution.

The amount of the polymerization inhibitor coexisting in the solution containing the monomer is preferably 20 mol ppm or more based on the monomer, because when it is too small, the effect of trapping a radical is low.

The upper limit of the amount of the polymerization inhibitor is not particularly restricted, but it is preferably 5,000 mol ppm or less, more preferably 3,000 ppm or less, based on the monomer, because when it is too large, the polymerization reaction does not proceed sufficiently and the polymerization inhibitor remains in the polymer even after purification and some of them may absorb radiation for use in lithography.

Since oxygen has a radical trapping function, it can be used as the polymerization restraining component according to the invention. However, in order to achieve the purpose according the invention by using only oxygen without using the polymerization inhibitor described above, the coexistence of a relatively large amount of oxygen is necessary, because oxygen has a low radical trapping function in comparison with the polymerization inhibitor. The amount of oxygen dissolved in the monomer solution is preferably 400 mol ppm or more based on the monomer.

As a method for coexisting oxygen at the concentration described above with the monomer, a method maintaining the solution containing the monomer in oxygen or air atmosphere or a method of bubbling oxygen or air through the solution is exemplified. Also, a solvent maintained in oxygen or air or a solvent bubbled with oxygen or air atmosphere may be used in the preparation of the solution containing the monomer.

Since the polymerization in oxygen atmosphere has a problem of safety and it is difficult to obtain a polymer while stably maintaining the quality due to change of the dissolved oxygen concentration in the polymerization system by heating, the coexistence of oxygen in an unnecessarily large amount is not preferable. Therefore, the upper limit of the amount of dissolved oxygen is preferably 10,000 mol ppm (1 mol %) or less based on the monomer.

With respect to the gas zone in the polymerization system, the oxygen is substituted with an inert gas, for example, nitrogen gas before the introduction of the solution containing a monomer or the heating of the solution to polymerization temperature so that the oxygen concentration in the gas zone is controlled not to exceed the explosion limit.

<Polymerization Initiator>

The polymerization initiator is not particularly restricted as long as it is ordinarily used as a radical initiator and a peroxide initiator or an azo initiator is ordinarily used.

As the radical initiator, an azo initiator is preferable and an azo initiator having an ester group, a cyano group or a carboxyl group is more preferable.

Specific examples of the azo initiator include azobisisobutyronitrile, 2,2'-azobis(2-methylbutyronitrile), 2,2'-azobis(2,4-dimethylvarelonitrile), dimethyl azobisisobutyrate and azobis(4-cyanovarelic acid).

Specific examples of the peroxide initiator include a peroxyester polymerization initiator, for example, benzoyl peroxide, decanoyl peroxide, lauroyl peroxide, bis(3,3,5-trimethylhexanoyl)peroxide, succinic acid peroxide, tert-butylperoxy-2-ethylhexanoate or 1,1,3,3-tetramethylbutylperoxy-2-ethylhexanoate, a ketone peroxide polymerization initiator, for example, methyl ethyl ketone peroxide, a peroxy ketal polymerization initiator, for example, 1,1-bis(tert-hexylperoxy)-3,3,5-trimethylcyclohexane, a hydroperoxide polymerization initiator, for example, 1,1,3,3-tetramethylbutylhydroperoxide, a diacylperoxide polymerization initiator, for example, isobutyrylperoxide, and a peroxydicarbonate polymerization initiator, for example, di-n-propylperoxydicarbonate.

The amount of the polymerization initiator and the chain transfer agent described hereinafter used is not generally determined because it may be varied according to the production conditions, for example, a monomer as a raw material or a polymerization initiator used in the polymerization reaction, a kind of chain transfer agent, polymerization temperature, a polymerization solvent, a polymerization method or a purification condition, and an optimum amount necessary for achieving the desired molecular weight is selected.

The amount of the polymerization initiator and chain transfer agent added, polymerization concentration, polymerization temperature and the like are so controlled that the weight average molecular weight of the resulting resin is preferably in a range of 2,000 to 20,000, more preferably in a range of 2,000 to 10,000.

<Polymerization Solvent>

As the reaction solvent, a solvent capable of dissolving the composition according to the invention, for example, an ester, e.g. ethyl acetate, butyl acetate, propylene glycol monomethyl ether acetate, ethyl lactate, ethyl 3-ethyoxypropionate, ethyl pyruvate, 2-ethoxyethyl acetate, 2-(2-ethoxyethoxy)ethyl acetate, ethyl benzoate or γ-butyrolactone, a carbonate, e.g., propylene carbonate, a ketone, e.g., acetone, ethyl methyl ketone, diethyl ketone, isobutyl methyl ketone, tert-butyl methyl ketone, cyclopentanone or cyclohexanone, an ether, e.g., diethyl ether, diisopropyl ether, tert-butyl methyl ether, dibutyl ether, dimethoxyethane, propylene glycol monomethyl ether, anisole, dioxane, dioxolan or tetrahydrofuran, an alcohol, e.g., isopropanol or butanol, a nitrile, e.g., acetonitrile or propionitrile, an aromatic hydrocarbon, e.g., toluene or xylene, or an amide, e.g., dimethylformamide or dimethylacetamide, and a mixture of these solvents are exemplified. Of the solvents, for example, propylene glycol monomethyl ether acetate, propylene glycol monomethyl ether, ethyl lactate, γ-butyrolactone, cyclohexanone or cyclopentanone is preferable.

The polymerization solvent is preferably same as a solvent for dissolving an undried resin (wet polymer) after reprecipitation described hereinafter and a solvent for a resist.

<Polymerization Temperature>

The polymerization temperature is ordinarily from 10 to 150° C., preferably from 30 to 120° C., more preferably from 60 to 100° C.

<Chain Transfer Agent>

From the standpoint of further restraining the formation of the high molecular weight component, it is preferred to add a chain transfer agent to the solution containing the monomer. The chain transfer agent may be added to the polymerization system before the initiation of polymerization.

As the chain transfer agent, a compound capable of undergoing radical chain transfer is used without particular limitation, and a thiol compound and a disulfide compound are exemplified.

The chain transfer agent is preferably a thiol compound having at least one group selected from an alkyl group, a hydroxy group, a fluoroalkyl group, an ester group, an acid group and a phenyl group.

Specific examples of the thiol compound include an alkyl thiol compound, for example, dodecanethiol, mercaptoethanol or mercaptopropanol, a thiol compound having a hydroxy group, for example, mercaptoethanol, mercaptopropanol or mercaptopropanediol, a thiol compound having a fluoroalkyl group, for example, perfluorooctylthiol or perfluorodekanethiol, a thiol compound having an ester group, for example, methyl thioglycolate, ethyl thioglycolate, n-butyl thioglycolate, methyl mercaptopropionate or ethyl mercaptopropionate, a thiol compound having an acid group, for example, mercaptoacetic acid or mercaptopropionic acid, and a thiol compound having a phenyl group, for example, toluenethiol, fluorobenzenetiol, mercaptophenol or mercaptobenzoic acid.

<Feeding Procedure of Polymerization>

The resin (HR) is obtained by supplying continuously or intermittently a solution (monomer solution) containing a monomer as a raw material and a solution (initiator solution) containing a polymerization initiator from tanks separated from each other to a polymerization system heated at polymerization temperature to undergo radical polymerization.

After the initiation of polymerization by supplying the monomer solution and the initiator solution, the monomer solution and the initiator solution are supplied continuously or intermittently.

The polymerization system may be a solution containing a monomer previously dissolved in a solvent or a solvent alone.

When the polymerization system is the solution containing a monomer dissolved in a solvent, since there is a possibility that the high molecular weight component is formed during the preservation of the solution in the state of heating at high temperature for a long period of time, the heating is preferably conducted just before polymerization.

The polymerization reaction is preferably performed under inert gas atmosphere, for example, nitrogen or argon.

The monomer solution and the initiator solution may be supplied from tanks separated from each other to a polymerization tank or may be supplied by conducting pre-mixture just before the polymerization. The pre-mixture just before the polymerization can be conducted so as not to form the high molecular weight component during the preservation of the monomer solution and the initiator solution for a long period of time and, for example, it is desirably conducted within one hour before the initiation of polymerization.

The supply rates of the monomer solution and the initiator solution can be arranged independently of each other so as to obtain a resin having the desired molecular weight distribution. It is possible to obtain a resin having a wide range of the molecular weight distribution from narrow dispersity to polydispersity with good reproducibility by changing one or both of the supply rates of the solutions. For instance, when the supply amount of the initiator solution is reduced at the early stage of reaction and the supply amount of the initiator solution is increased at the latter stage of reaction, a resin of polydispersity is obtained because a resin having a relatively high molecular weight is formed in the early stage of reaction where a radical concentration is low.

When the monomer solution and the initiator solution are supplied as slowly as possible, the monomer composition, temperature and radical concentration in the polymerization system are maintained constantly so that the variations in the composition and molecular weight of the resins formed in the initial stage and final stage of polymerization can be reduced.

However, when the supply rate is too much slow, the time necessary for the supply becomes long to decrease the production efficiency and a problem may arise in some cases in that the monomer solution deteriorates in case of containing the monomer of low stability. Therefore, the times for supply of the solutions are determined in a range of 0.5 to 20 hours, preferably in a range of 1 to 10 hours, respectively.

The order of initiation of supplying the monomer solution and the initiator solution is not particularly restricted, and it is preferred to supply both solutions simultaneously or to supply the initiator solution first in order to avoid the formation of the high molecular weight component. Since a certain period of time is necessary for the polymerization initiator to decompose to generate a radical, it is preferred to supply the initiator solution ahead of the monomer solution.

While supplying the monomer solution and the initiator solution, it is preferred to control the polymerization system at the desired temperature ±5° C., preferably at the desired temperature ±2° C.

The temperatures of the monomer solution and the initiator solution are preferably from 10 to 30° C., respectively.

The polymerization reaction is initiated by supplying the monomer solution and the initiator solution and continued. Even after the completion of the supply, it is preferred to maintain the polymerization temperature for a certain period of time to conduct ripening thereby promoting the reaction of the remaining unreacted monomer. The time for ripening is ordinarily within 6 hours and is preferably selected in a range of 1 to 4 hours. When the time for ripening is too long, the production efficiency decreases and it is not preferred because the resin is subjected to excessive heat history.

<Reprecipitation Process>

The resin obtained by the polymerization reaction described above is deposited by dropwise adding the polymerization reaction solution to a poor solvent alone or a mixed solvent of a poor solvent and a good solvent and washed, if desired, thereby removing unwanted substances, for example, the unreacted monomer, oligomer or the polymerization initiator and its reaction residue to conduct purification.

The poor solvent is not particularly restricted as long as it does not dissolve the resin and depending on the kind of the resin, it is appropriately selected from a hydrocarbon (an aliphatic hydrocarbon, for example, pentane, hexane, heptane or octane; an alicyclic hydrocarbon, for example, cyclohexane or methylcyclohexane; or an aromatic hydrocarbon, for example, benzene, toluene or xylene), a halogenated hydrocarbon (a halogenated aliphatic hydrocarbon, for example, methylene chloride, chloroform or carbon tetrachloride; or a halogenated aromatic hydrocarbon, for example, chlorobenzene or dichlorobenzene), a nitro compound (for example, nitromethane or nitroethane), an nitrile (for example, acetonitrile or benzonitrile), an ether (a chain ether, for example, diethyl ether, diisopropyl ether or dimethoxyethane; or a cyclic ether, for example, tetrahydrofuran or dioxane), a ketone (for example, acetone, methyl ethyl ketone or diisobutyl ketone), an ester (for example, ethyl acetate or butyl acetate), a carbonate (for example, dimethyl carbonate, diethyl carbonate, ethylene carbonate or propylene carbonate), an alcohol (for example, methanol, ethanol, propanol, isopropyl alcohol or butanol), a carboxylic acid (for example, acetic acid), water, and mixed solvents containing these solvents. The poor solvent is preferably water, an alcohol, for example, methanol or isopropanol, or a saturated hydrocarbon, for example, hexane or heptane.

The good solvent is not particularly restricted as long as it dissolves the monomer, oligomer, polymerization initiator and its reaction residue, and is preferably a solvent same as the polymerization solvent in view of control of the production process.

The resin is precipitated as a solid by bringing the reaction solution into contact with a solvent (poor solvent) which hardly dissolves or does not dissolve the resin in a volume amount 10 times or less, preferably from 10 to 5 times, of the reaction solution.

The amount of the solvent used for the precipitation or reprecipitation is appropriately determined taking, for example, the efficiency or yield into consideration and is ordinarily from 100 to 10,000 parts by weight, preferably from 200 to 2,000 parts by weight, more preferably from 300 to 1,000 parts by weight, based on 100 parts by weight of the resin solution.

The temperature for the precipitation or reprecipitation is appropriately determined taking, for example, the efficiency or operability into consideration and is ordinarily from about 0 to about 50° C., preferably room temperature (for example, from about 20 to about 35° C.). The operation of the precipitation or reprecipitation can be conducted using a conventional mixing vessel, for example, a stirring tank, according to a known method, for example, a batch type or a continuous type.

<Processes after Filtration>

Since the thus-obtained resin after purification includes the solvent used at the purification, the resin is subjected to conventional solid-liquid separation, for example, filtration or centrifugation, dried and then dissolved in a resist solvent to prepare a resist solution.

The drying is carried out at normal pressure or under reduced pressure, and at temperature ordinarily from about 30 to about 100° C., preferably from about 30 to about 50° C.

The resist solvent is not particularly restricted as long as it can dissolve the resin, and it is ordinarily selected taking a boiling point, influence with a semiconductor substrate or other coating film and absorption of radiation used in lithography into consideration.

<Processes after Filtration (Solution Supply)>

It is preferred that the thus-obtained resin after purification is dissolved in a good solvent, for example, a resist solvent or a polymerization solvent and then other solvent is distilled off under reduced pressure while supplying the resist solvent, if desired, to prepare a resist solution. Specifically, it is preferred that the resin (undried resin) obtained by the precipitation purification and solid-liquid separation is redissolved in an organic solvent, and the resulting resin solution is concentrated to distill off a low boiling point solvent included in the resin solution.

The organic solvent for redissolving the undried resin obtained is preferably a solvent same as the polymerization solvent.

Ordinarily, when a resin subjected to drying under reduced pressure is dissolved in a resist solvent, probably due to hardening of the surface of resin particle or aggregation between the resin particles, it is recognized that the resin is hardly dissolved in the solvent at the preparation of resist in some cases. Also, when the resist obtained by dissolving the resin is coated to form a hydrophobic layer as a surface layer, it is recognized that the coating property is poor or the coating defect occurs in some cases.

However, these problems can be alleviate while keeping the state of dissolving the resin in a solvent by the solvent substitution without conducting drying as described above.

The organic solvent for redissolving the undried resin is preferably same as a solvent used at the preparation of resist solution and includes, for example, an alkylene glycol monoalkyl ether carboxylate, an alkylene glycol monoalkyl ether, an alkyl lactate, an alkyl alkoxypropionate, a cyclic lactone having from 4 to 10 carbon atoms, a monoketone compound having from 4 to 10 carbon atoms which may contain a ring, an alkylene carbonate, an alkyl alkoxyacetate and an alkyl pyruvate.

Specific examples of the resist solvent include propylene glycol monomethyl ether acetate, propylene glycol monomethyl ether, ethyl lactate, γ-butyrolactone, cyclohexanone, cyclopentanone, methyl amyl ketone, propylene carbonate, ethylene glycol monoethyl ether acetate, ethyl 3-ethoxypropionate, ethyl pyruvate, 2-ethoxyethyl acetate and 2-(2-ethoxyethoxy)ethyl acetate.

The amount of the resist solvent is not particularly restricted and is ordinarily in a range of 1 to 20 parts by weight based on 1 part by weigh of the resin.

The resist solvents may be used individually or in combination of two or more thereof.

<Physical Property and Composition of Resin (HR)>

As the resin (HR) which is localized on a surface of a resist film so as to hydrophobilize the surface of a resist film, a resin which increases a receding contact angle of the surface of a resist film by adding to a resist composition may be used, however, it has been found that the reduction of the content of the high molecular weight component having a molecular weight of 30,000 to 0.1% or less as described above is extremely effective in the patterning by the immersion exposure.

Of the resins (HR), a resin (HR) which exhibits the receding contact angle of 70 to 110° is preferable, when the resin alone is dissolved in a solvent, coated and dried to prepare a layer made of the resin alone and the receding contact angle of the resulting layer is measured.

In case of adding the resin (HR) to a resist, the amount of the resin (HR) added is preferably from 0.1 to 20% by weight, more preferably from 0.1 to 10% by weight, still more preferably from 0.1 to 5% by weight, based on the total solid content of the resist composition.

It is preferred that the amount of the resin (HR) added is appropriately adjusted so that the resist film has the receding contact angle of 60 to 80°.

The receding contact angle as used herein means that measured at normal temperature and normal pressure. The receding contact angle is a contact angle of a receding side when a droplet (immersion liquid, representatively pure water) starts to sliding downward due to tilt of the film.

Ordinarily, the receding contact angle nearly correlates with a sliding angle and a film having a larger receding contact angle and a smaller sliding angle exhibits better water-repellency. The receding contact angle can be measured, for example, according to an extension/contraction method using a dynamic contact angle meter (produced by Kyowa Interface Science Co., Ltd.).

The resin (HR) is also preferably used as a resist protective layer (hereinafter, also referred to as a "top coat") which may be provided on the resist film in the patterning by the immersion exposure.

The resist protective layer is a layer hardly soluble in the immersion liquid which is provided between the resist film and the immersion liquid in order to prevent the resist film from direct contact with the immersion liquid. In case of using the resin (HR) as the resist protective layer, the resin (HR) is dissolved in a solvent (water-insoluble organic solvent) which does not dissolve the resist film and coated on the resist film.

The resin (HR) is localized at the interface as described above. However, it is different from a surfactant, it is not always necessary to have a hydrophilic group in its molecule and it need not contribute uniform mixing of polar substance/non-polar substance.

Preferable examples of the resin (HR) include a resin (HR-F) containing a fluorine atom, a resin (HR-SI) containing a silicon atom and a resin (HR-C) containing a specific repeating unit described below. Of the resins, those having neither acid-decomposable group nor alkali-soluble group are preferable.

<Resin (HR-F) Containing Fluorine Atom>

A resin containing an alkyl group having a fluorine atom, a cycloalkyl group having a fluorine atom or an aryl group having a fluorine atom, as the partial structure having a fluorine atom, is preferable. These groups preferably have a perfluoroalkyl group having from 1 to 4 carbon atoms.

The alkyl group having a fluorine atom (having preferably from 1 to 10 carbon atoms, more preferably from 1 to 4 carbon atoms) is a straight-chain or branched alkyl group in which at least one hydrogen atom is substituted with a fluorine atom and which may further have other substituent.

The cycloalkyl group having a fluorine atom is a monocyclic or polycyclic cycloalkyl group in which at least one hydrogen atom is substituted with a fluorine atom and which may further have other substituent.

The aryl group having a fluorine atom includes an aryl group, for example, a phenyl group or a naphthyl group, in which at least one hydrogen atom is substituted with a fluorine atom and which may further have other substituent.

The alkyl group having a fluorine atom, cycloalkyl group having a fluorine atom and aryl group having a fluorine atom are, for example, represented by the following formulae (F2) to (F4), but the invention should not be construed as being limited thereto.

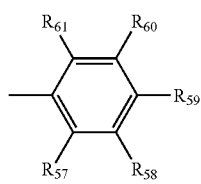
(F2)

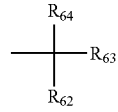
(F3)

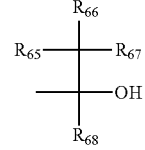
(F4)

In formulae (F2) to (F4), $R_{57}$ to $R_{68}$ each independently represents a hydrogen atom, a fluorine atom or an alkyl group, provided that at least one of $R_{57}$ to $R_{61}$, $R_{62}$ to $R_{64}$ and $R_{65}$ to $R_{68}$ is a fluorine atom or an alkyl group (preferably having from 1 to 4 carbon atoms) in which at least one hydrogen atom is substituted with a fluorine atom. $R_{57}$ to $R_{61}$ and $R_{65}$ to $R_{67}$ are preferably all fluorine atoms. $R_{62}$, $R_{63}$ and $R_{68}$ each preferably represents an alkyl group (preferably having from 1 to 4 carbon atoms) in which at least one hydrogen atom is substituted with a fluorine atom, more preferably a perfluoroalkyl group having from 1 to 4 carbon atoms. $R_{62}$ and $R_{63}$ may be combined with each other to from a ring.

Specific examples of the group represented by formula (F2) include a p-fluorophenyl group, a pentafluorophenyl group and a 3,5-di(trifluoromethyl)phenyl group.

Specific examples of the group represented by formula (F3) include a trifluoromethyl group, a pentafluoroethyl group, a heptafluorobuty group, a hexafluoroisopropyl group, a heptafluoroisopropyl group, a hexafluoro(2-methyl) isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro (trimethyl) hexyl group, a 2,2,3,3-tetra-fluorocyclobutyl group and a perfluorocyclohexyl group. Of these groups, a hexafluoroisopropyl group, a heptafluoroisopropyl group, a hexafluoro (2-methyl) isopropyl group, an octafluoroisobutyl group, a nonafluoro-tert-butyl group and a perfluoroisopentyl group are preferable, and a hexafluoroisopropyl group and a heptafluoroisopropyl group are more preferable.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH. Of these groups, —C(CF$_3$)$_2$OH is preferable.

Specific examples of the repeating unit including the group represented by any one of formulae (F2) to (F4) are set forth below.

In the repeating unit shown below, $X_1$ represents a hydrogen atom, —CH$_3$, —F or —CF$_3$; and $X_2$ represents —F or —CF$_3$.

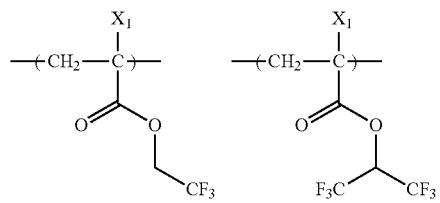

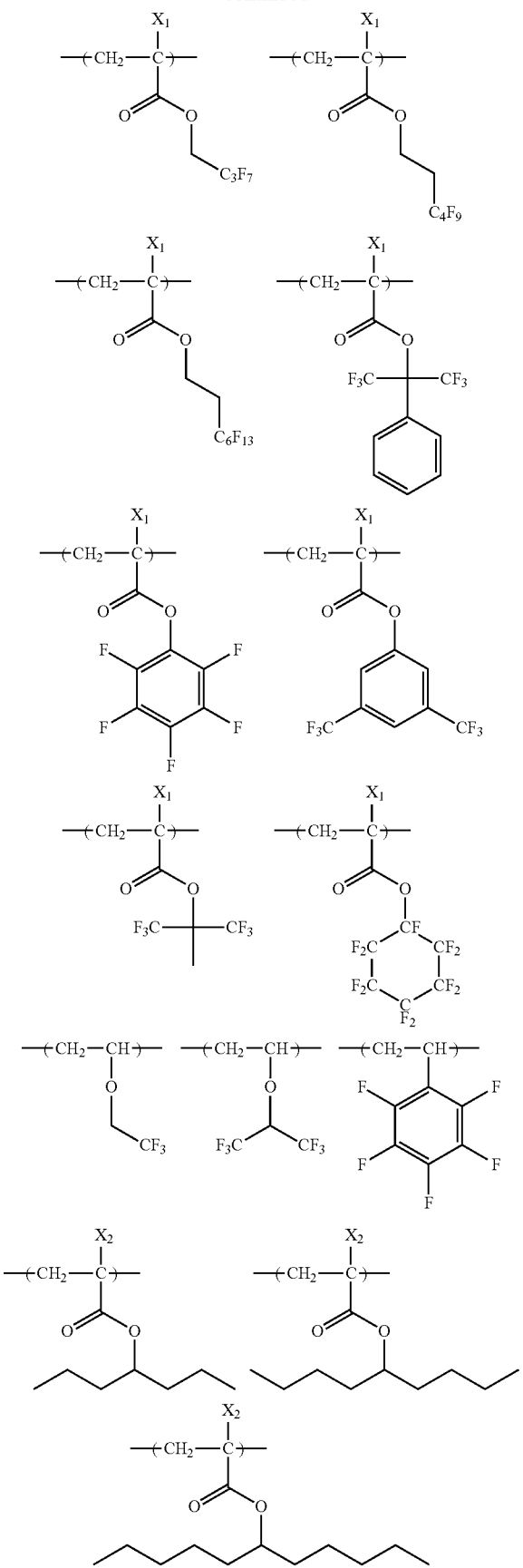

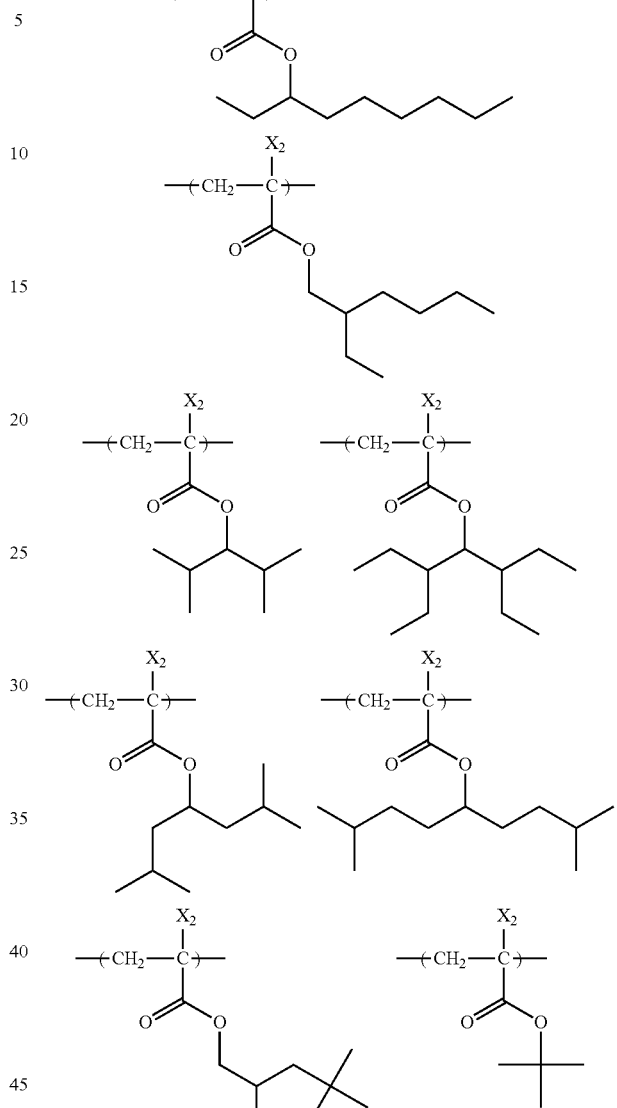

<Resin (HR-SI) Containing Fluorine Atom>

The resin (HR-SI) is preferably a resin containing an alkylsilyl structure (preferably an trialkylsilyl group) or a cyclic siloxane structure, as the partial structure having a silicon atom.

The alkylsilyl structure and cyclic siloxane structure specifically include, for example, groups represented by formulae (CS-1) to (CS-3) shown below.

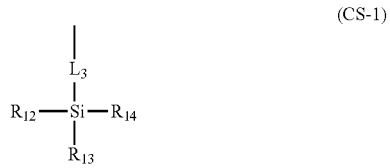

(CS-2)

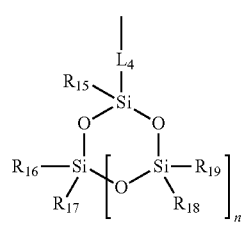

(CS-3)

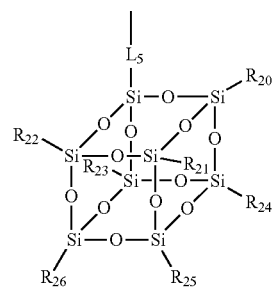

In formulae (CS-1) to (CS-3), $R_{12}$ to $R_{26}$ each independently represents a straight-chain or branched alkyl group (preferably having from 1 to 20 carbon atoms) or a cycloalkyl group (preferably having from 3 to 20 carbon atoms).

$L_3$ to $L_5$ each represents a single bond or a divalent connecting group. The divalent connecting group includes an alkylene group, a phenylene group, an ether group, a thioether group, a carbonyl group, an ester group, an amido group, a urethane group, a urea group and combinations of two or more of these groups.

n represents an integer of 1 to 5.

Specific examples of the repeating unit including the group represented by any one of formulae (CS-1) to (CS-3) are set forth below.

In the repeating unit shown below, $X_1$ represents a hydrogen atom, —$CH_3$, —F or —$CF_3$.

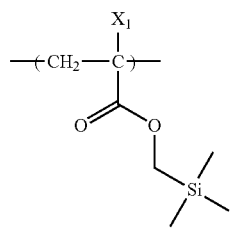

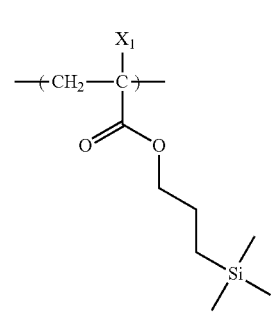 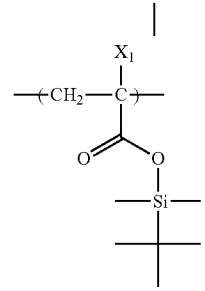

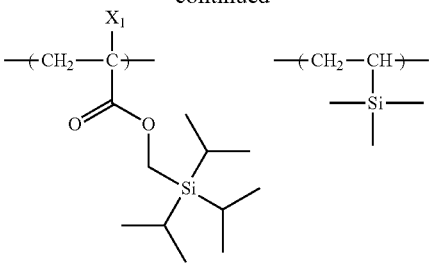

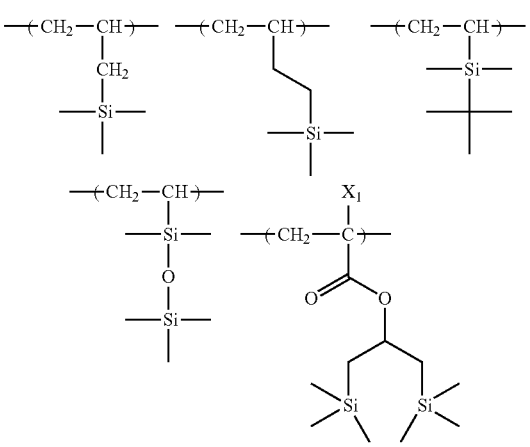

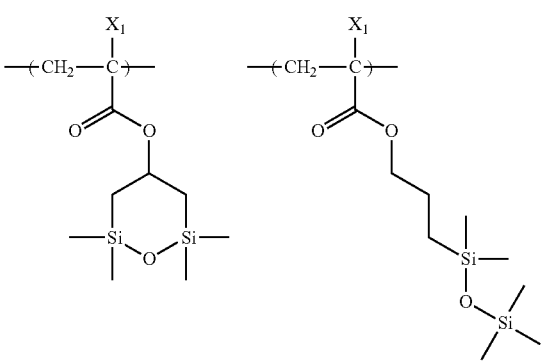

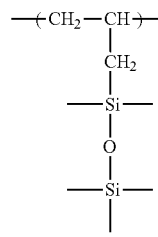 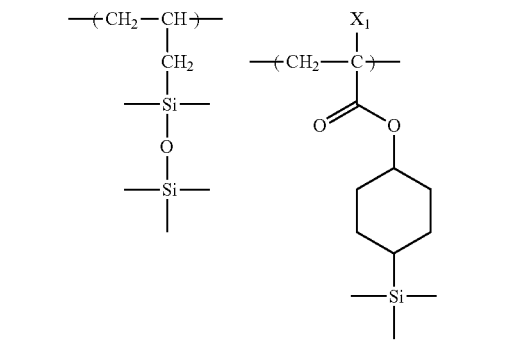

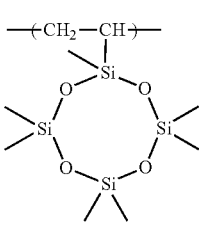 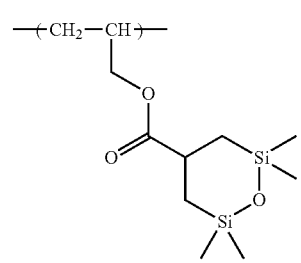

-continued

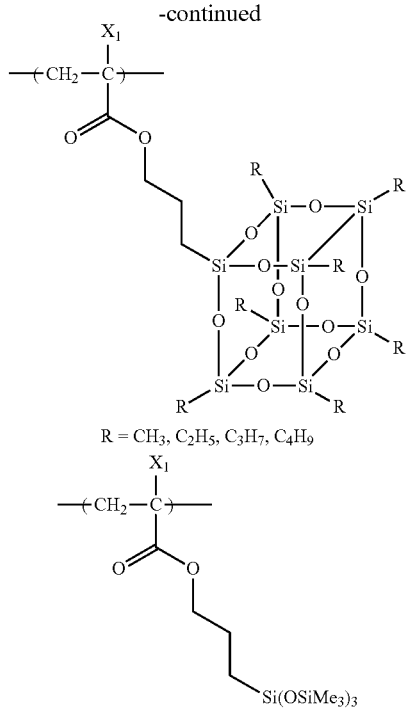

R = CH₃, C₂H₅, C₃H₇, C₄H₉

The case where the resin (HR) is the resin (HR-C) containing a specific repeating unit is described below.

The resin (HR-C) containing a specific repeating unit is preferably a resin containing a repeating unit represented by any one of formulae (C-I) to (C-III) shown below.

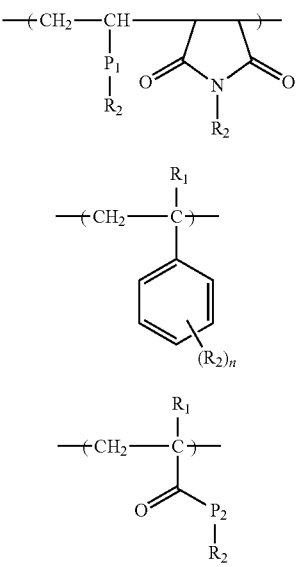

In formulae (C-I) to (C-III), $R_1$ each independently represents a hydrogen atom or a methyl group.

$R_2$ each independently represents a hydrocarbon group having at least one —$CH_3$ partial structure (specifically, a methyl group).

$P_1$ represents a single bond, an alkylene group, an ether group or a connecting group including two or more of these groups.

$P_2$ represents a connecting group selected from —O—, —NR— (wherein R represents a hydrogen atom or an alkyl group) and —NHSO₂—.

n represents an integer of 1 to 4.

These repeating units may be used individually or in combination of two or more thereof.

Examples of the hydrocarbon group having at least one —$CH_3$ partial structure (specifically, a methyl group) represented by $R_2$ in any one of formulae (C-I) to (C-III) include an alkyl group, an alkyloxy group, an alkyl-substituted cycloalkyl group, an alkenyl group, an alkyl-substituted alkenyl group, an alkyl-substituted cycloalkenyl group, an alkyl-substituted aryl group and an alkyl-substituted aralkyl group each of which has at least one —$CH_3$ partial structure, and an alkyl group and alkyl-substituted cycloalkyl group each of which has at least one —$CH_3$ partial structure are preferable. The hydrocarbon group having at least one —$CH_3$ partial structure represented by $R_2$ is preferably a hydrocarbon group having two or more —$CH_3$ partial structures.

The alkyl group having at least one —$CH_3$ partial structure for $R_2$ is preferably a branched alkyl group having from 3 to 20 carbon atoms. Specific examples of the preferable alkyl group include an isopropyl group, an isobutyl group, a tert-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group. Among them, an isobutyl group, a tert-butyl group, a 2-methyl-3-butyl group, a 2-methyl-3-pentyl group, a 3-methyl-4-hexyl group, a 3,5-dimethyl-4-pentyl group, 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group are more preferable.

The alkyl group having one —$CH_3$ partial structure for $R_2$ is preferably a straight-chain alkyl group having from 1 to 20 carbon atoms. Specific examples of the preferable alkyl group include a methyl group, an ethyl group, a propyl group, a butyl group, a pentyl group, a hexyl group, a heptyl group, an octyl group and a nonyl group.

The alkyloxy group having at least one —$CH_3$ partial structure for $R_2$ includes a group in which an ether group is connected to an alkyl group having at least two —$CH_3$ partial structures.

The cycloalkyl group for $R_2$ may be monocyclic or polycyclic. Specific examples thereof include groups having 5 or more carbon atoms and including, for example, a monocyclo, bicyclo, tricyclo or tetracyclo structure. The number of carbon atoms of the cycloalkyl group is preferably from 6 to 30, particularly preferably from 7 to 25. Specific examples of the preferable cycloalkyl group include an adamantyl group, a noradamantyl group, a decaline residue, a tricyclodecanyl group, a tetracyclododecanyl group, a norbornyl group, a sedorol group, a cyclopentyl group, a cyclohexyl group, a cycloheptyl group, a cyclooctyl group, a cyclodecanyl group and a cyclododecanyl group. Among them, an adamantyl group, a norbornyl group, a cyclohexyl group, a cyclopentyl group, a tetracyclododecanyl group and a tricyclodecanyl group are more preferable, and a norbornyl group, a cyclopentyl group and a cyclohexyl group are still more preferable.

The alkenyl group for $R_2$ is preferably a straight-chain or branched alkenyl group having from 2 to 20 carbon atoms, and more preferably a branched alkenyl group.

The aryl group for R₂ is preferably an aryl group having from 6 to 20 carbon atoms and includes, for example, a phenyl group or a naphthyl group, preferably a phenyl group.

The aralkyl group R₂ is preferably an aralkyl group having from 7 to 12 carbon atoms and includes, for example, a benzyl group, a phenethyl group and a naphthylmethyl group.

Specific examples of the hydrocarbon group having at least two —CH₃ partial structure represented by R₂ in formulae (C-I) and (C-II) include an isopropyl group, a isobutyl group, a tert-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-tert-butylcyclohexyl group and an isobornyl group. Among them, a isobutyl group, a tert-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group, a 4-tert-butylcyclohexyl group and an isobornyl group are more preferable.

Specific examples of the hydrocarbon group having at least two —CH₃ partial structure represented by R₂ in formula (C-III) include a isobutyl group, a tert-butyl group, a 3-pentyl group, a 2,3-dimethyl-2-butyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 4-isopropylcyclohexyl group and a 4-tert-butylcyclohexyl group. Among them, those having from 5 to 20 carbon atoms, specifically, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 2,6-dimethylheptyl group, a 3,5-dimethylcyclohexyl group, a 4-isopropylcyclohexyl group and a 4-tert-butylcyclohexyl group are more preferable.

The total content of the repeating units represented by formulae (C-I) to (C-III) is preferably from 50 to 100% by mole, more preferably from 80 to 100% by mole, still more preferably from 90 to 100% by mole, based on the total repeating units of the resin.

Specific examples of the repeating unit represented by formula (C-I) are set forth below, but the invention should not be construed as being limited thereto.

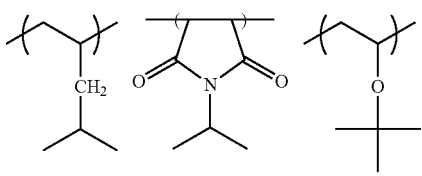

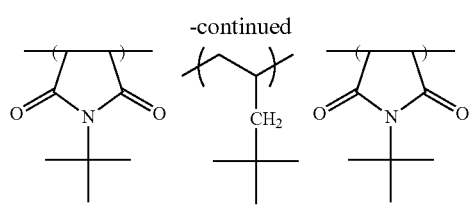

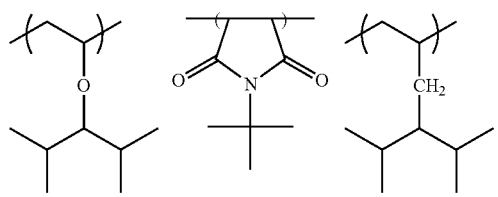

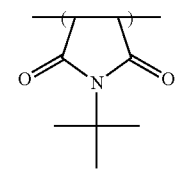

Specific examples of the repeating unit represented by formula (C-II) are set forth below, but the invention should not be construed as being limited thereto.

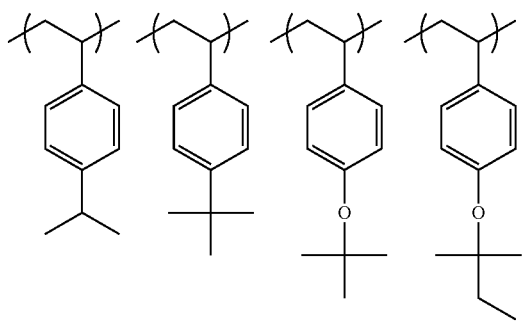

In formula (C-III), when P₂ is an oxygen atom, a carbon atom directly connected to the oxygen atom is preferably a secondary or tertiary carbon atom.

Specific examples of the repeating unit represented by formula (C-III) are set forth below, but the invention should not be construed as being limited thereto. In the specific examples below, $R_x$ represents a hydrogen atom or a methyl group, and $R_{xa}$ to $R_{xc}$ each represents an alkyl group having from 1 to 4 carbon atoms.

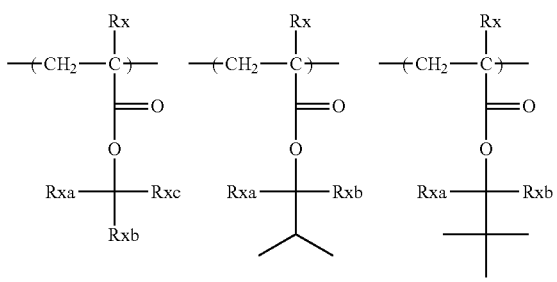

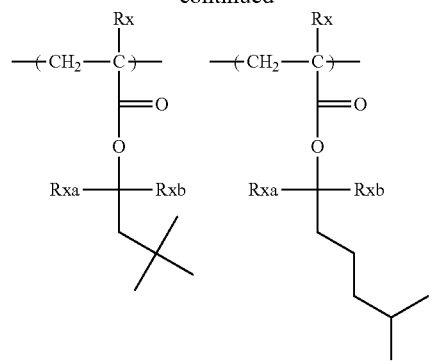
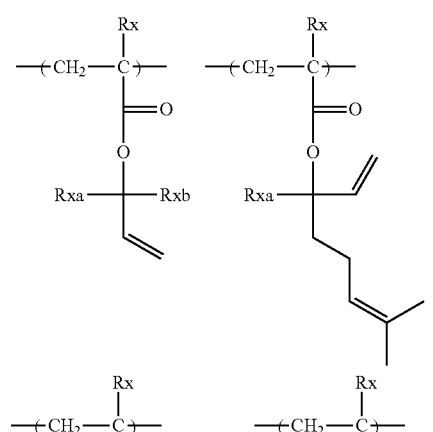
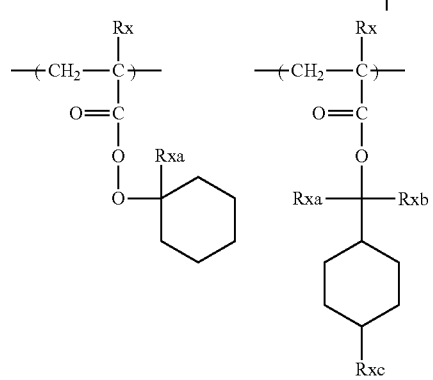
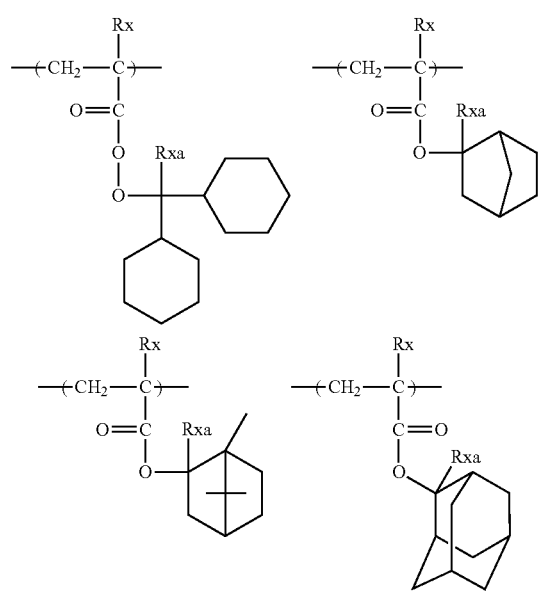
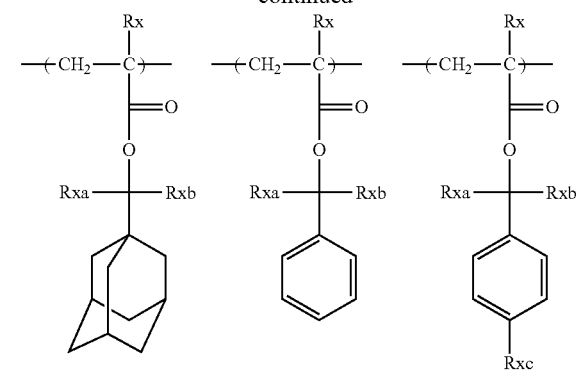
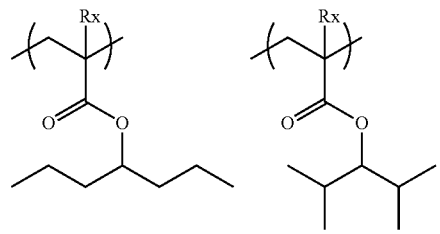
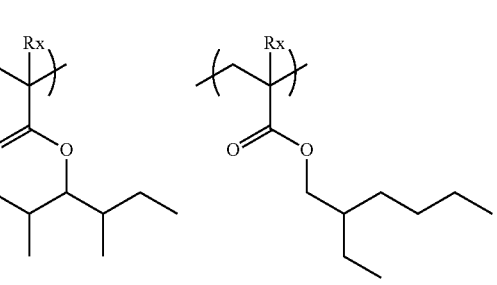
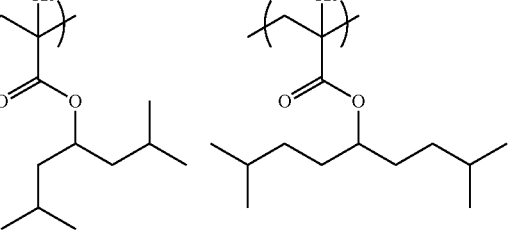
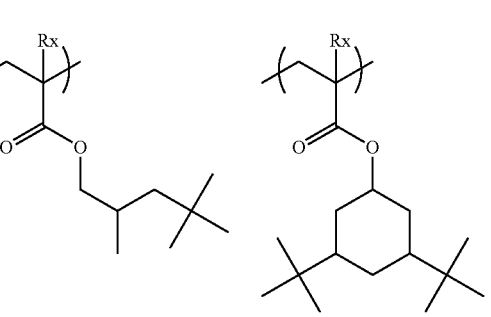

-continued

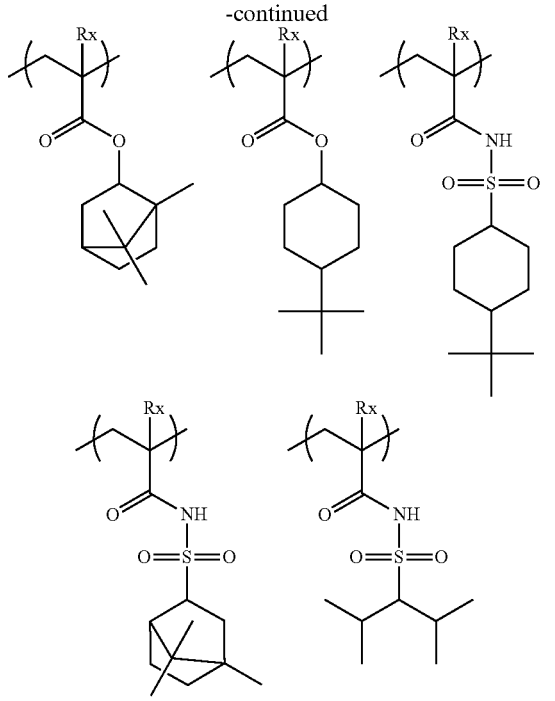

It is preferred that the resin (HR-C) contains neither a silicon atom nor a fluorine atom.

It is preferred that the resin (HR-C) does not contain any element other than a carbon atom, a hydrogen atom, an oxygen atom, a nitrogen atom and a sulfur atom.

Further, the resin (HR) may include at least one group selected from the groups of (x) to (z) shown below.

(x) an alkali-soluble group,
(y) a group which is decomposed by the action of an alkali developer to increase solubility in the alkali developer, and
(z) a group which is decomposed by the action of an acid.

Examples of the alkali-soluble group (x) includes a phenolic hydroxy group, a carboxylic acid group, a fluorinated alcohol group, a sulfonic acid group, a sulfonamido group, a sulfonylimido group, a (sulfonyl) (carbonyl)methylene group, an (sulfonyl) (carbonyl) imido group, a bis(carbonyl) methylene group, a bis(carbonyl)imido group, a bis(sulfonyl)methylene group, a bis(sulfonyl)imido group, a tris (carbonyl)methide group and a tris(sulfonyl)methide group.

Preferable examples of the alkali-soluble group include a fluorinated alcohol group (preferably a hexafluoroisopropanol group: —$C(CF_3)_2(OH)$), a sulfonimido group and a bis(alkylcarbonyl)methylene group.

As the repeating unit including the alkali-soluble group (x), for example, a repeating unit in which the alkali-soluble group is directly connected to the main chain of resin, for example, a repeating unit based on acrylic acid or methacrylic acid and a repeating unit in which the alkali-soluble group is connected to the main chain of resin through a connecting group are exemplified. Further, the alkali-soluble group can be introduced into the terminal of polymer chain by using a polymerization initiator or chain transfer agent having the alkali-soluble group at the polymerization. Any of these cases can be preferably used.

The content of the repeating unit including the alkali-soluble group (x) is preferably from 1 to 50% by mole, more preferably from 3 to 35% by mole, still more preferably from 5 to 20% by mole, based on the total repeating units of the resin.

Specific examples of the repeating unit including the alkali-soluble group (x) are set forth below.

In the formulae below, $R_x$ represents —H, —$CH_3$, —$CF_3$ or —$CH_2OH$.

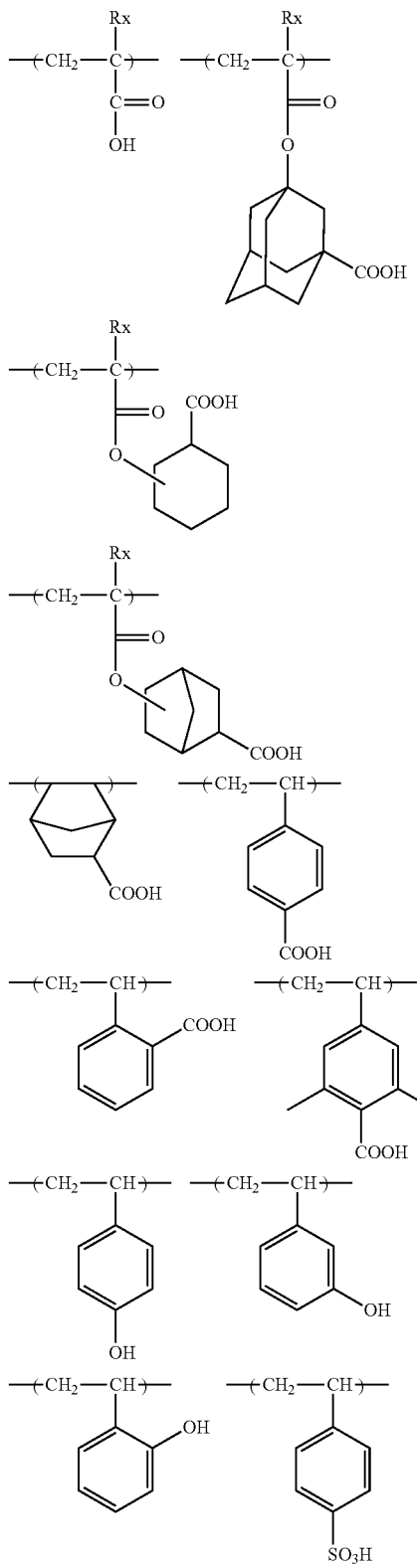

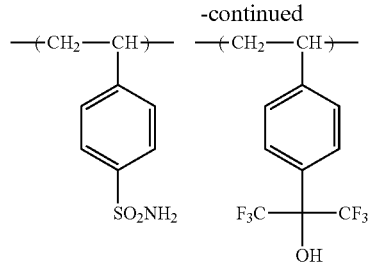
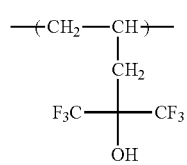
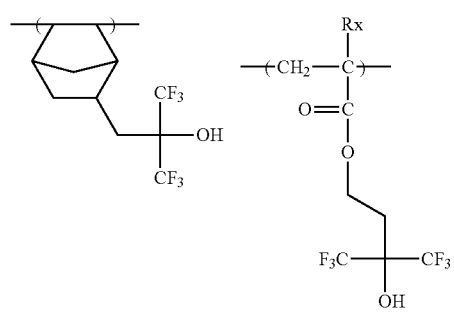
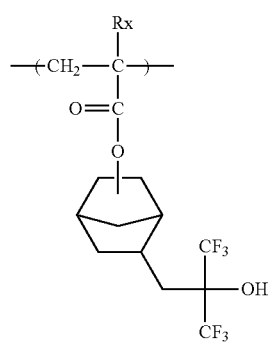
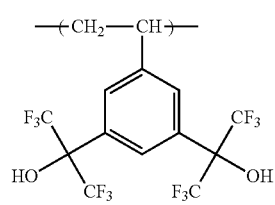
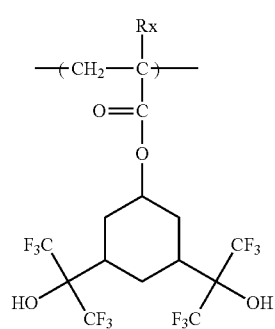
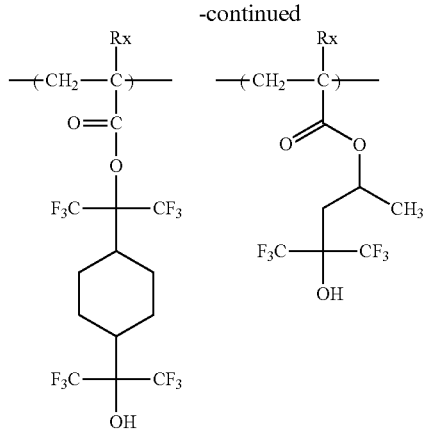
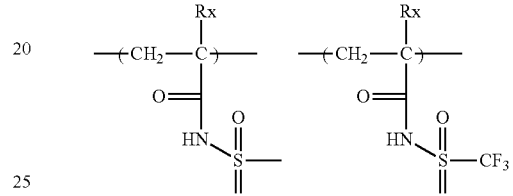
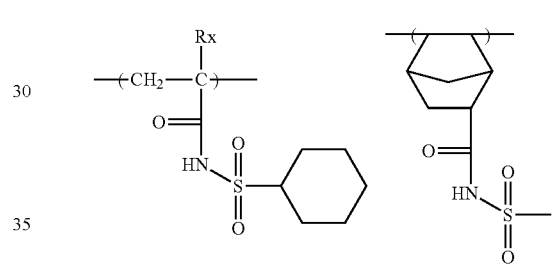
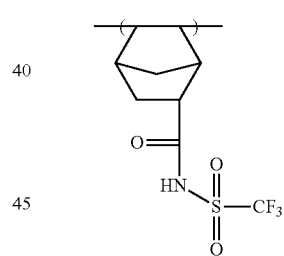
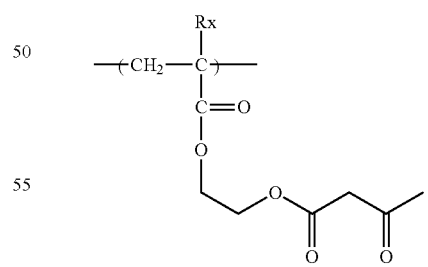
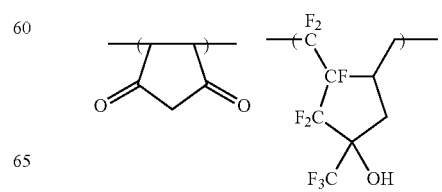

The group (y) which is decomposed by the action of an alkali developer to increase solubility in the alkali developer includes, for example, a group having a lactone structure, an acid anhydride group and an acid imido group, preferably a group having a lactone structure.

As the repeating unit including the group (y) which is decomposed by the action of an alkali developer to increase solubility in the alkali developer, any of a repeating unit in which the group (y) which is decomposed by the action of an alkali developer to increase solubility in the alkali developer is connected to the main chain of resin through a connecting group, for example, a repeating unit based on an acrylic acid ester or methacrylic acid ester and introduction into the terminal of polymer chain using a polymerization initiator or chain transfer agent having the group (y) which is decomposed by the action of an alkali developer to increase solubility in the alkali developer at the polymerization is preferable.

The content of the repeating unit including the group (y) which is decomposed by the action of an alkali developer to increase solubility in the alkali developer is preferably from 1 to 40% by mole, more preferably from 3 to 30% by mole, still more preferably from 5 to 15% by mole, based on the total repeating units of the resin.

Specific examples of the repeating unit including the group (y) which is decomposed by the action of an alkali developer to increase solubility in the alkali developer are same as those illustrated with respect to the lactone structure and structure represented by formula (VIII) in resin (A) described hereinafter.

The group (z) which is decomposed by the action of an acid includes the acid-decomposable group illustrated in resin (A) described hereinafter. The repeating unit including the group (z) which is decomposed by the action of an acid includes the repeating unit including the acid-decomposable group illustrated in resin (A) described hereinafter. The content of the repeating unit including the group (z) which is decomposed by the action of an acid is preferably from 1 to 80% by mole, more preferably from 10 to 80% by mole, still more preferably from 20 to 60% by mole, based on the total repeating units of the resin.

In the case where the resin (HR) contains a fluorine atom, the content of fluorine atom is preferably from 5 to 80% by weight, more preferably from 10 to 80% by weight, based on the molecular weight of the resin (HR)—Further, the content of the repeating unit including a fluorine atom in the resin (HR) is preferably from 10 to 100% by weight, more preferably from 30 to 100% by weight.

In the case where the resin (HR) contains a silicon atom, the content of silicon atom is preferably from 2 to 50% by weight, more preferably from 2 to 30% by weight, based on the molecular weight of the resin (HR) Further, the content of the repeating unit including a silicon atom in the resin (HR) is preferably from 10 to 100% by weight, more preferably from 20 to 100% by weight.

The resin (HR) may contain a repeating unit other than the specific repeating unit described above. A monomer corresponding to the specific repeating unit described above and a monomer having an ordinary polymerizable ethylenic double bond can be copolymerized.

The weight average molecular weight of the resin (HR) in terms of standard polystyrene is preferably from 2,000 to 20,000, more preferably from 2,000 to 10,000.

In the resin (HR), similar to the acid-decomposable resin (A), it is naturally preferred that the content of an impurity, for example, metal is low. Further, the content of the remaining monomer and oligomer in the resin (HR) is preferably from 0 to 10% by weight, more preferably from 0 to 5% by weight, still more preferably from 0 to 1% by weight. Thus, a resist which does not contain foreign substances in its solution and which does not undergo fluctuation in sensitivity or the like with the lapse of time is obtained. From the standpoint of resolution, resist profile, sidewall of resist pattern, roughness or the like, the molecular weight distribution (Mw/Mn, also referred to as dispersity) of the resin (HR) is preferably in a range of 1 to 5, more preferably in a range of 1 to 3.

Specific examples of the resin (HR) are set forth below. The molar ratio of repeating units (corresponding to each repeating unit in a left-to-right order), weight average molecular weight and dispersity of each resin are also described in the table shown below.

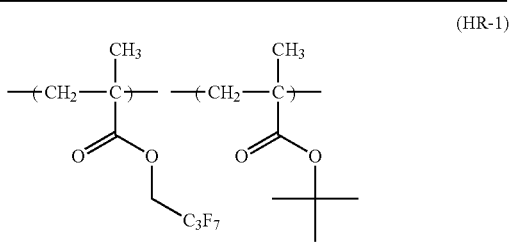

(HR-1)

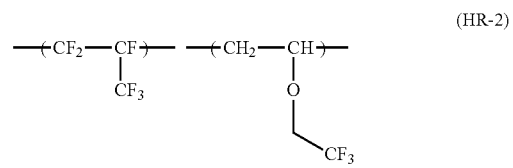

(HR-2)

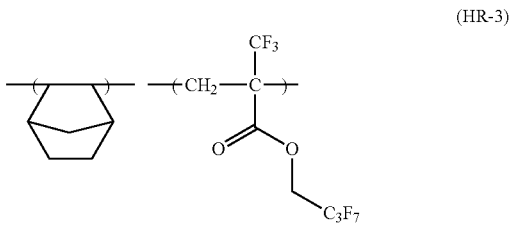

(HR-3)

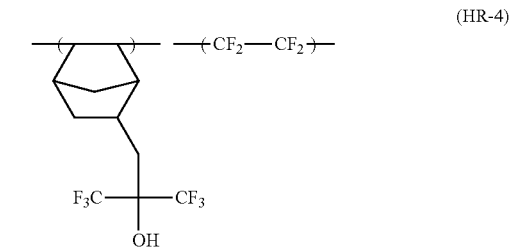

(HR-4)

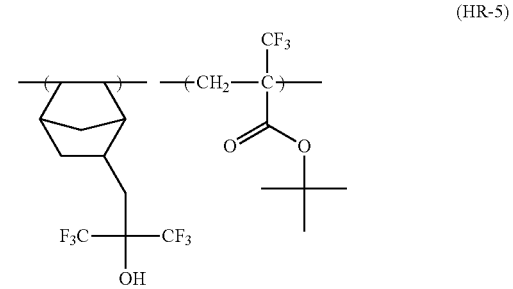

(HR-5)

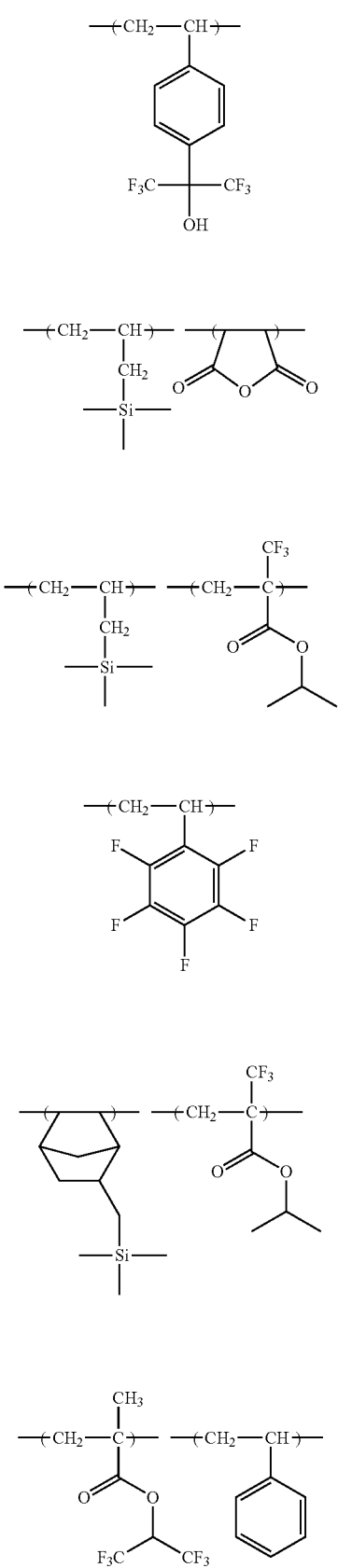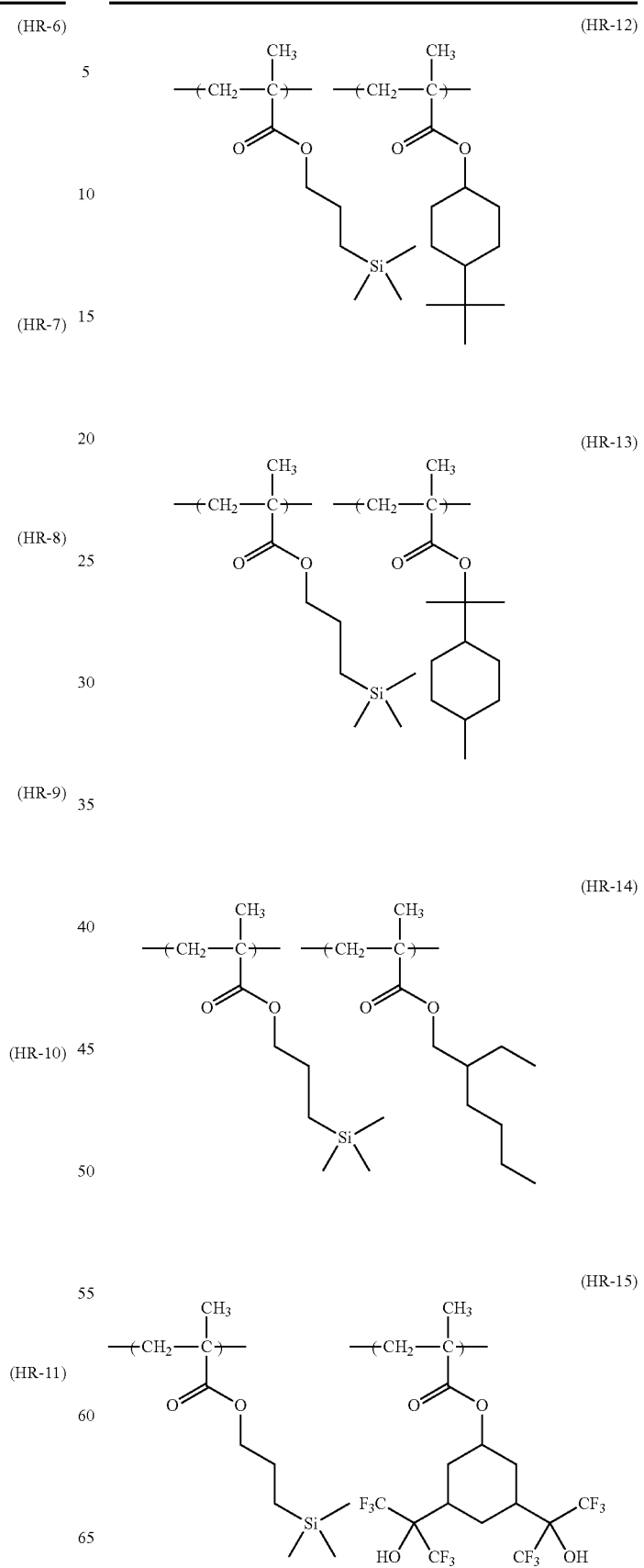

(HR-16)
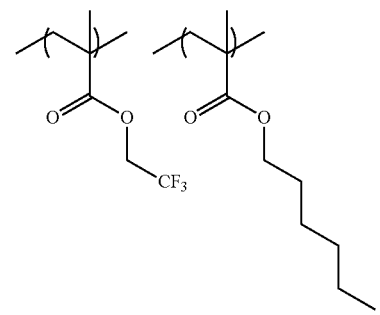
(HR-17)
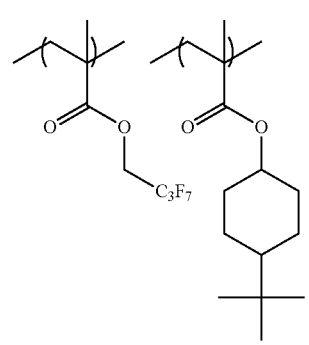
(HR-18)
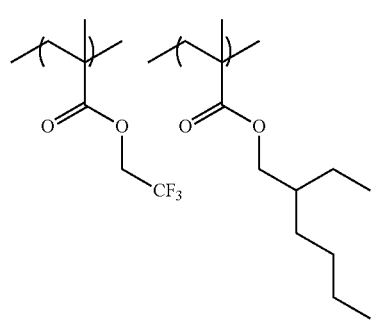
(HR-19)
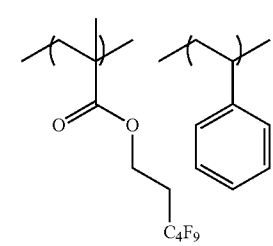
(HR-20)
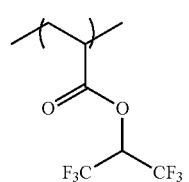
(HR-21)
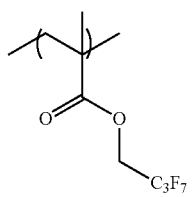
(HR-22)
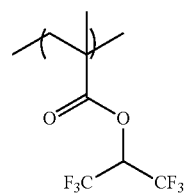
(HR-23)
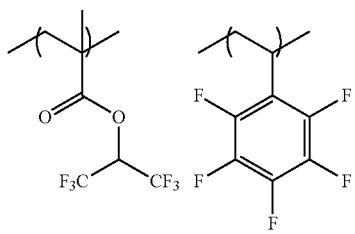
(HR-24)
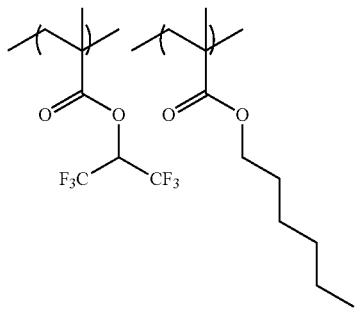
(HR-25)
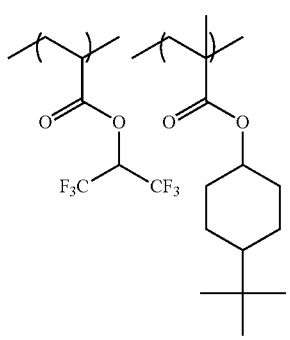

(HR-26)
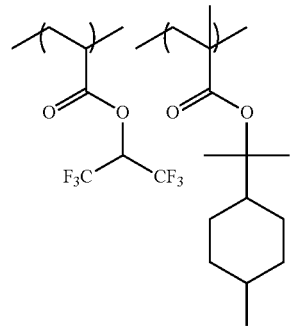
(HR-27)
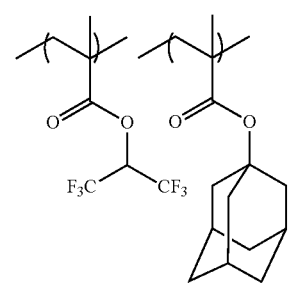
(HR-28)
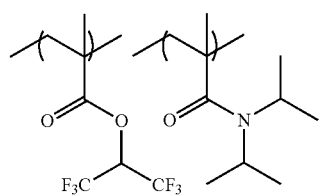
(HR-29)
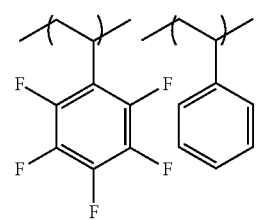
(HR-30)
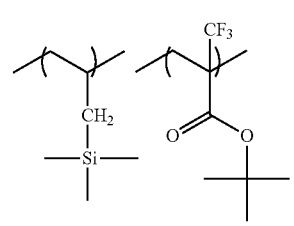
(HR-31)
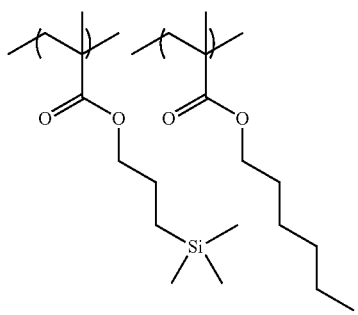
(HR-32)
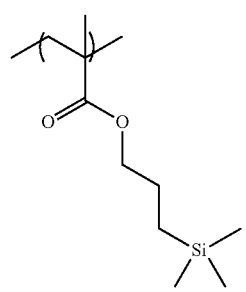
(HR-33)
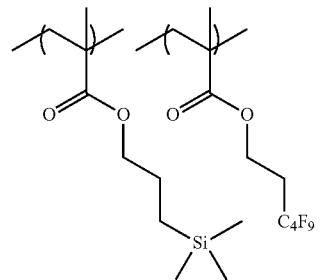
(HR-34)
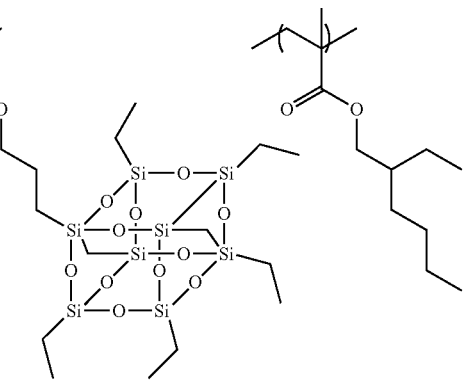

(HR-35)
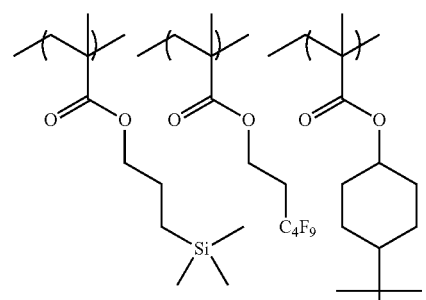
(HR-36)
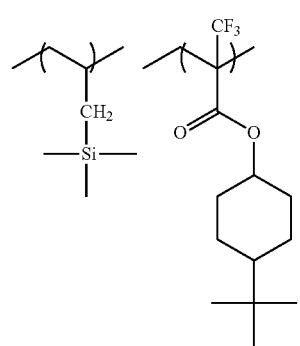
(HR-37)
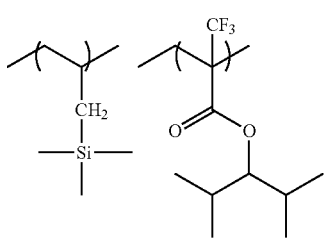
(HR-38)
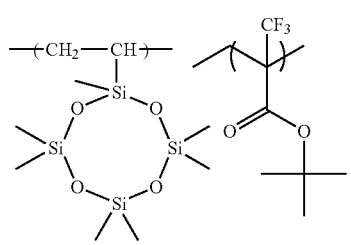
(HR-39)
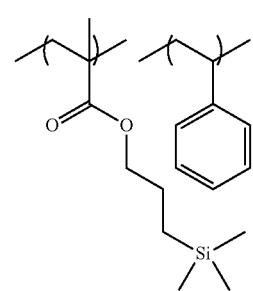
(HR-40)
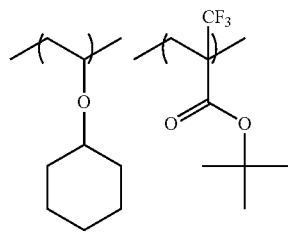
(HR-41)
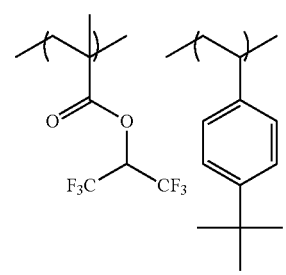
(HR-42)
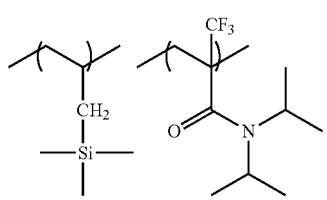
(HR-43)
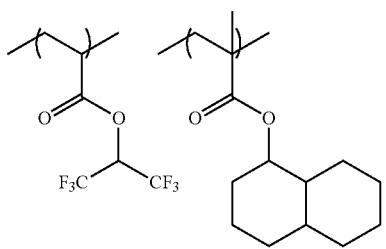
(HR-44)
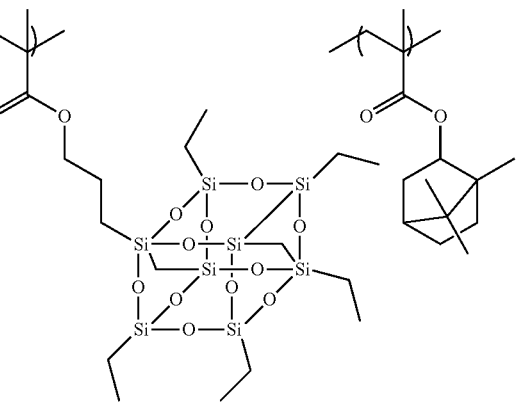

(HR-45)
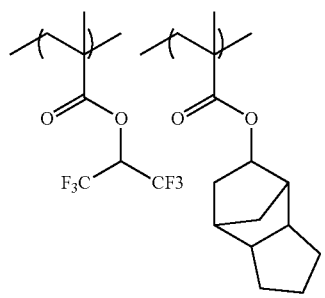
(HR-46)
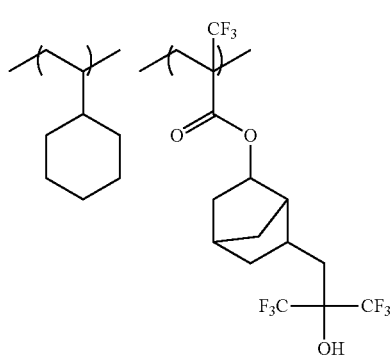
(HR-47)
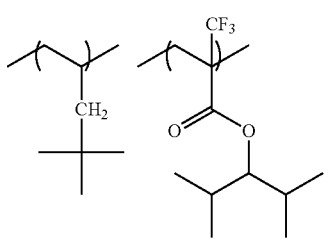
(HR-48)
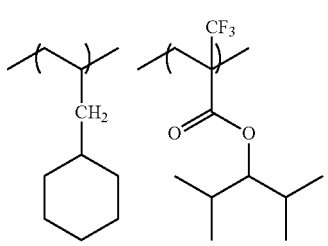
(HR-49)
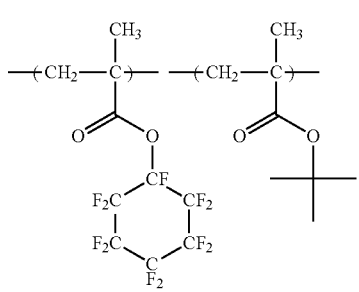
(HR-50)
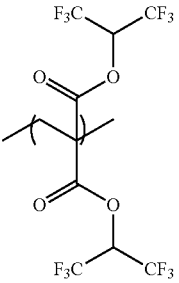
(HR-51)
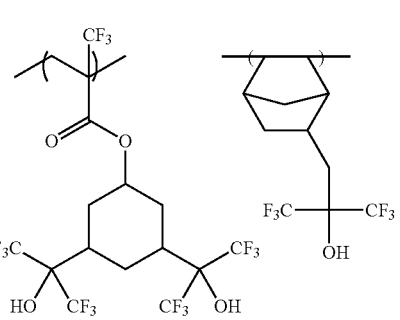
(HR-52)
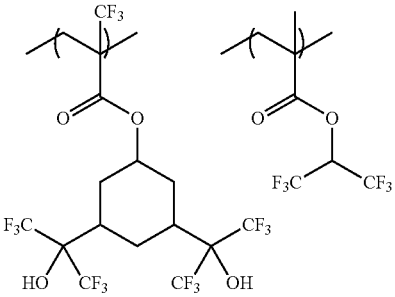
(HR-53)
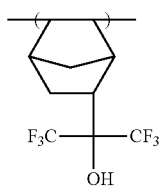
(HR-54)
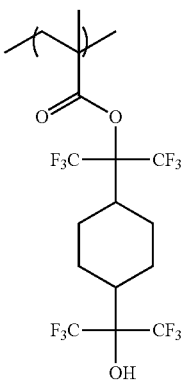

-continued
(HR-55)
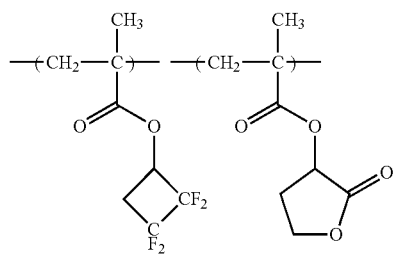
(HR-56)
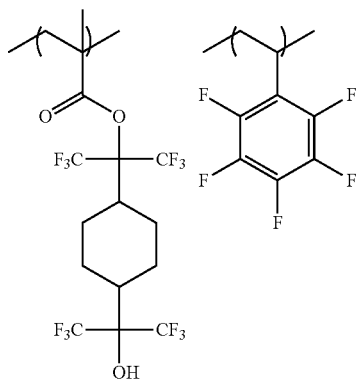
(HR-57)
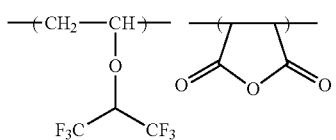
(HR-58)
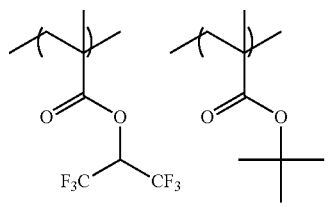
(HR-59)
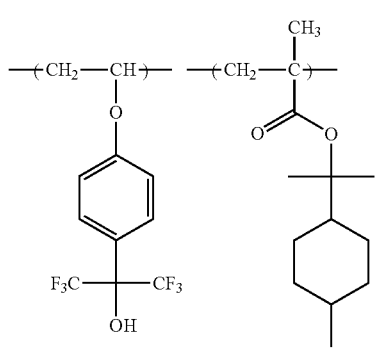
-continued
(HR-60)
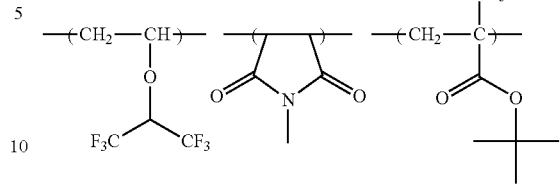
(HR-61)
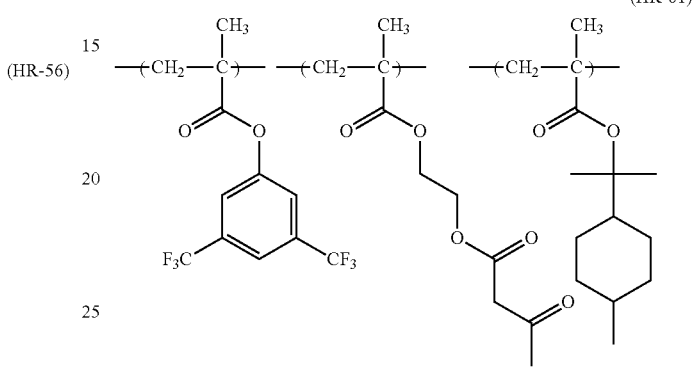
(HR-62)
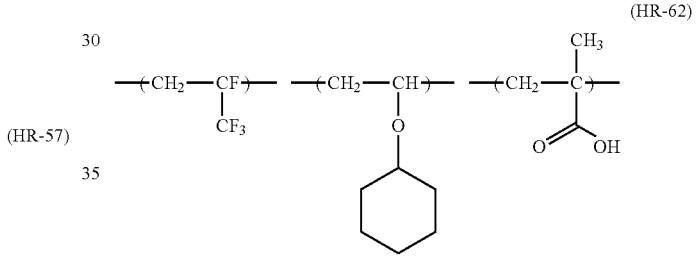
(HR-63)
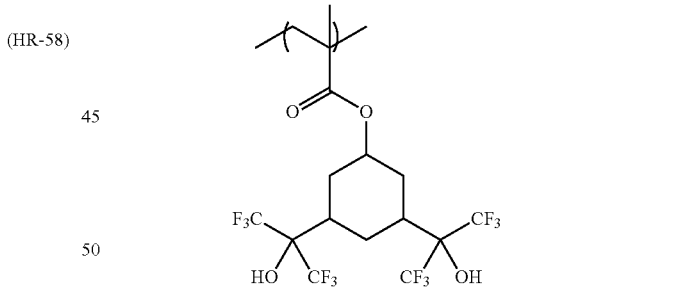
(HR-64)
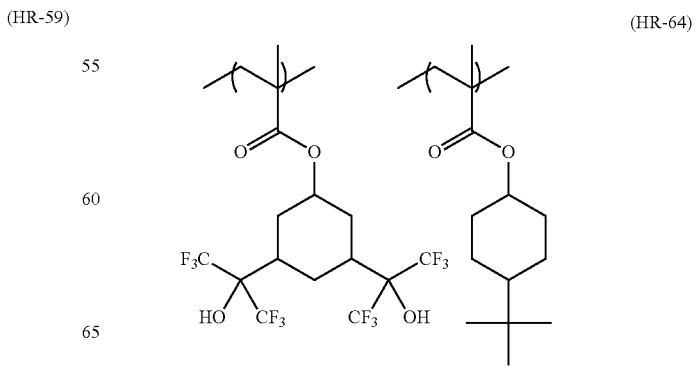

(HR-65)
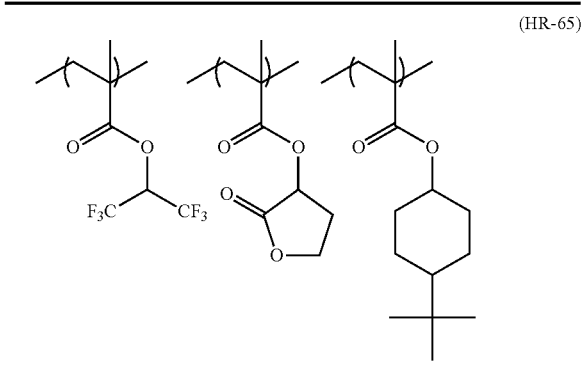
(HR-69)
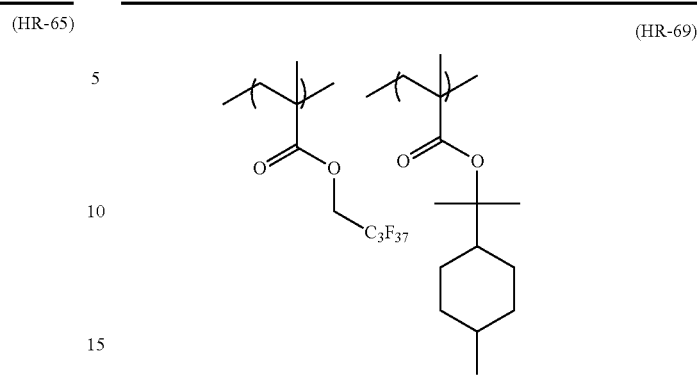
(HR-66)
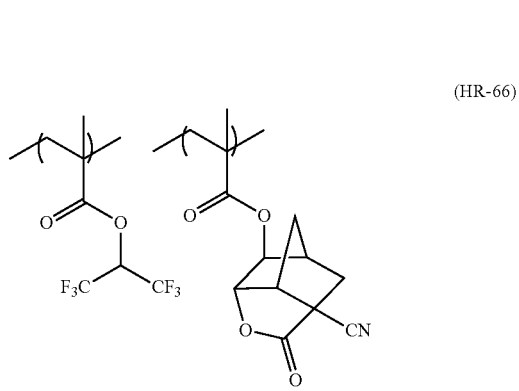
(HR-70)
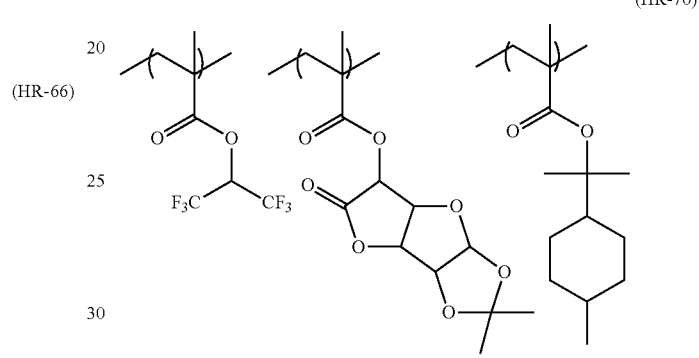
(HR-67)
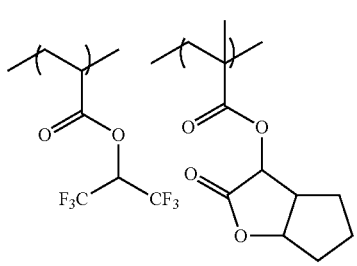
(HR-71)
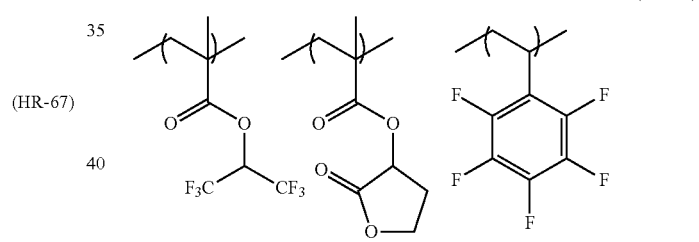
(HR-72)
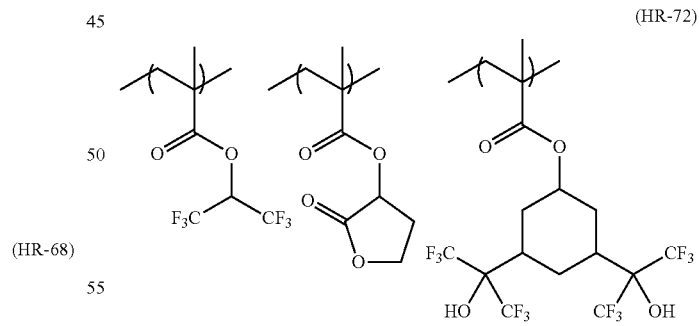
(HR-68)
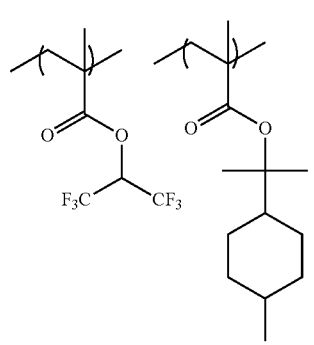
(HR-73)
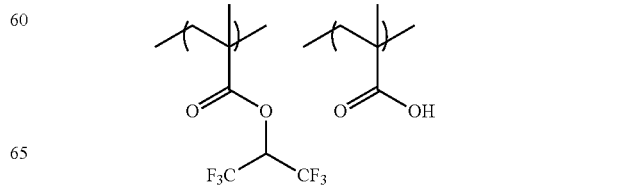

(HR-74)
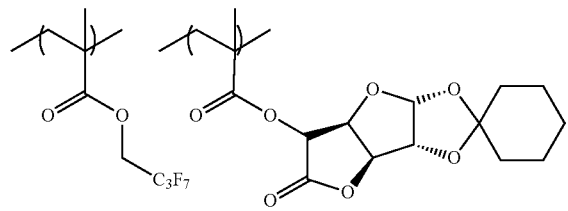
(HR-75)
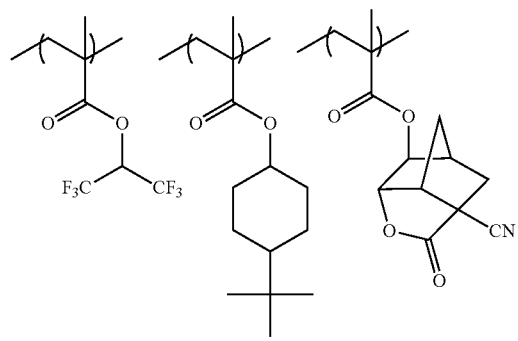
(HR-76)
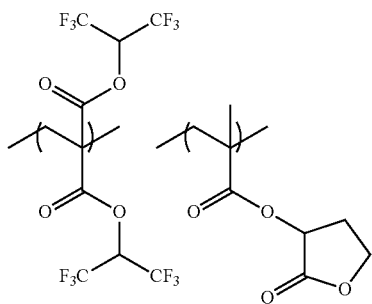
(HR-77)
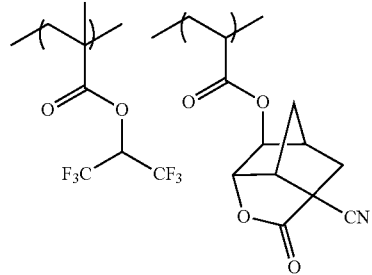
(HR-78)
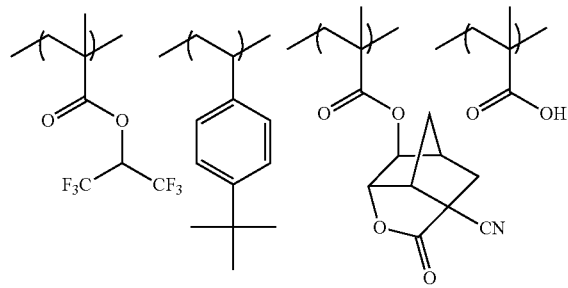
(HR-79)
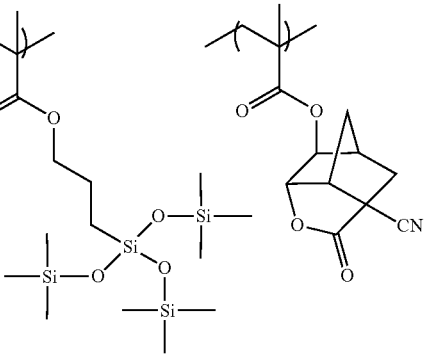
(HR-80)
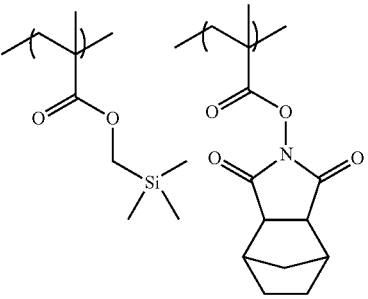
(HR-81)
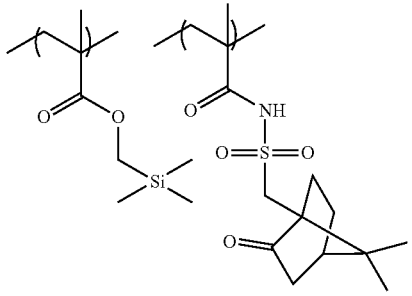
(HR-82)
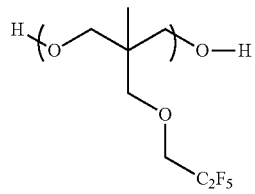
(HR-83)
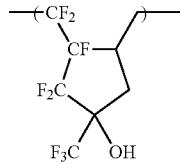
(HR-84)
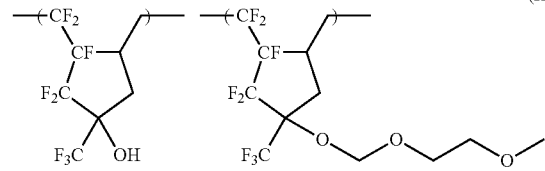

| Resin | Composition | MW | Mw/Mn |
|---|---|---|---|
| HR-1 | 50/50 | 8,800 | 2.1 |
| HR-2 | 50/50 | 5,200 | 1.8 |
| HR-3 | 50/50 | 4,800 | 1.9 |
| HR-4 | 50/50 | 5,300 | 1.9 |
| HR-5 | 50/50 | 6,200 | 1.9 |
| HR-6 | 100 | 12,000 | 2.0 |
| HR-7 | 50/50 | 5,800 | 1.9 |
| HR-8 | 50/50 | 6,300 | 1.9 |
| HR-9 | 100 | 5,500 | 2.0 |
| HR-10 | 50/50 | 7,500 | 1.9 |
| HR-11 | 70/30 | 10,200 | 2.2 |
| HR-12 | 40/60 | 15,000 | 2.2 |
| HR-13 | 40/60 | 13,000 | 2.2 |
| HR-14 | 80/20 | 11,000 | 2.2 |
| HR-15 | 60/40 | 9,800 | 2.2 |
| HR-16 | 50/50 | 8,000 | 2.2 |
| HR-17 | 50/50 | 7,600 | 2.0 |
| HR-18 | 50/50 | 12,000 | 2.0 |
| HR-19 | 20/80 | 6,500 | 1.8 |
| HR-20 | 100 | 6,500 | 1.2 |
| HR-21 | 100 | 6,000 | 1.6 |
| HR-22 | 100 | 2,000 | 1.6 |
| HR-23 | 50/50 | 6,000 | 1.7 |
| HR-24 | 50/50 | 8,800 | 1.9 |
| HR-25 | 50/50 | 7,800 | 2.0 |
| HR-26 | 50/50 | 8,000 | 2.0 |
| HR-27 | 80/20 | 8,000 | 1.8 |
| HR-28 | 30/70 | 7,000 | 1.7 |
| HR-29 | 50/50 | 6,500 | 1.6 |
| HR-30 | 50/50 | 6,500 | 1.6 |
| HR-31 | 50/50 | 9,000 | 1.8 |
| HR-32 | 100 | 10,000 | 1.6 |
| HR-33 | 70/30 | 8,000 | 2.0 |
| HR-34 | 10/90 | 8,000 | 1.8 |
| HR-35 | 30/30/40 | 9,000 | 2.0 |
| HR-36 | 50/50 | 6,000 | 1.4 |
| HR-37 | 50/50 | 5,500 | 1.5 |
| HR-38 | 50/50 | 4,800 | 1.8 |
| HR-39 | 60/40 | 5,200 | 1.8 |
| HR-40 | 50/50 | 8,000 | 1.5 |
| HR-41 | 20/80 | 7,500 | 1.8 |
| HR-42 | 50/50 | 6,200 | 1.6 |
| HR-43 | 60/40 | 16,000 | 1.8 |
| HR-44 | 80/20 | 10,200 | 1.8 |
| HR-45 | 50/50 | 12,000 | 2.6 |
| HR-46 | 50/50 | 10,900 | 1.9 |
| HR-47 | 50/50 | 6,000 | 1.4 |
| HR-48 | 50/50 | 4,500 | 1.4 |
| HR-49 | 50/50 | 6,900 | 1.9 |
| HR-50 | 100 | 2,300 | 2.6 |
| HR-51 | 60/40 | 8,800 | 1.5 |
| HR-52 | 68/32 | 11,000 | 1.7 |
| HR-53 | 100 | 8,000 | 1.4 |
| HR-54 | 100 | 8,500 | 1.4 |
| HR-55 | 80/20 | 13,000 | 2.1 |
| HR-56 | 70/30 | 18,000 | 2.3 |
| HR-57 | 50/50 | 5,200 | 1.9 |
| HR-58 | 50/50 | 10,200 | 2.2 |
| HR-59 | 60/40 | 7,200 | 2.2 |
| HR-60 | 32/32/36 | 5,600 | 2.0 |
| HR-61 | 30/30/40 | 9,600 | 106 |
| HR-62 | 40/40/20 | 12,000 | 2.0 |
| HR-63 | 100 | 6,800 | 1.6 |
| HR-64 | 50/50 | 7,900 | 1.9 |
| HR-65 | 40/30/30 | 5,600 | 2.1 |
| HR-66 | 50/50 | 6,800 | 1.7 |
| HR-67 | 50/50 | 5,900 | 1.6 |
| HR-68 | 49/51 | 6,200 | 1.8 |
| HR-69 | 50/50 | 8,000 | 1.9 |
| HR-70 | 30/40/30 | 9,600 | 2.3 |
| HR-71 | 30/40/30 | 9,200 | 2.0 |
| HR-72 | 40/29/31 | 3,200 | 2.1 |
| HR-73 | 90/10 | 6,500 | 2.2 |
| HR-74 | 50/50 | 7,900 | 1.9 |
| HR-75 | 20/30/50 | 10,800 | 1.6 |
| HR-76 | 50/50 | 2,200 | 1.9 |
| HR-77 | 50/50 | 5,900 | 2.1 |
| HR-78 | 40/20/30/10 | 14,000 | 2.2 |
| HR-79 | 50/50 | 5,500 | 1.8 |
| HR-80 | 50/50 | 10,600 | 1.9 |
| HR-81 | 50/50 | 8,600 | 2.3 |
| HR-82 | 100 | 15,000 | 2.1 |
| HR-83 | 100 | 6,900 | 2.5 |
| HR-84 | 50/50 | 9,900 | 2.3 |

[2] Positive Resist Composition to which Resin (HR) is Added

The resin (HR) is possible to add to various kinds of compositions in order to hydrophobilize a film surface, and it is preferably added to a positive resist composition used in patterning by the immersion exposure, particularly preferably to a positive resist composition containing (A) a resin which has a monocyclic or polycyclic alicyclic hydrocarbon structure and increases solubility in an alkali developer by the action of an acid, (B) a compound which generates an acid upon irradiation of an actinic ray or radiation, and (D) a solvent.

Each of the main components of the positive resist composition to which the resin (HR) is added will be described below.

(A) Resin which has a Monocyclic or Polycyclic Alicyclic Hydrocarbon Structure and Increases Solubility in an Alkali Developer by the Action of an Acid The resin used in the positive resist composition according to the invention is a resin (hereinafter also referred to as a "acid-decomposable resin", "acid-decomposable resin (A)" or "resin (A)") which has a monocyclic or polycyclic alicyclic hydrocarbon structure, increases solubility in an alkali developer by the action of an acid and contains a group (hereinafter also referred to as an "acid-decomposable group") that is decomposed with an acid to generate an alkali-soluble group in the main chain or side chain thereof, or both the main chain and side chain thereof.

Examples of the alkali-soluble group includes a phenolic hydroxy group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group and a tris(alkylsulfonyl)methylene group.

Preferable examples of the alkali-soluble group include a carboxylic acid group, a fluorinated alcohol group (preferably a hexafluoroisopropanol group) or a sulfonic acid group.

The group which is decomposed with an acid (acid-decomposable group) preferably includes a group in which a hydrogen atom of the alkali-soluble group is substituted with a group capable of being released with an acid.

The group capable of being released with an acid includes, for example, —C($R_{36}$)($R_{37}$)($R_{38}$), —C($R_{36}$)($R_{37}$)(O$R_{39}$) and —C($R_{01}$)($R_{02}$)(O$R_{39}$).

In the above formulae, $R_{36}$ to $R_{39}$ each independently represents an alkyl group, a cycloalkyl group, an aryl group, an aralkyl group or an alkenyl group. Alternatively, $R_{36}$ and $R_{37}$ may be connected with each other to from a ring.

$R_{01}$ and $R_{02}$ each independently represent a hydrogen atom, an alkyl group, a cycloalkyl group, an aryl group, an aralkyl group or an alkenyl group.

The acid-decomposable group is preferably a cumyl ester group, an enol ester group, an acetal ester group or a tertiary alkyl ester group, more preferably a tertiary alkyl ester group.

The positive resist composition containing the resin which has a monocyclic or polycyclic alicyclic hydrocarbon structure and increases solubility in an alkali developer by the action of an acid according to the invention is preferably used when the irradiation of an ArF excimer laser beam is conducted.

The resin (hereinafter also referred to as an "alicyclic hydrocarbon-type acid-decomposable resin") which has a monocyclic or polycyclic alicyclic hydrocarbon structure and is decomposed by the action of an acid to increase solubility in an alkali developer is preferably a resin containing at least one repeating unit selected from the group consisting of a repeating unit having a partial structure including an alicyclic hydrocarbon represented by any one of formulae (pI) to (pV) shown below and a repeating unit represented by formula (II-AB) shown below.

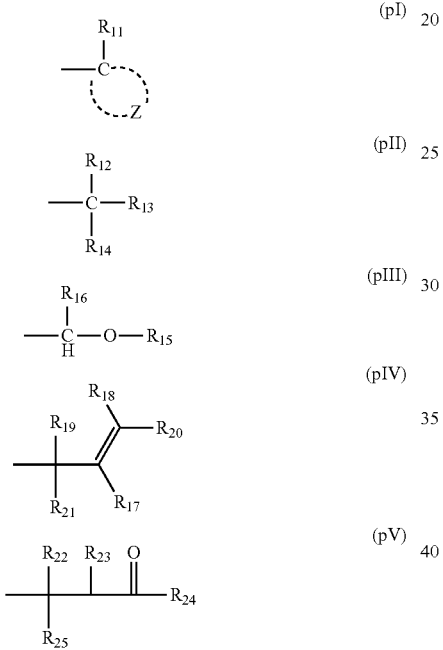

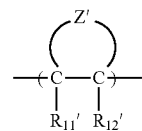

In formula (II-AB), $R_{11}'$ and $R_{12}'$ each independently represents a hydrogen atom, a cyano group, a halogen atom or an alkyl group.

Z' represents an atomic group necessary for forming an alicyclic structure together with the connected two carbon atoms (C—C).

Of the repeating units represented by formula (II-AB), those represented by formulae (II-AB1) and (II-AB2) shown below are more preferable.

In formulae (II-AB1) and (II-AB2), $R_{13}'$ to $R_{16}'$ each independently represents a hydrogen atom, a halogen atom, a cyano group, —COOH, —COOR$_5$, a group capable of being decomposed by the action of an acid, —C(=O)—X-A'-$R_{17}'$, an alkyl group or a cycloalkyl group. Alternatively, at least two of $R_{13}'$ to $R_{16}'$ may be combined with each other to form a ring.

$R_5$ represents an alkyl group, a cycloalkyl group or a group including a lactone structure.

X represents an oxygen atom, a sulfur atom, —NH—, —NHSO$_2$— or —NHSO$_2$NH—.

A' represents a single bond or a divalent connecting group.

$R_{17}'$ represents —COOH, —COOR$_5$, a cyano group, a hydroxy group, an alkoxy group, —CO—NH—R$_6$, —CO—NH—SO$_2$—R$_6$ or a group including a lactone structure.

$R_6$ represents an alkyl group or a cycloalkyl group.

n represents 0 or 1.

In formulae (pI) to (pV), $R_{11}$ represents a methyl group, an ethyl group, a n-propyl group, an isopropyl group, a n-butyl group, an isobutyl group or a sec-butyl group, and Z represents an atomic group necessary for forming a cycloalkyl group together with the carbon atom.

$R_{12}$ to $R_{16}$ each independently represents a straight-chain or branched alkyl group having from 1 to 4 carbon atoms or a cycloalkyl group, provided that at least one of $R_{12}$ to $R_{14}$ or either $R_{15}$ or $R_{16}$ represents a cycloalkyl group.

$R_{17}$ to $R_{21}$ each independently represents a hydrogen atom, a straight-chain or branched alkyl group having from 1 to 4 carbon atoms or a cycloalkyl group, provided that at least one of $R_{17}$ to $R_{21}$ represents a cycloalkyl group and either $R_{19}$ or $R_{21}$ represents a straight-chain or branched alkyl group having from 1 to 4 carbon atoms or a cycloalkyl group.

$R_{22}$ to $R_{25}$ each independently represents a hydrogen atom, a straight-chain or branched alkyl group having from 1 to 4 carbon atoms or a cycloalkyl group, provided that at least one of $R_{22}$ to $R_{25}$ represents a cycloalkyl group. Alternatively, $R_{23}$ and $R_{24}$ may be combined with each other to form a ring.

In formulae (pI) to (pV), the alkyl group for $R_{12}$ to $R_{25}$ represents a straight-chain or branched alkyl group having from 1 to 4 carbon atoms.

The cycloalkyl group for $R_{11}$ to $R_{25}$ or the cycloalkyl group formed by Z and the carbon atom may be monocyclic or polycyclic. Specific examples thereof include groups having 5 or more carbon atoms and including, for example, a monocyclo, bicyclo, tricyclo or tetracyclo structure. The number of carbon atoms of the cycloalkyl group is preferably from 6 to 30, particularly preferably from 7 to 25. The cycloalkyl group may have a substituent.

Specific examples of the preferable cycloalkyl group include an adamantyl group, a noradamantyl group, a decaline residue, a tricyclodecanyl group, a tetracyclododecanyl group, a norbornyl group, a sedorol group, a cyclopentyl group, a cyclohexyl group, a cycloheptyl group, a cyclooctyl group, a cyclodecanyl group and a cyclododecanyl group. Among them, an adamantyl group, a norbornyl group, a cyclohexyl group, a cyclopentyl group, a tetracyclododecanyl group and a tricyclodecanyl group are more preferable.

The alkyl group or cycloalkyl group may have a substituent. Examples of the substituent for the alkyl group or cycloalkyl group include an alkyl group (preferably having from 1 to 4 carbon atoms), a halogen atom, a hydroxy group, an alkoxy group (preferably having from 1 to 4 carbon atoms), a carboxyl group and an alkoxycarbonyl group (preferably having from 2 to 6 carbon atoms). The alkyl group, alkoxy group or alkoxycarbonyl group described above may further have a substituent. Examples of the substituent which the alkyl group, alkoxy group or alkoxycarbonyl group described above may further have include a hydroxy group, a halogen atom and an alkoxy group.

The structure represented by any one of formulae (pI) to (pV) in the resin can be used for protecting an alkali-soluble group. The alkali-soluble group includes various groups known in the field of art.

Specifically, structures wherein a hydrogen atom of a carboxylic acid group, a sulfonic acid group, a phenol group or a thiol group is substituted with the structure represented by any one of formulae (pI) to (pV) are exemplified, and preferably structures wherein a hydrogen atom of a carboxylic acid group or a sulfonic acid group is substituted with the structure represented by any one of formulae (pI) to (pV) are exemplified.

As the repeating unit including the alkali-soluble group protected by the structure represented by any one of formulae (pI) to (pV), a repeating unit represented by formula (pA) shown below is preferable.

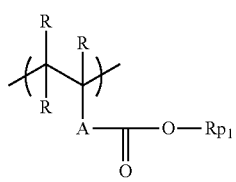

(pA)

In formula (pA), R represents a hydrogen atom, a halogen atom or a straight-chain or branched alkyl group having from 1 to 4 carbon atoms. The plural Rs may be the same or different from each other.

A represents a single bond, an alkylene group, an ether group, a thioether group, a carbonyl group, an ester group, an amido group, a sulfonamido group, a urethane group, a urea group or a combination of two or more thereof. A is preferably a single bond.

Rp₁ represents any one of the structures represented by formulae (pI) to (pV).

Of the repeating units represented by formula (pA), repeating units derived from 2-alkyl-2-adamantyl (meth)acrylate and dialkyl(1-adamantyl)methyl (meth)acrylate are particularly preferable.

Specific examples of the repeating unit represented by formula (pA) are set forth below, but the invention should not be construed as being limited thereto.

In the formulae below, $R_x$ represents —H, —CH₃ or —CH₂OH, and $R_{xa}$ and $R_{xb}$ each represents an alkyl group having from 1 to 4 carbon atoms.

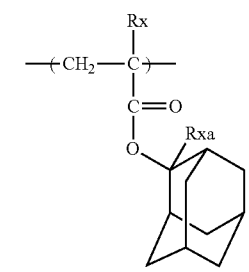

1

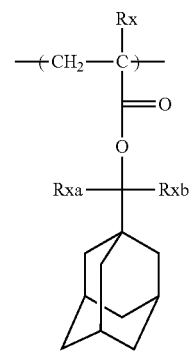

2

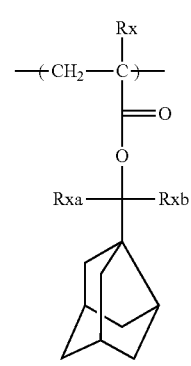

3

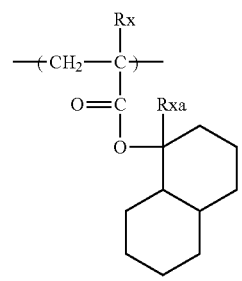

4

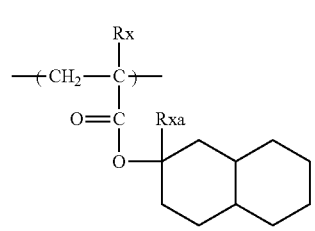

5

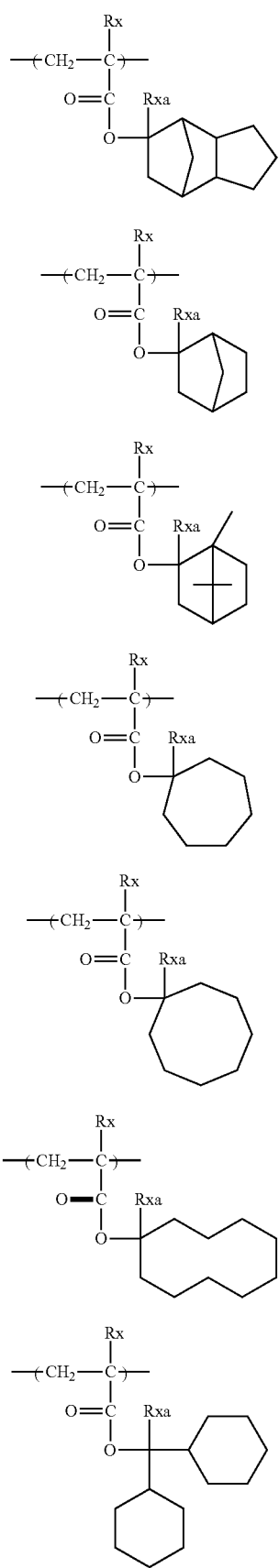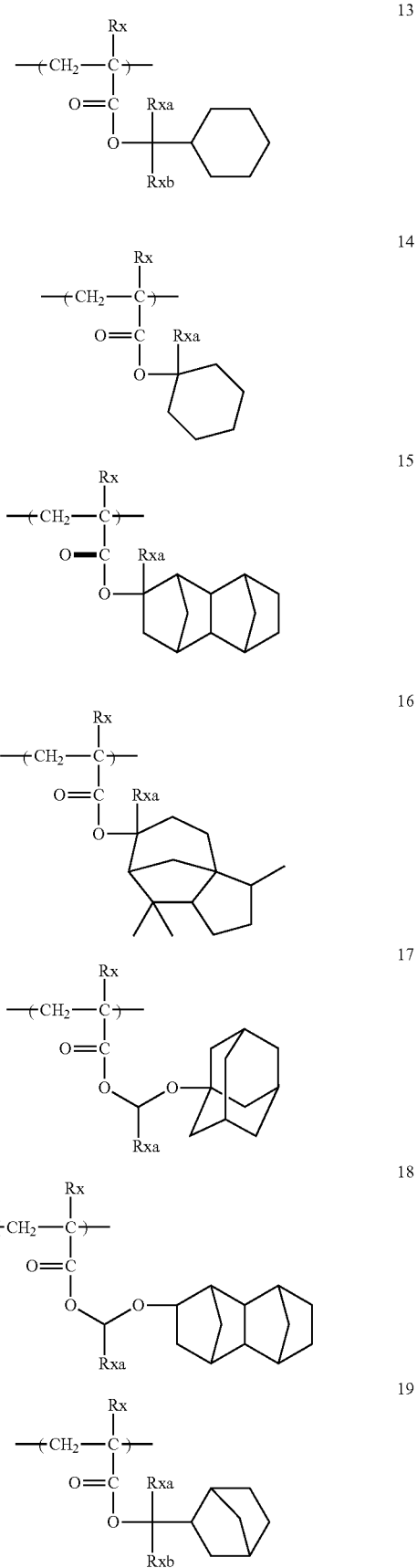

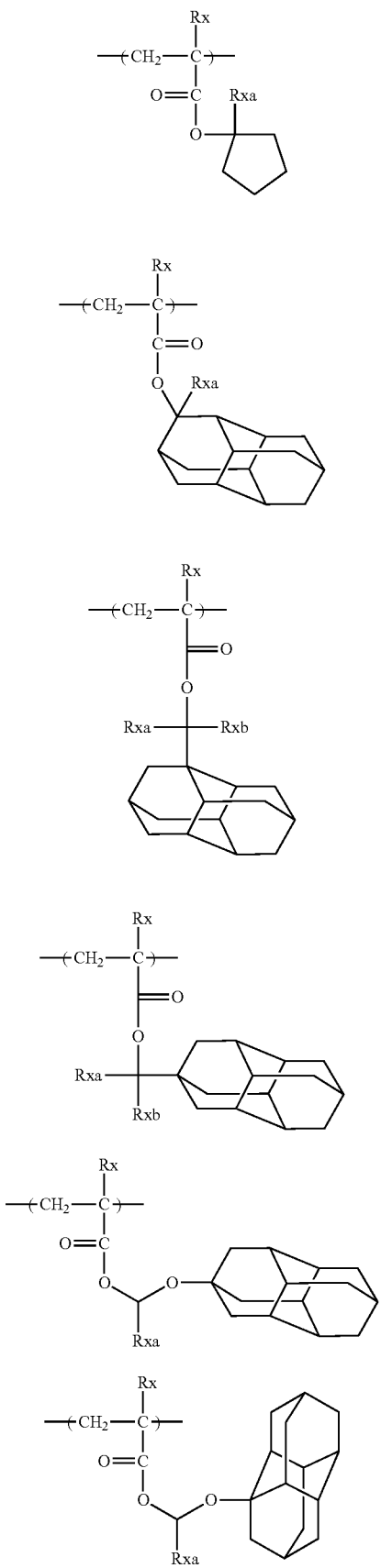

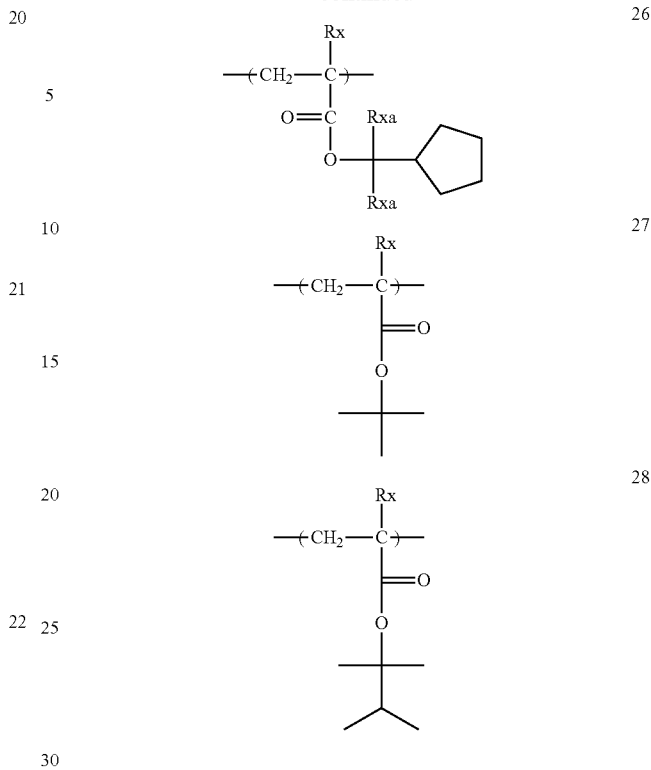

In formula (II-AB), the halogen atom for $R_{11}'$, or $R_{12}'$ includes, for example, a chlorine atom, a bromine atom, a fluorine atom and an iodine atom.

The alkyl group for each of $R_{11}'$ and $R_{12}'$ includes preferably a straight-chain or branched alkyl group having from 1 to 10 carbon atoms.

The atomic group necessary for forming an alicyclic structure represented by Z' is an atomic group necessary for forming a repeating unit of alicyclic hydrocarbon moiety which may have a substituent in the resin. In particular, an atomic group necessary for forming a bridged alicyclic structure by which a repeating unit of the bridged alicyclic hydrocarbon is completed is preferable.

The skeleton of the alicyclic hydrocarbon formed includes the same as described regarding the alicyclic hydrocarbon group for each of $R_{12}$ to $R_{25}$ in formulae (pI) to (pV).

The skeleton of the above-described alicyclic hydrocarbon may have a substituent. Examples of the substituent include the atoms and groups represented by $R_{13}'$ to $R_{16}'$ in formula (II-AB1) or (II-AB2).

In the alicyclic hydrocarbon-type acid-decomposable resin according to the invention, the group which is decomposed by the action of an acid may be incorporated into at least one repeating unit selected from the repeating unit having a partial structure including an alicyclic hydrocarbon represented by any one of formulae (pI) to (pV), the repeating unit represented by formula (II-AB) and a repeating unit of a copolymerization component described hereinafter.

Various substituents represented by $R_{13}'$ to $R_{16}'$ in formulae (II-AB1) and (II-AB2) may constitute substituents for the atomic group necessary for forming an alicyclic structure or the atomic group necessary for forming an bridged alicyclic structure represented by Z' in formula (II-AB).

Specific examples of the repeating unit represented by formula (II-AB1) or (II-AB2) are set forth below, but the invention should not be construed as being limited thereto.

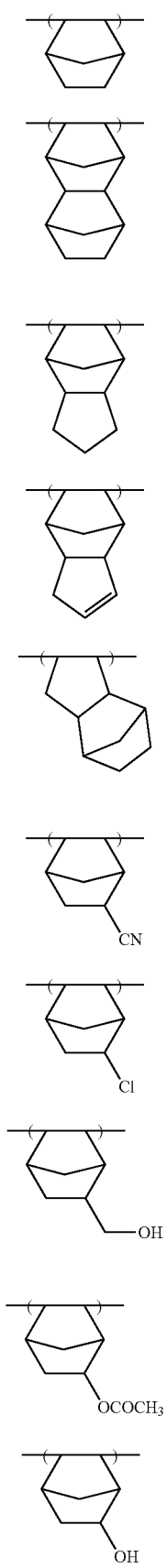
[II-1]
[II-2]
[II-3]
[II-4]
[II-5]
[II-6]
[II-7]
[II-8]
[II-9]
[II-10]
-continued
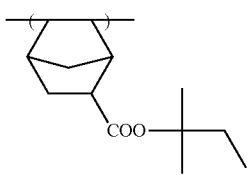 [II-11]
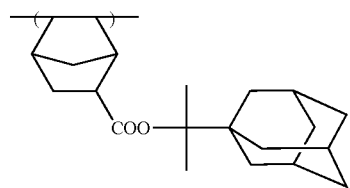 [II-12]
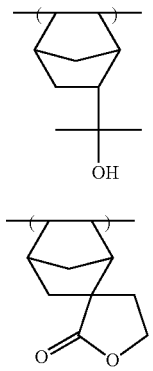 [II-13]
[II-14]
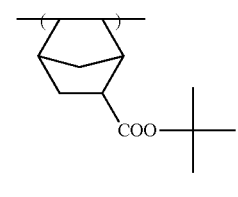 [II-15]
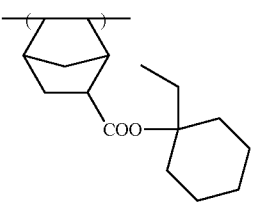 [II-16]
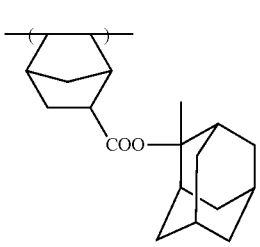 [II-17]
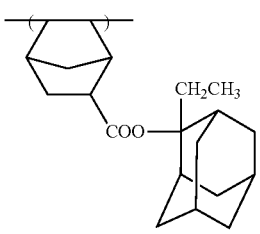 [II-18]

[II-19]
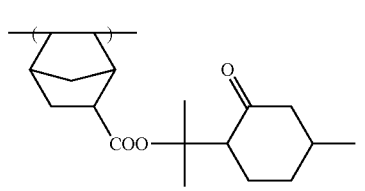
[II-20]
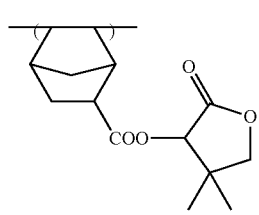
[II-21]
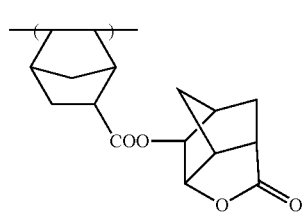
[II-22]
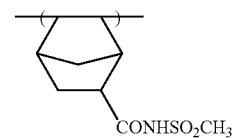
[II-23]
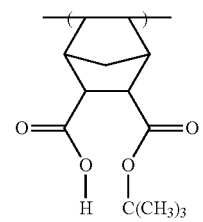
[II-24]
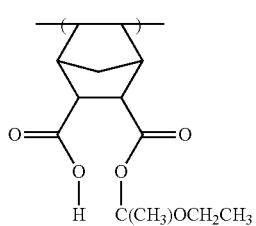
[II-25]
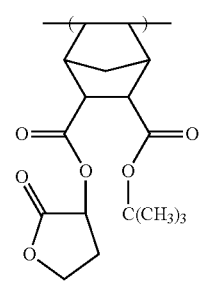
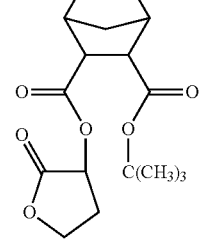
[II-26]
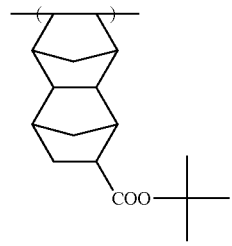
[II-27]
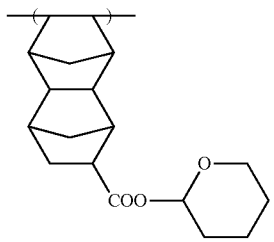
[II-28]
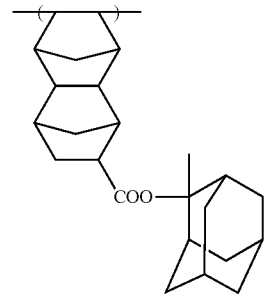
[II-29]
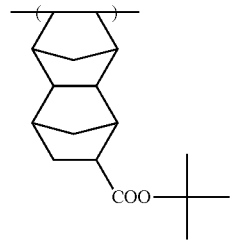
[II-30]
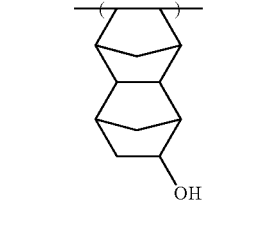
[II-31]
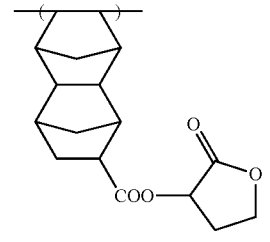

[II-32]

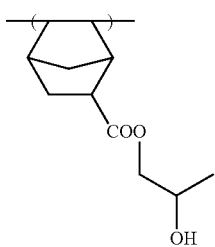

The alicyclic hydrocarbon-type acid-decomposable resin according to the invention preferably contains a repeating unit including a lactone group. As the lactone group, any group may be used as long as it includes a lactone structure. A group including a 5-membered to 7-membered lactone structure is preferable and a group including a 5-membered to 7-membered lactone structure to which other cyclic structure is condensed to form a bicycle structure or a spiro structure is more preferable. The alicyclic hydrocarbon-type acid-decomposable resin according to the invention more preferably contains a repeating unit having a group including a lactone structure represented by any one of formulae (LC1-1) to (LC1-16) shown below. The group including a lactone structure may be directly connected to the main chain. Preferable examples of the lactone structure include (LC1-1), (LC1-4), (LC1-5), (LC1-6), (LC1-13) and (LC1-14). By using the specific lactone structure, line edge roughness and development defect are improved.

LC1-1

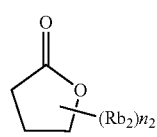

LC1-2

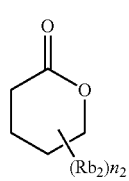

LCl-3

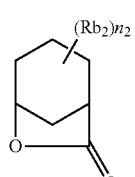

LC1-4

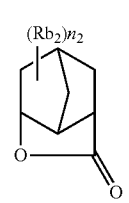

LC1-5

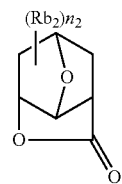

LC1-6

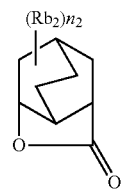

LC1-7

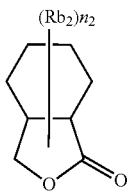

LCl-8

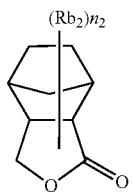

LCl-9

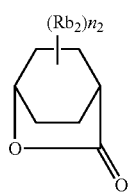

LC1-10

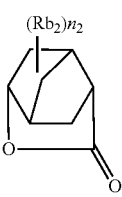

LC1-11

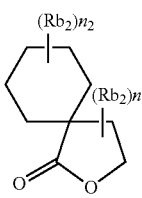

LC1-12

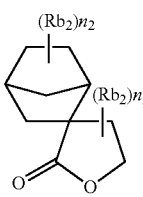

-continued

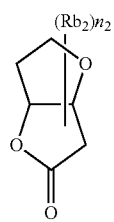 LC1-13

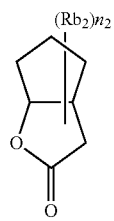 LC1-14

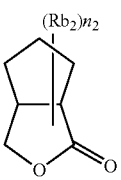 LC1-15

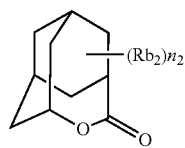 LC1-16

The lactone structure may or may not have the substituent (Rb$_2$). Preferable examples of the substituent (Rb$_2$) include an alkyl group having from 1 to 8 carbon atoms, a cycloalkyl group having from 4 to 7 carbon atoms, an alkoxy group having from 1 to 8 carbon atoms, an alkoxycarbonyl group having from 2 to 8 carbon atoms, a carboxyl group, a halogen atom, a hydroxy group, a cyano group and an acid-decomposable group. n$_2$ represents an integer of 0 to 4. When n$_2$ is 2 or more, the plural Rb$_2$s may be the same or different from each other, or the plural Rb$_2$s may be combined with each other to form a ring.

Examples of the repeating unit having a group including a lactone structure represented by any one of formulae (LC1-1) to (LC1-16) include a repeating unit in which at least one of R$_{13}$' to R$_{16}$' in formulae (II-AB1) and (II-AB2) shown above has the group represented by any one of formulae (LC1-1) to (LC1-16) (for example, R$_5$ in —COOR$_5$ represents the group represented by any one of formulae (LC1-1) to (LC1-16)) and a repeating unit represented by formula (AI) shown below.

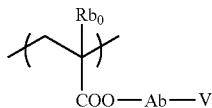 (AI)

In formula (AI), R$_{b0}$ represents a hydrogen atom, a halogen atom or an alkyl group having from 1 to 4 carbon atoms.

Preferable examples of the substituent which the alkyl group represented by R$_{b0}$ may have include a hydroxy group and a halogen atom.

Examples of the halogen atom represented by R$_{b0}$ include a fluorine atom, a chlorine atom, a bromine atom and an iodine atom.

R$_{b0}$ is preferably a hydrogen atom or a methyl group.

A$_b$ represents a single bond, an alkylene group, a divalent connecting group including a monocyclic or polycyclic alicyclic hydrocarbon structure, an ether group, an ester group, a carbonyl group or a divalent group formed by combining these groups. A$_b$ is preferably a single bond or a connecting group represented by -Ab$_1$-CO$_2$—.

Ab$_1$ represents a straight-chain or branched alkylene group or a monocyclic or polycyclic cycloalkylene group, preferably a methylene group, an ethylene group, a cyclohexylene group, an adamantylene group or a norbornylene group.

V represents a group represented by any one of formulae (LC1-1) to (LC1-16).

The repeating unit containing a lactone structure ordinarily includes optical isomers and any optical isomer can be used. One kind of the optical isomers may be used alone or plural kinds of the optical isomers may be used in mixture. When one kind of the optical isomers is mainly used, the optical purity (ee) thereof is preferably 90 or more, more preferably 95 or more.

Specific examples of the repeating unit having a group including a lactone structure are set forth below, but the invention should not be construed as being limited thereto.

In the formulae below, R$_x$ represents —H, —CH$_3$, —CH$_2$OH or —CF$_3$.

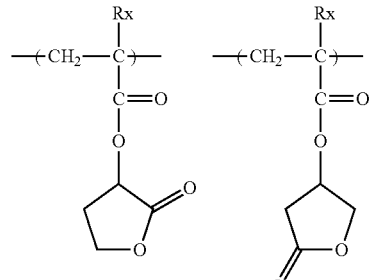

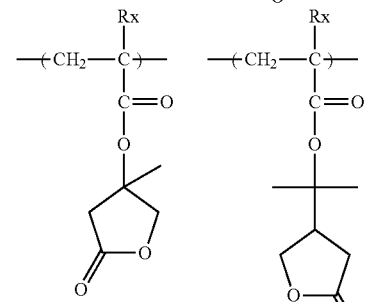

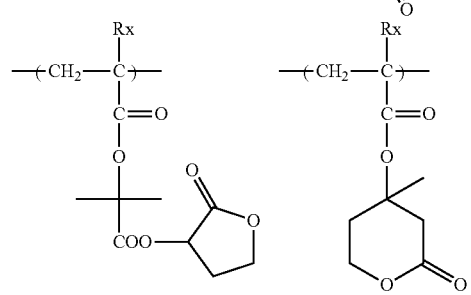

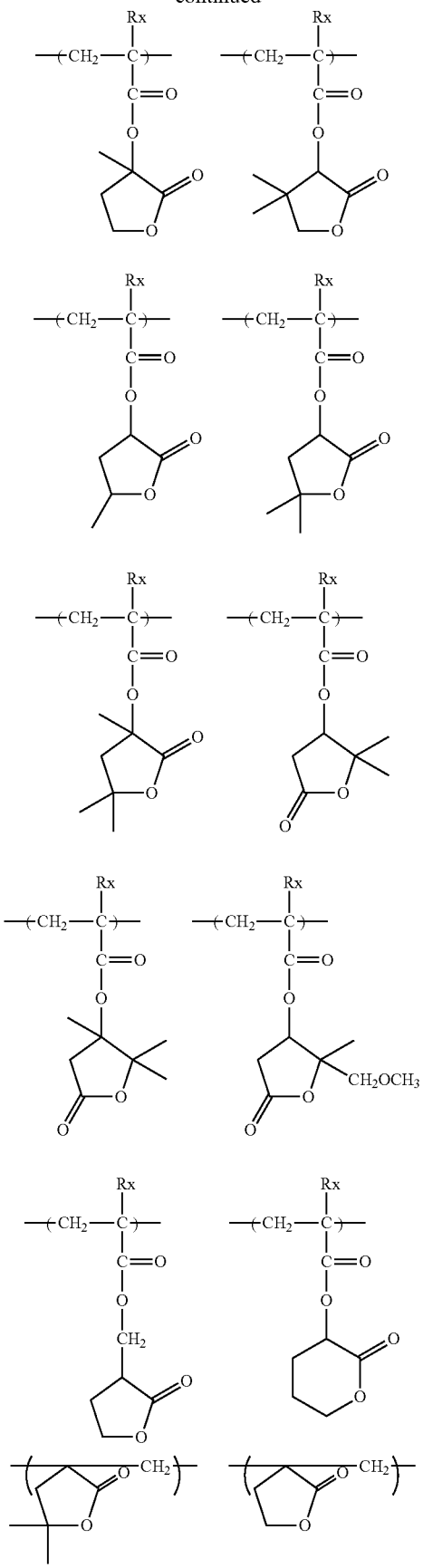
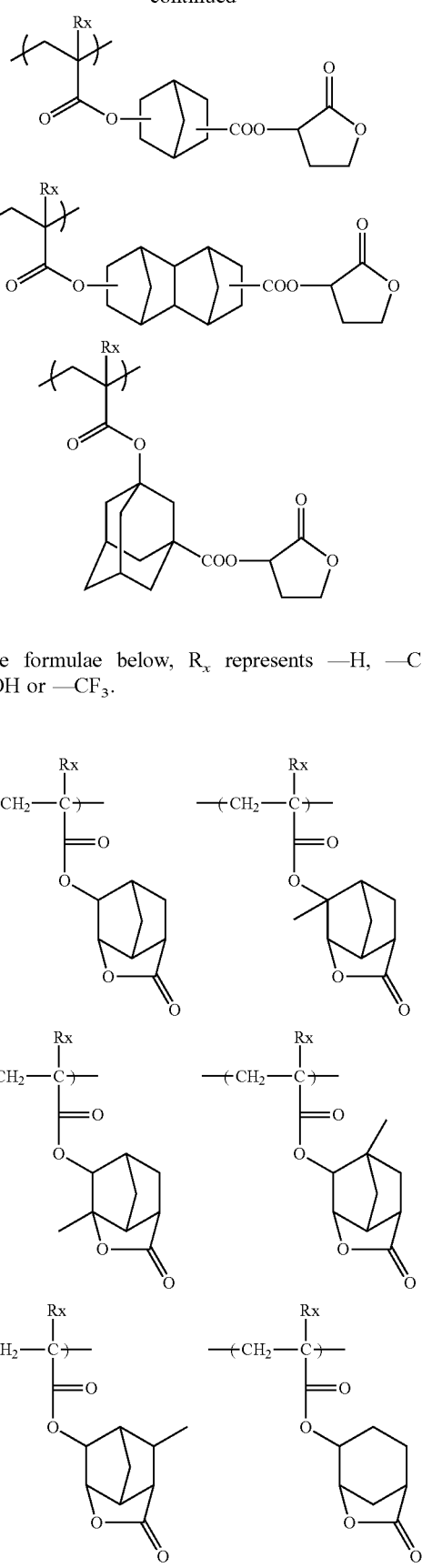
In the formulae below, $R_x$ represents —H, —$CH_3$, —$CH_2OH$ or —$CF_3$.

65
-continued
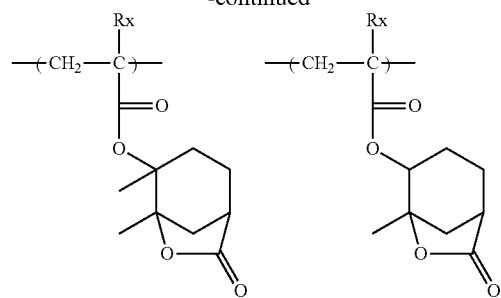
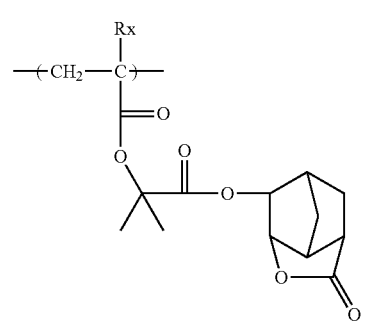
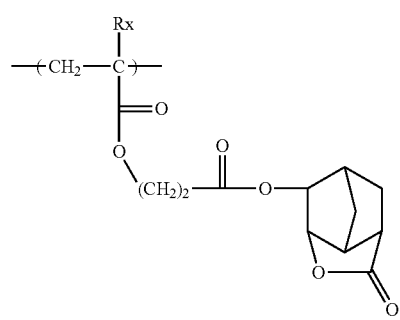
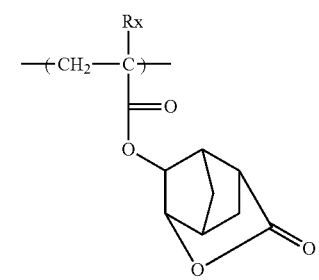
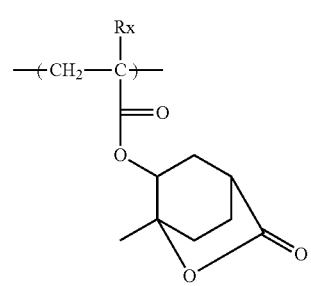
66
-continued
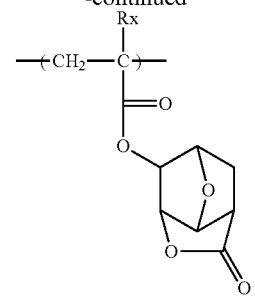
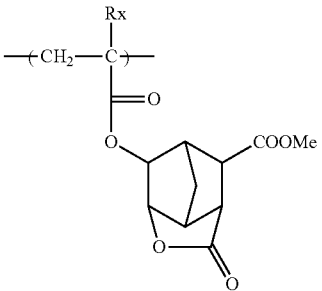
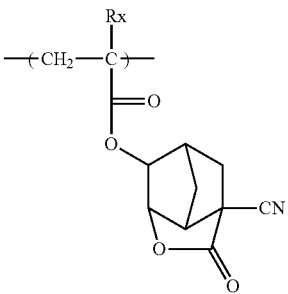
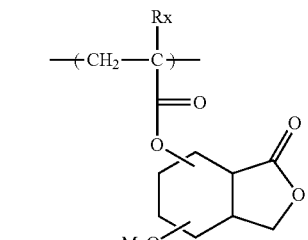
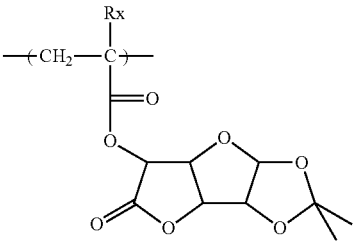
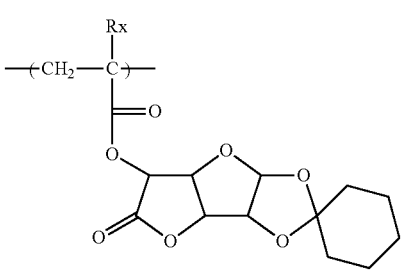

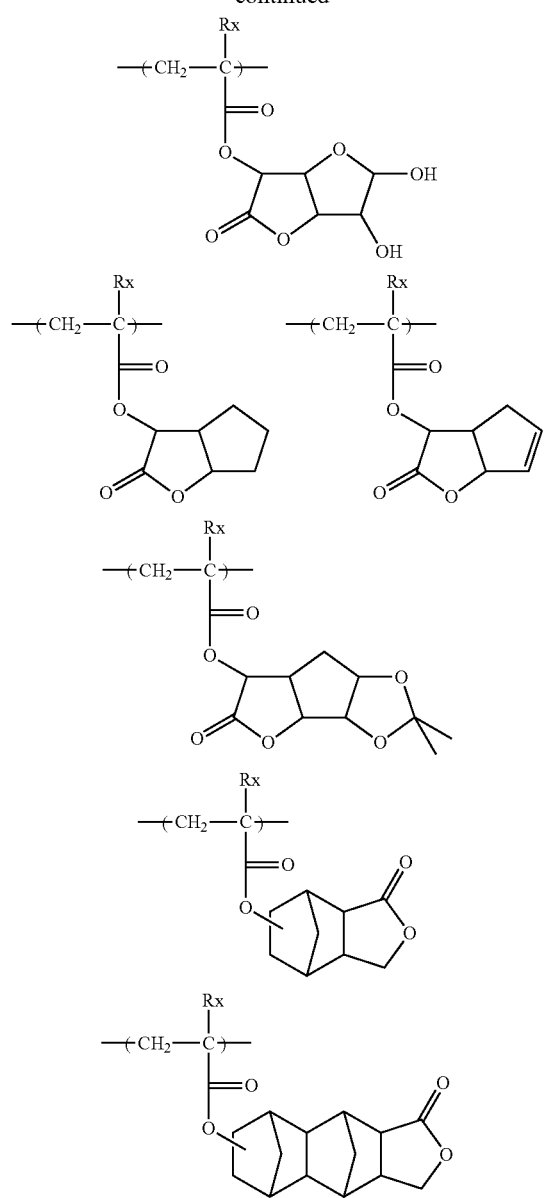
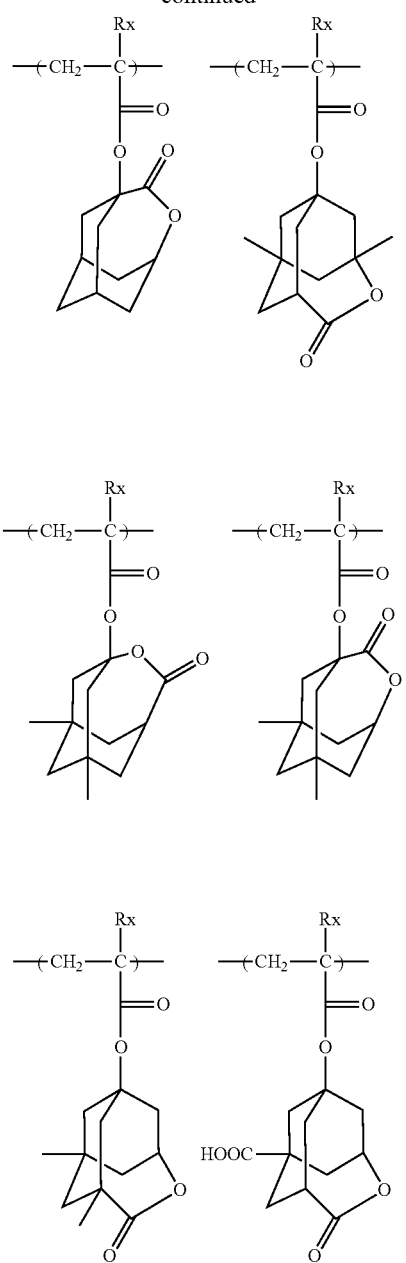
In the formulae below, $R_x$ represents —H, —CH$_3$, —CH$_2$OH or —CF$_3$.
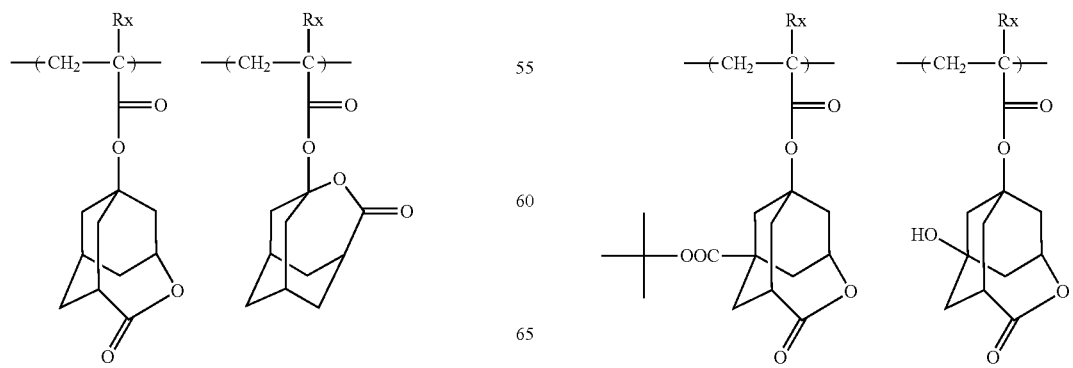

-continued

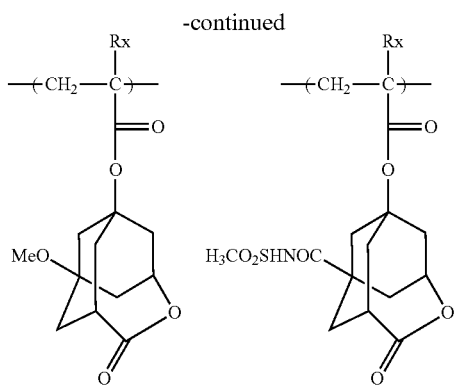

The alicyclic hydrocarbon-type acid-decomposable resin according to the invention preferably contains a repeating unit including an organic group having a polar group, particularly, a repeating unit including an alicyclic hydrocarbon structure substituted with a polar group. The introduction of such a repeating unit increases the adhesion property to substrate and affinity for developer. Preferable examples of the alicyclic hydrocarbon structure in the alicyclic hydrocarbon structure substituted with a polar group include an adamantyl group, a diamantyl group and a norbornane group. Preferable examples of the polar group include a hydroxy group and a cyano group.

As the alicyclic hydrocarbon structure substituted with a polar group, for example, structures represented by any one of formulae (VIIa) and (VIId) shown below are preferable.

(VIIa)

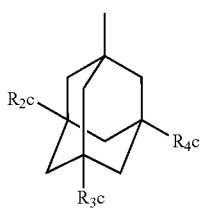

(VIIb)

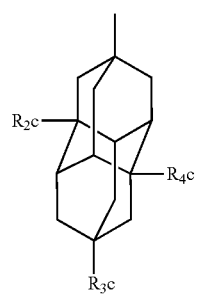

(VIIc)

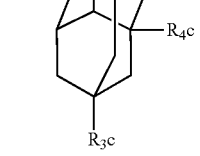

(VIId)

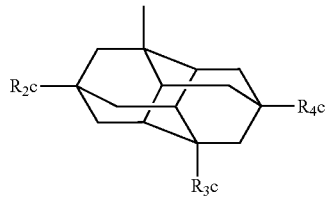

In formulae (VIIa) to (VIIc), $R_{2c}$ to $R_{4c}$ each independently represents a hydrogen atom, a hydroxy group or a cyano group, provided that at least one of $R_{2c}$ to $R_{4c}$ represents a hydroxy group or a cyano group. Preferably, one or two of $R_{2c}$ to $R_{4c}$ represents hydroxy group(s) and the remainder represents hydrogen atom(s).

In formula (VIIa), it is more preferable that two of $R_{2c}$ to $R_{4c}$ each represents a hydroxy group and the remainder represents a hydrogen atom.

Examples of the repeating unit containing a group represented by any one of formulae (VIIa) to (VId) include a repeating unit in which at least one of $R_{13}'$ to $R_{16}'$ in formula (II-AB1) or (II-AB2) shown above has the group represented by any one of formulae (VIIa) to (VIId) (for example, $R_5$ in —$COOR_5$ represents the group represented by any one of formulae (VIIa) to (VIId)) and a repeating unit represented by any one of formulae (AIIa) to (AIId) shown below.

(AIIa)

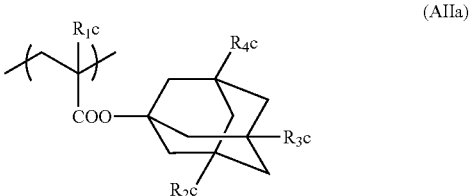

(AIIb)

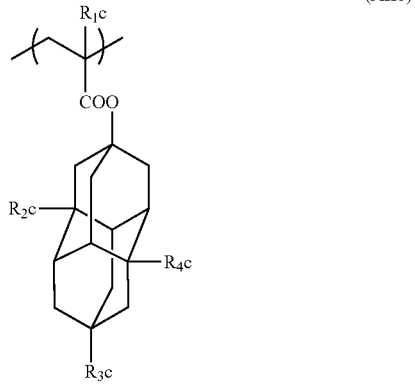

(AIIc)

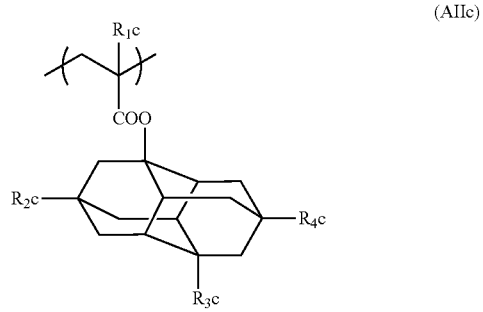

(AIId)

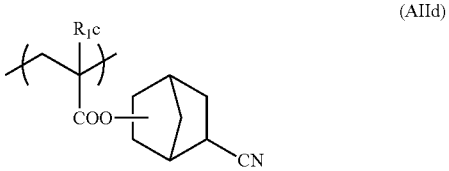

In formulae (AIIa) to (AIId), $R_{1c}$ represents a hydrogen atom, a methyl group, a trifluoromethyl group or a hydroxymethyl group. $R_{2c}$ to $R_{4c}$ have the same meanings as $R_{2c}$ to $R_{4c}$ defined in formulae (VIIa) to (VIIc), respectively.

Specific examples of the repeating unit including the structure represented by formula (AIIa) to (AIId) are set forth below, but the invention should not be construed as being limited thereto.

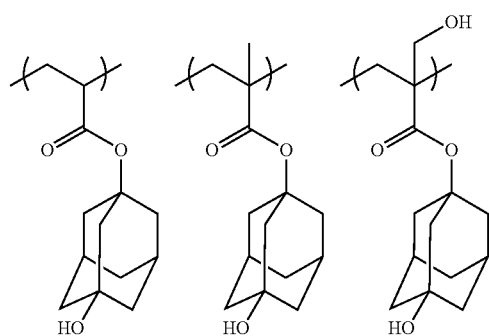
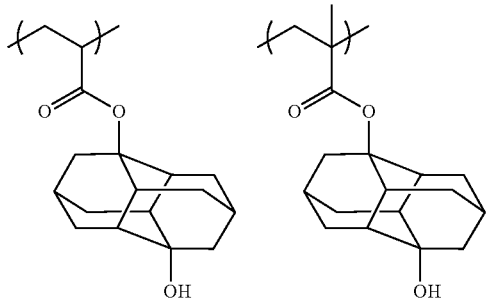

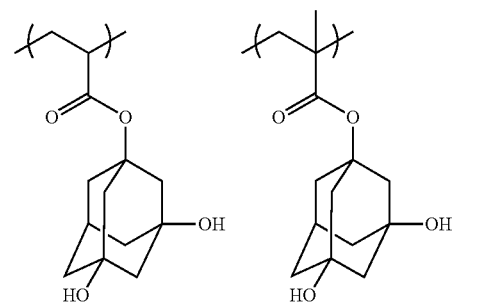

The alicyclic hydrocarbon-type acid-decomposable resin according to the invention may contain a repeating unit represented by formula (VIII) shown below.

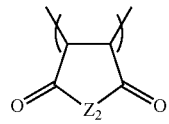

(VIII)

In formula (VIII), $Z_2$ represents —O— or —N($R_{41}$)—. $R_{41}$ represents a hydrogen atom, a hydroxy group, an alkyl group or —OSO$_2$—$R_{42}$. $R_{42}$ represents an alkyl group, a cycloalkyl group or a camphor residue. The alkyl group represented by $R_{41}$ or $R_{42}$ may be substituted, for example, with a halogen atom (preferably a fluorine atom).

Specific examples of the repeating unit represented by formula (VIII) are set forth below, but the invention should not be construed as being limited thereto.

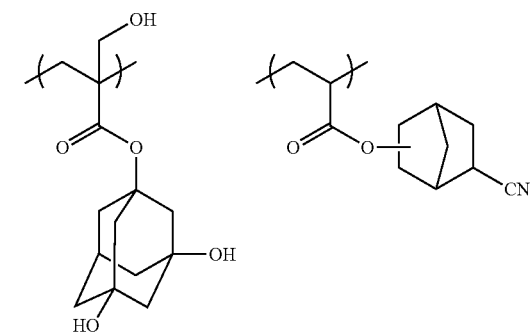

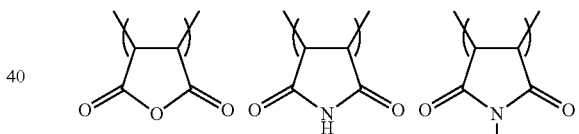

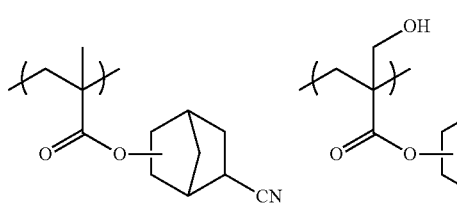

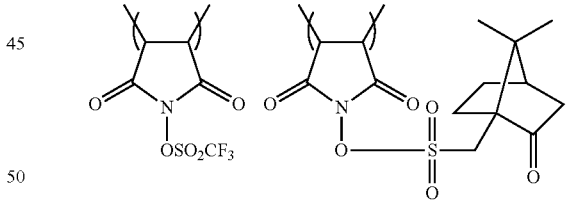

The alicyclic hydrocarbon-type acid-decomposable resin according to the invention preferably contains a repeating unit including an alkali-soluble group, more preferably a repeating unit including a carboxyl group. The introduction of such a repeating unit increases resolution in the application to forming contact holes. As the repeating unit including a carboxyl group, any of a repeating unit in which the carboxyl group is directly connected to the main chain of resin, for example, a repeating unit based on acrylic acid or methacrylic acid, a repeating unit in which the carboxyl group is connected to the main chain of resin through a connecting group and introduction into the terminal of polymer chain using a polymerization initiator or chain transfer agent having the alkali-soluble group at the polymerization is preferable. The connecting group may include a

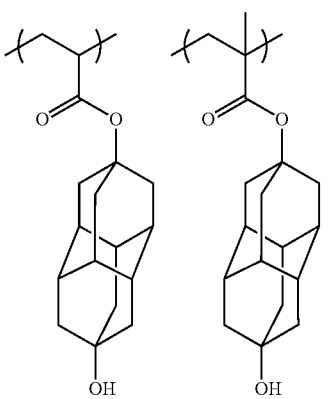

monocyclic or polycyclic alicyclic hydrocarbon structure. The repeating unit based on acrylic acid or methacrylic acid is particularly preferable.

The alicyclic hydrocarbon-type acid-decomposable resin according to the invention may further contain a repeating unit including one to three groups represented by formula (F1) shown below. The introduction of such a repeating unit increases line edge roughness.

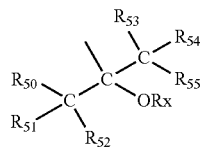

In formula (F1), $R_{50}$ to $R_{55}$ each independently represents a hydrogen atom, a fluorine atom or an alkyl group, provided that at least one of $R_{50}$ to $R_{55}$ represents a fluorine atom or an alkyl group in which at least one of the hydrogen atoms is substituted with a fluorine atom.

$R_x$ represents a hydrogen atom or an organic group (preferably an acid-decomposable protective group, an alkyl group, a cycloalkyl group, an acyl group or an alkoxycarbonyl group).

The alkyl group represented by any one of $R_{50}$ to $R_{55}$ may be substituted, for example, with a halogen atom, e.g., a fluorine atom or a cyano group. The alkyl group preferably includes an alkyl group having from 1 to 3 carbon atoms, for example, a methyl group and a trifluoromethyl group.

All of $R_{50}$ to $R_{55}$ are preferably fluorine atoms.

The organic group represented by $R_x$ preferably includes an acid-decomposable protective group and an alkyl group, a cycloalkyl group, an acyl group, an alkylcarbonyl group, an alkoxycarbonyl group, an alkoxycarbonylmethyl group, an alkoxymethyl group and a 1-alkoxyethyl group each of which may be substituted.

As the repeating unit including the group represented by formula (F1), a repeating unit represented by formula (F2) shown below is preferably exemplified.

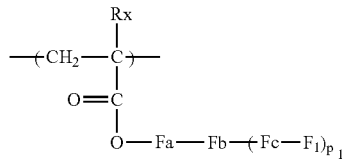

In formula (F2), $R_x$ represents a hydrogen atom, a halogen atom or an alkyl group having from 1 to 4 carbon atoms. Preferable examples of the substituent which the alkyl group represented by $R_x$ may have includes a hydroxy group or a halogen atom.

$F_a$ represents a single bond or a straight-chain or branched alkylene group, preferably a single bond.

$F_b$ represents a monocyclic or polycyclic cyclic hydrocarbon group.

$F_c$ represents a single bond or a straight-chain or branched alkylene group, preferably a single bond or a methylene group.

$F_1$ represents a group represented by formula (F1) above.

$p_1$ represents an integer of 1 to 3.

The cyclic hydrocarbon group represented by $F_b$ preferably includes a cyclopentyl group, a cyclohexyl group and a norbornyl group.

Specific examples of the repeating unit including the group represented by formula (F1) are set forth below, but the invention should not be construed as being limited thereto.

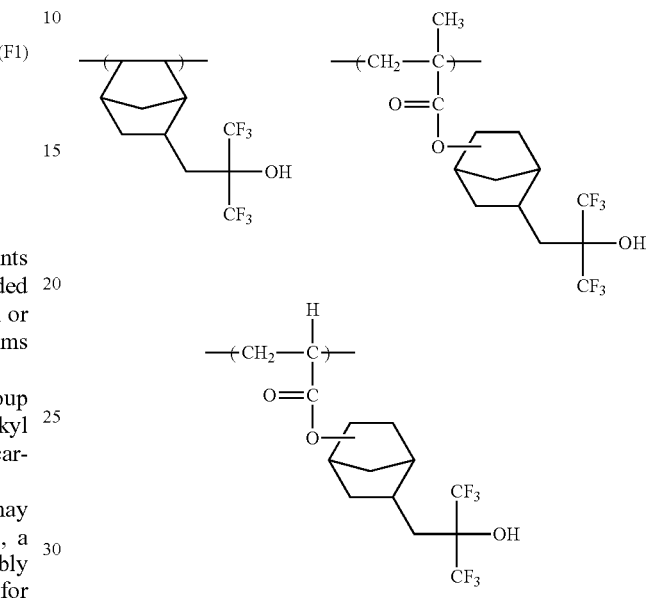

The alicyclic hydrocarbon-type acid-decomposable resin according to the invention may further contain a repeating unit which does not have the acid-decomposability and which includes an alicyclic hydrocarbon structure. The introduction of such a repeating unit decreases the dissolution of a low molecular weight component from the resist film to the immersion liquid at the immersion exposure. Examples of such a repeating unit include 1-adamantyl (meth)acrylate, tricyclodecanyl (meth)acrylate and cyclohexyl (meth)acrylate.

The alicyclic hydrocarbon-type acid-decomposable resin according to the invention may contain various repeating structural units in addition to the repeating structural units described above for the purposes of adjusting dry etching resistance, standard developer aptitude, adhesion property to substrate, resist profile, and other characteristics ordinarily required for resist, for example, resolution, heat resistance and sensitivity.

Examples of such repeating structural units include repeating structural units corresponding to monomers described below, but the invention should not be construed as being limited thereto.

The introduction of additional repeating structural unit makes possible the fine control of characteristics required for the alicyclic hydrocarbon-type acid-decomposable resin, particularly (1) solubility in a coating solvent, (2) film forming property (glass transition temperature), (3) developing property with alkali, (4) decrease in film thickness (hydrophobicity, selection of alkali-soluble group), (5) adhesion property of the unexposed area to a substrate, and (6) dry etching resistance.

Examples of the monomer include compounds having one addition-polymerizable unsaturated bond, for example, those selected from acrylates, methacrylates, acrylamides, methacrylamides, allyl compounds, vinyl ethers and vinyl esters.

In addition, any addition-polymerizable unsaturated compounds copolymerizable with the monomers corresponding to the various repeating structural units described above may be employed.

A molar ratio of each repeating structural unit in the alicyclic hydrocarbon-type acid-decomposable resin can be appropriately determined taking the adjustment of many factors including the dry etching resistance and standard developer aptitude of resist, adhesion property to substrate, resist profile, and other characteristics ordinarily required for resist, for example, resolution, heat resistance and sensitivity into consideration.

Preferable embodiments of the alicyclic hydrocarbon-type acid-decomposable resin according to the invention include the following:

(1) a resin (side chain type) containing a repeating unit having a partial structure including an alicyclic hydrocarbon represented by any one of formulae (pI) to (pV), preferably, a resin containing a repeating unit based on a (meth)acrylate including a structure represented by any one of formulae (pI) to (pV).

(2) a resin (main chain type) containing a repeating unit represented by formula (II-AB). The resin of (2) includes the following resin of (3).

(3) a resin (hybrid type) containing a repeating unit represented by formula (II-AB), a maleic anhydride derivative and a (meth)acrylate structure.

The content of the repeating unit including an acid-decomposable group is preferably from 10 to 60% by mole, more preferably from 20 to 50% by mole, still more preferably from 25 to 40% by mole, based on the total repeating structural units in the alicyclic hydrocarbon-type acid-decomposable resin.

The content of the repeating unit including an acid-decomposable group is preferably from 10 to 60% by mole, more preferably from 20 to 50% by mole, still more preferably from 25 to 40% by mole, based on the total repeating structural units in the acid-decomposable resin.

The content of the repeating unit having a partial structure including an alicyclic hydrocarbon represented by any one of formulae (pI) to (pV) is preferably from 20 to 70% by mole, more preferably from 20 to 50% by mole, still more preferably from 25 to 40% by mole, based on the total repeating structural units in the alicyclic hydrocarbon-type acid-decomposable resin.

The content of the repeating unit represented by formula (II-AB) is preferably from 10 to 60% by mole, more preferably from 15 to 55% by mole, still more preferably from 20 to 50% by mole, based on the total repeating units in the alicyclic hydrocarbon-type acid-decomposable resin.

The content of the repeating unit including a lactone ring is preferably from 10 to 70% by mole, more preferably from 20 to 60% by mole, still more preferably from 25 to 40% by mole, based on the total repeating structural units in the acid-decomposable resin.

The content of the repeating unit including an organic group having a polar group is preferably from 1 to 40% by mole, more preferably from 5 to 30% by mole, still more preferably from 5 to 20% by mole, based on the total repeating structural units in the acid-decomposable resin.

The content of the repeating structural unit based on a monomer corresponding to the additional copolymerization component described above in the resin can be appropriately determined depending on the desired performance of resist.

In general, the content is preferably 99% by mole or less, more preferably 90% by mole or less, still more preferably 80% by mole or less, based on the sum total molar amount of the repeating structural unit having a partial structure including an alicyclic hydrocarbon represented by any one of formulae (pI) to (pV) and the repeating unit represented by formula (II-AB).

In the case wherein the positive resist composition of the invention is used for exposure with ArF laser beam, it is preferred that the resin does not contain an aromatic group in view of transparency to the ArF laser beam.

As the alicyclic hydrocarbon-type acid-decomposable resin for use in the invention, a resin in which all repeating units are composed of (meth)acrylate repeating units is preferable. In such a case, any of case in which all repeating units are composed of methacrylate repeating units, case in which all repeating units are composed of acrylate repeating units and case in which all repeating units are composed of mixture of methacrylate repeating unit and acrylate repeating unit can be used, and it is preferred that the acrylate repeating unit is 50% by mole or less based on the total repeating units of the resin.

The alicyclic hydrocarbon-type acid-decomposable resin is preferably a copolymer containing three kinds of repeating units including a (meth)acrylate repeating unit having a lactone ring, a (meth)acrylate repeating unit having an organic group substituted with at least any one of a hydroxy group and a cyano group and a (meth)acrylate repeating unit having an acid-decomposable group.

Preferably, it is a ternary copolymer containing from 20 to 50% by mole of a repeating unit having a partial structure including an alicyclic hydrocarbon represented by any one of formulae (pI) to (pV), from 20 to 50% by mole of a repeating unit having a lactone structure and from 5 to 30% by mole of a repeating unit including an alicyclic hydrocarbon structure substituted with a polar group, or a quaternary copolymer further containing from 20% by mole or less of other repeating unit.

Particularly preferable resin is a ternary copolymer containing from 20 to 50% by mole of a repeating unit including an acid-decomposable group represented by any one of formulae (ARA-1) to (ARA-5) shown below, from 20 to 50% by mole of a repeating unit having a lactone group represented by any one of formulae (ARL-1) to (ARL-6) shown below and from 5 to 30% by mole of a repeating unit including an alicyclic hydrocarbon structure substituted with a polar group represented by any one of formulae (ARH-1) to (ARH-3) shown below, or a quaternary copolymer further containing from 5 to 20% by mole of a repeating unit including a structure represented by formula (F1) or a repeating unit which does not have the acid-decomposability and which includes an alicyclic hydrocarbon structure.

In the formulae shown below, $Rxy_1$ represents a hydrogen atom or a methyl group, and $Rxa_1$ and $Rxb_1$ each represents a methyl group or an ethyl group.

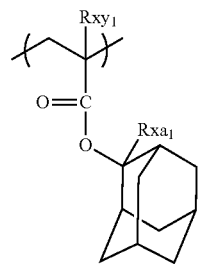

ARA-1

ARA-2
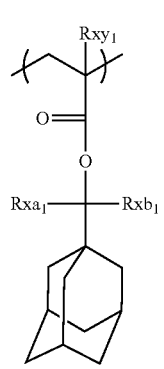
ARA-3
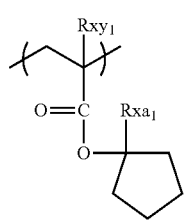
ARA-4
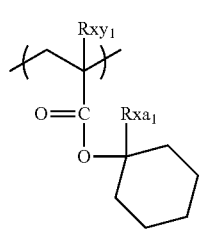
ARA-5
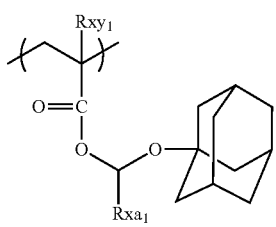
ARL-1
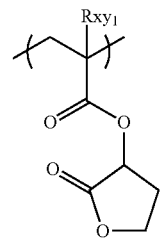
ARL-2
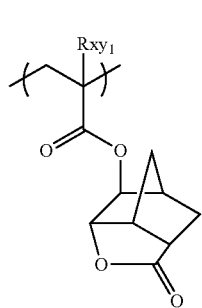
ARL-3
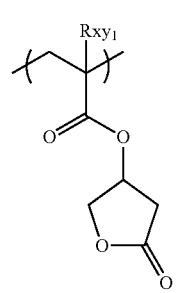
ARL-4
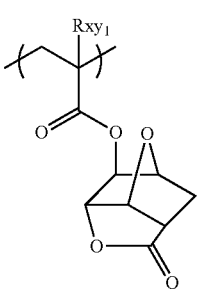
ARL-5
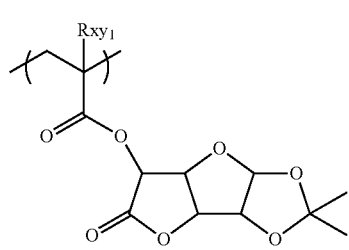
ARL-6
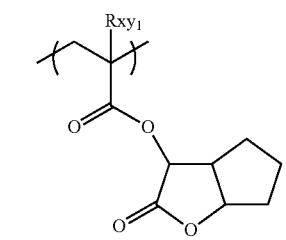
ARH-1
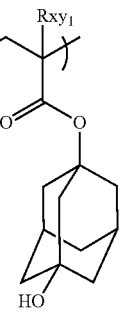

ARH-2

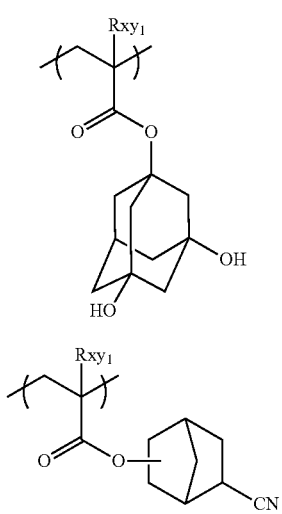

ARH-3

The alicyclic hydrocarbon-type acid-decomposable resin for use in the invention can be synthesized according to a conventional method, for example, radical polymerization. For instance, as an ordinary synthesis method, a batch polymerization method in which polymerization is performed by dissolving monomers and a polymerization initiator in a solvent and heating and a dropwise addition polymerization method in which a solution of monomers and a polymerization initiator is dropwise added to a heated solvent over a period of 1 to 10 hours are exemplified. The dropwise addition polymerization method is preferable. Examples of the reaction solvent include an ether, for example, tetrahydrofuran, 1,4-dioxane or diisopropyl ether, a ketone, for example, methyl ethyl ketone or methyl isobutyl ketone, an ester solvent, for example, ethyl acetate, an amide solvent, for example, dimethylformamide or dimethylacetamide, or a solvent dissolving the resist composition of the invention as described hereinafter, for example, propylene glycol monomethyl ether acetate, propylene glycol monomethyl ether or cyclohexanone. It is preferable to conduct the polymerization using the solvent same as that used in the resist composition of the invention. This makes it possible to restrain the generation of particles during preservation of the resist composition.

The polymerization reaction is preferably conducted under inert gas atmosphere, for example, nitrogen or argon. The polymerization is initiated using a commercially available radical initiator (for example, an azo initiator or a peroxide) as the polymerization initiator. As the radical initiator, an azo initiator is preferable and an azo initiator having an ester group, a cyano group or a carboxyl group is more preferable. Examples of the preferable initiator includes azobisisobutyronitrile, azobisdimethylvaleronitrile and dimethyl 2,2'-azobis(2-methylpropionate). The initiator is further added or added in a divided manner, if desired. After the completion of the reaction, the desired polymer is recovered, for example, by pouring the reaction mixture into a solvent to collect the resulting powder or solid. The concentration of the solute in the reaction solution is ordinarily from 5 to 50% by weight, preferably from 10 to 30% by weight. The reaction temperature is ordinarily from 10 to 150° C., preferably from 30 to 120° C., more preferably from 60 to 100° C.

The purification can be performed using the method for the resin (HR) described above. Specifically, a conventional method, for instance, a purification method in the liquid state, for example, a liquid-liquid extraction method of removing the remaining monomer and oligomer component by washing with water or a combination of proper solvents or an ultrafiltration method of removing only substances having a specific molecular weight or less, or a purification method in the solid state, for example, a reprecipitation method of removing the remaining monomer or the like by adding dropwise the resin solution to a poor solvent to coagulate the resin in the poor solvent or a washing method of the resin slurry separated by filtration with a poor solvent can be employed.

The weight average molecular weight of the acid-decomposable resin according to the invention measured by a GPC method and calculated in terms of polystyrene is preferably from 1,000 to 200,000, more preferably from 3,000 to 20,000, most preferably from 5,000 to 15,000. By controlling the weight average molecular weight in the range of 1,000 to 200,000, degradation of the heat resistance and dry etching resistance can be prevented and also degradation of the developing property and degradation of the film-forming property due to increase of the viscosity can be prevented.

The dispersity (molecular weight distribution) of the acid-decomposable resin is ordinarily in a range from 1 to 5, preferably from 1 to 3, more preferably from 1.2 to 3.0, particularly preferably from 1.2 to 2.0. As the dispersity is small, the resolution and resist profile are excellent and the sidewall of resist pattern is smooth so that the roughness is excellent.

The content of the whole resin in the positive resist composition of the invention is preferably from 50 to 99.9% by weight, more preferably from 60 to 99.0% by weight, based on the total solid content of the resist composition.

The resins may be used individually or in combination of two or more thereof.

It is preferred that the alicyclic hydrocarbon-type acid-decomposable resin according to the invention contains neither a fluorine atom nor a silicon atom from the standpoint of the compatibility with the resin (HR).

(B) Compound which generates acid upon irradiation of actinic ray or radiation

The positive resist composition of the invention contains a compound (hereinafter also referred to as a "photoacid generator" or "component (B)") which generates an acid upon irradiation of an actinic ray or radiation.

The photoacid generator can be appropriately selected to use from photoinitiators for photo-cationic polymerization, photoinitiators for photo-radical polymerization, photo-achromatic agents for dyes, photo-discoloring agents, known compounds generating an acid upon irradiation of an actinic ray or radiation used for a microresist and mixtures thereof.

Examples of the photoacid generator include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, polymer compounds in which a group or compound generating an acid upon irradiation of an actinic ray or radiation is introduced into the main chain or side chain thereof, for example, compounds described, for example, in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 may be used.

Further, compounds generating an acid by light described, for example, in U.S. Pat. No. 3,779,778 and European Patent 126,712 may be used.

Preferable examples of the compound generating an acid upon irradiation of an actinic ray or radiation include compounds represented by the following formulae (ZI), (ZII) and (ZIII).

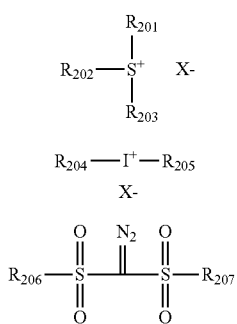

In formula (ZI), $R_{201}$, $R_{202}$ and $R_{203}$ each independently represents an organic group.

$X^-$ represents a non-nucleophilic anion, preferably, for example, a sulfonic acid anion, a carboxylic acid anion, a bis(alkylsulfonyl)amido anion, a tris(alkylsulfonyl)methide anion, $BF_4^-$, $PF_6^-$ or $SbF_6^-$, more preferably an organic anion containing a carbon atom.

Examples of the preferable organic anion include organic anions represented by the following formulae:

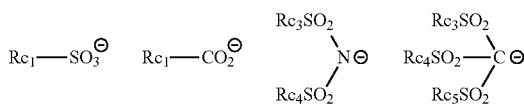

In the formulae, $Rc_1$ represents an organic group. The organic group represented by $Rc_1$ includes an organic group having from 1 to 30 carbon atoms, preferably an alkyl group which may be substituted, an aryl group which may be substituted and groups wherein two or more of the alkyl group and aryl group are connected with a single bond or a connecting group, for example, —O—, —CO$_2$—, —S—, —SO$_3$— or —SO$_2$N(Rd$_1$)- (wherein Rd$_1$ represents a hydrogen atom or an alkyl group).

$Rc_3$, $Rc_4$ and $Rc_5$ reach independently represents an organic group. The organic group represented by any one of $Rc_3$, $Rc_4$ and $Rc_5$ preferably includes the preferable organic groups illustrated for $Rc_1$, and is most preferably a perfluoroalkyl group having from 1 to 4 carbon atoms.

$Rc_3$ and $Rc_4$ may be combined with each other to form a ring. The group formed by combining $Rc_3$ and $Rc_4$ includes an alkylene group, an arylene group, and is preferably a perfluoroalkylene group having from 1 to 4 carbon atoms.

Particularly preferable organic group for $Rc_1$, $Rc_3$, $Rc_4$ or $Rc_5$ is an alkyl group in which the 1-position is substituted with a fluorine atom or a fluoroalkyl group or a phenyl group substituted with a fluorine atom or a fluoroalkyl group. The introduction of a fluorine atom or a fluoroalkyl group increases an acidity of an acid generated by light irradiation to improve sensitivity. Also, the formation of a ring by combining $Rc_3$ and $Rc_4$ increases an acidity of an acid generated by light irradiation to improve sensitivity.

The number of carbon atoms included in the organic group represented by any one of $R_{201}$, $R_{202}$ and $R_{203}$ is ordinarily from 1 to 30, preferably from 1 to 20.

Alternatively, two of $R_{201}$ to $R_{203}$ may be combined with each other to from a ring structure, and the ring structure may include an oxygen atom, a sulfur atom, an ester bond, an amido bond or a carbonyl group. The group formed by combining two of $R_{201}$ to $R_{203}$ includes an alkylene group (for example, a butylene group or a pentylene group).

Specific examples of the organic group represented by any one of $R_{201}$, $R_{202}$ and $R_{203}$ include the corresponding groups in Compounds (ZI-1), (ZI-2) and (ZI-3) described below.

Compounds having two or more of the structures represented by formula (ZI) may also be used. For example, a compound having a structure in which at least one of $R_{201}$ to $R_{203}$ in one compound represented by formula (ZI) is connected to at least one of $R_{201}$ to $R_{203}$ in another compound represented by formula (ZI).

As more preferable compounds of the compounds represented by formula (ZI), Compounds (ZI-1), (ZI-2) and (ZI-3) described below are exemplified.

Compound (ZI-1) is an arylsulfonium compound wherein at least one of $R_{201}$ to $R_{203}$ in formula (ZI) is an aryl group, that is, a compound including an arylsulfonium as a cation.

In the arylsulfonium compound, all of $R_{201}$ to $R_{203}$ may be aryl groups, or a part of $R_{201}$ to $R_{203}$ may be an aryl group and the remainder may be an alkyl group or a cycloalkyl group.

Examples of the arylsulfonium compound include triarylsulfonium compounds, diarylalkylsulfonium compounds, aryldialkylsulfonium compounds, diarylcycloalkylsulfonium compounds and aryldicycloalkylsulfonium compounds.

As the aryl group in the arylsulfonium compound, an aryl group, for example, a phenyl group or a naphthyl group or a heteroaryl group, for example, an indole residue or a pyrrole residue is preferable, and a phenyl group or an indole residue is more preferable. When the arylsulfonium compound includes two or more aryl groups, the two or more aryl groups may be the same or different from each other.

The alkyl group, which is included in the arylsulfonium compound, if desired, is preferably a straight-chain or branched alkyl group having from 1 to 15 carbon atoms and includes, for example, a methyl group, an ethyl group, a propyl group, a n-butyl group, a sec-butyl group and a tert-butyl group.

The cycloalkyl group, which is included in the arylsulfonium compound, if desired, is preferably a cycloalkyl group having from 3 to 15 carbon atoms and includes, for example, a cyclopropyl group, a cyclobutyl group and a cyclohexyl group.

The aryl group, alkyl group or cycloalkyl group represented by any one of $R_{201}$ to $R_{203}$ may have as a substituent, for example, an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxy group or a phenylthio group. Preferable examples of the substituent include a straight-chain or branched alkyl group having from 1 to 12 carbon atoms, a cycloalkyl group having from 3 to 12 carbon atoms and a straight-chain or branched alkoxy group having from 1 to 12 carbon atoms. An alkyl group having from 1 to 4 carbon atoms and an alkoxy group having from 1 to 4 carbon atoms are particularly preferred. The substituent may be substituted on any one of $R_{201}$ to $R_{203}$ or the substituents may be substituted on all of $R_{201}$ to $R_{203}$. When any one of $R_{201}$ to $R_{203}$ represents an aryl group, the substituent is preferably substituted on the p-position of the aryl group.

Now, Compound (ZI-2) is described below.

Compound (ZI-2) is a compound wherein $R_{201}$ to $R_{203}$ in formula (ZI) each independently represents an organic group which does not include an aromatic ring. The term "aromatic ring" as used herein also includes an aromatic ring containing a hetero atom.

The organic group which does not include an aromatic ring represented by any one of $R_{201}$ to $R_{203}$ has ordinarily from 1 to 30 carbon atoms, preferably from 1 to 20 carbon atoms.

$R_{201}$ to $R_{203}$ each independently preferably represents an alkyl group, a cycloalkyl group, an allyl group or a vinyl group, more preferably a straight-chain, branched or cyclic 2-oxoalkyl group or an alkoxycarbonylmethyl group, particularly preferably a straight-chain or branched 2-oxoalkyl group.

The alkyl group represented by any one of $R_{201}$ to $R_{203}$ may be straight chain or branched and preferably includes a straight-chain or branched alkyl group having from 1 to 10 carbon atoms (for example, a methyl group, an ethyl group, a propyl group, a butyl group or a pentyl group). The alkyl group represented by any one of $R_{201}$ to $R_{203}$ is preferably a straight-chain or branched 2-oxoalkyl group or an alkoxycarbonylmethyl group.

The cycloalkyl group represented by any one of $R_{201}$ to $R_{203}$ preferably includes a cycloalkyl group having from 3 to 10 carbon atoms (for example, a cyclopentyl group, a cyclohexyl group or a norbornyl group). The cycloalkyl group represented by any one of $R_{201}$ to $R_{203}$ is preferably a cyclic 2-oxoalkyl group.

The straight-chain, branched and cyclic 2-oxoalkyl group represented by any one of $R_{201}$ to $R_{203}$ preferably includes a 2-oxoalkyl group in which >C=O is present at the 2-position of each of the above-described alkyl group and cycloalkyl group.

The alkoxy group of the alkoxycarbonylmethyl group represented by any one of $R_{201}$ to $R_{203}$ preferably includes an alkoxy group having from 1 to 5 carbon atoms (for example, a methoxy group, an ethoxy group, a propoxy group, a butoxy group or a pentoxy group).

The group represented by any one of $R_{201}$ to $R_{203}$ may be further substituted with a halogen atom, an alkoxy group (for example, an alkoxy group having from 1 to 5 carbon atoms), a hydroxy group, a cyano group or a nitro group.

Compound (ZI-3) is a compound represented by formula (ZI-3) shown below, and a compound containing a phenacylsulfonium salt structure.

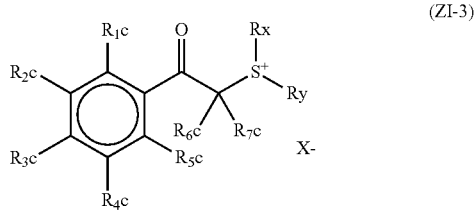

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R^x$ and $R^y$ each independently represents an alkyl group, a cycloalkyl group, an allyl group or a vinyl group.

Any two or more of $R_{1c}$ to $R_{7c}$ or $R_x$ and $R_y$ may be combined with each other to form a ring structure, and the ring structure may include an oxygen atom, a sulfur atom, an ester bond or an amido bond. A group formed by combining with any two or more of $R_{1c}$ to $R_{7c}$ or $R_x$ and $R_y$ includes, for example, a butylene group or a pentylene group.

$X^-$ represents a non-nucleophilic anion, and has the same meaning as the non-nucleophilic anion represented by $X^-$ in formula (ZI).

The alkyl group represented by any one of $R_{1c}$ to $R_{7c}$ includes a straight-chain or branched alkyl group having from 1 to 20 carbon atoms, preferably a straight-chain or branched alkyl group having from 1 to 12 carbon atoms (for example, a methyl group, an ethyl group, a straight-chain or branched propyl group, a straight-chain or branched butyl group or a straight-chain or branched pentyl group).

The cycloalkyl group represented by any one of $R_{1c}$ to $R_{7c}$ preferably includes a cyclic alkyl group having from 3 to 8 carbon atoms (for example, a cyclopentyl group or a cyclohexyl group).

The alkoxy group represented by any one of $R_{1c}$ to $R_{5c}$ may be any one of a straight-chain, branched and cyclic alkoxy groups, and includes, for example, an alkoxy group having from 1 to 10 carbon atoms, preferably a straight-chain or branched alkoxy group having from 1 to 5 carbon atoms (for example, a methoxy group, an ethoxy group, a straight-chain or branched propoxy group, a straight-chain or branched butoxy group or a straight-chain or branched pentoxy group) and a cyclic alkoxy group having from 3 to 8 carbon atoms (for example, a cyclopentyloxy group or a cyclohexyloxy group).

Preferably, any one of $R_{1c}$ to $R_{5c}$ represents a straight-chain or branched alkyl group, a cycloalkyl group or a straight-chain, branched or cyclic alkoxy group, more preferably, the total number of carbon atoms included in $R_{1c}$ to $R_{5c}$ is from 2 to 15. This makes it possible to improve solubility in a solvent, whereby the generation of particles during preservation of the resist composition is restrained.

The alkyl group for any one of $R_x$ and $R_y$ is same as the alkyl group for any one of $R_{1c}$ to $R_{7c}$. The alkyl group for any one of $R_x$ and $R_y$ preferably includes a straight-chain or branched 2-oxoalkyl group and an alkoxycarbonylmethyl group.

The cycloalkyl group for any one of $R_x$ and $R_y$ is same as the cycloalkyl group for any one of $R_{1c}$ to $R_{7c}$. The cycloalkyl group for any one of $R_x$ and $R_y$ preferably includes a cyclic 2-oxoalkyl group.

Examples of the straight-chain, branched or cyclic 2-oxoalkyl group include those having >C=O at the 2-position of the alkyl group or cycloalkyl group for any one of $R_{1c}$ to $R_{7c}$.

The alkoxy group of the alkoxycarbonylmethyl group is same as the alkoxy group for any one of $R_{1c}$ to $R_{5c}$.

$R_x$ and $R_y$ each preferably represents an alkyl group having 4 or more carbon atoms, more preferably an alkyl group having 6 or more carbon atoms, still more preferably an alkyl group having 8 ox more carbon atoms.

In formulae (ZII) and (ZIII), $R_{204}$ to $R_{207}$ each independently represents an aryl group, an alkyl group or a cycloalkyl group.

The aryl group represented by any one of $R_{204}$ to $R_{207}$ is preferably a phenyl group or a naphthyl group, more preferably a phenyl group.

The alkyl group represented by any one of $R_{204}$ to $R_{207}$ may be straight chain or branched and preferably includes a straight-chain or branched alkyl group having from 1 to 10 carbon atoms (for example, a methyl group, an ethyl group, a propyl group, a butyl group or a pentyl group).

The cycloalkyl group represented by any one of $R_{204}$ to $R_{207}$ preferably includes a cyclic alkyl group having from 3 to 10 carbon atoms (for example, a cyclopentyl group, a cyclohexyl group or a norbornyl group).

The group represented by any one of $R_{204}$ to $R_{207}$ may have a substituent. The substituent which the group represented by any one of $R_{204}$ to $R_{207}$ may have includes, for example, an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxy group and a phenylthio group.

$X^-$ represents a non-nucleophilic anion, and has the same meaning as the non-nucleophilic anion represented by $X^-$ in formula (ZI).

Preferable examples of the compound which generates an acid upon irradiation of an actinic ray or radiation further include compounds represented by the following formulae (ZIV), (ZV) and (ZVI):

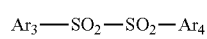

ZIV

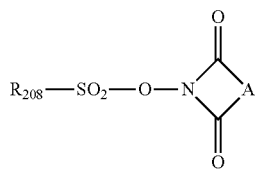

ZV

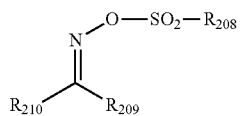

ZVI

In formulae (ZIV) to (ZVI), $Ar_3$ and $Ar_4$ each independently represents an aryl group. $R_{208}$ represents an alkyl group or an aryl group. $R_{209}$ and $R_{210}$ each independently represents an alkyl group, an aryl group or an electron-withdrawing group. $R_{209}$ is preferably an aryl group. $R_{210}$ is preferably an electron-withdrawing group, more preferably a cyano group or a fluoroalkyl group. A represents an alkylene group, an alkenylene group or an arylene group.

Of the compounds which generate an acid upon irradiation of an actinic ray or radiation, the compounds represented by formulae (ZI) to (ZIII) are preferable.

The compound (B) is preferably a compound which generates an aliphatic sulfonic acid having a fluorine atom or a benzenesulfonic acid having a fluorine atom upon irradiation of an actinic ray or radiation.

The compound (B) preferably has a triphenylsulfonium structure.

The compound (B) is preferably a triphenylsulfonium salt compound including an alkyl group or cycloalkyl group which is not substituted with a fluorine atom in the cation portion thereof.

Particularly preferable examples of the compound which generates an acid upon irradiation of an actinic ray or radiation are specifically set forth below, but the invention should not be construed as being limited thereto.

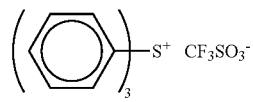

(z1)

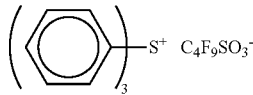

(z2)

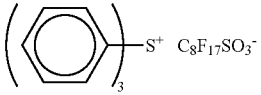

(z3)

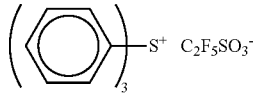

(z4)

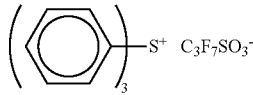

(z5)

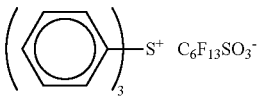

(z6)

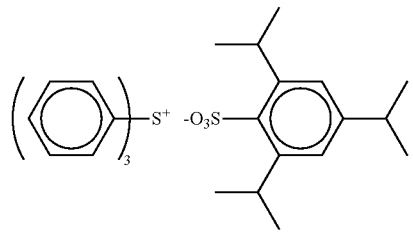

(z7)

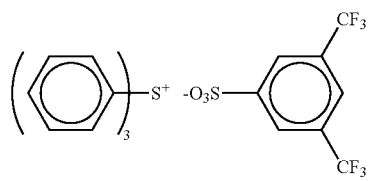

(z8)

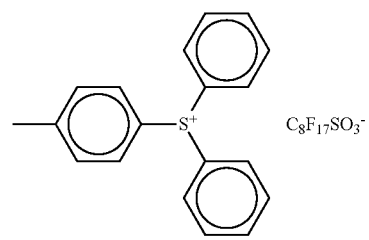

(z9)

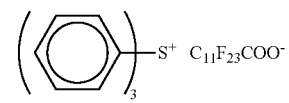

(z10)

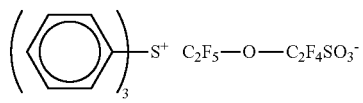

(z11)

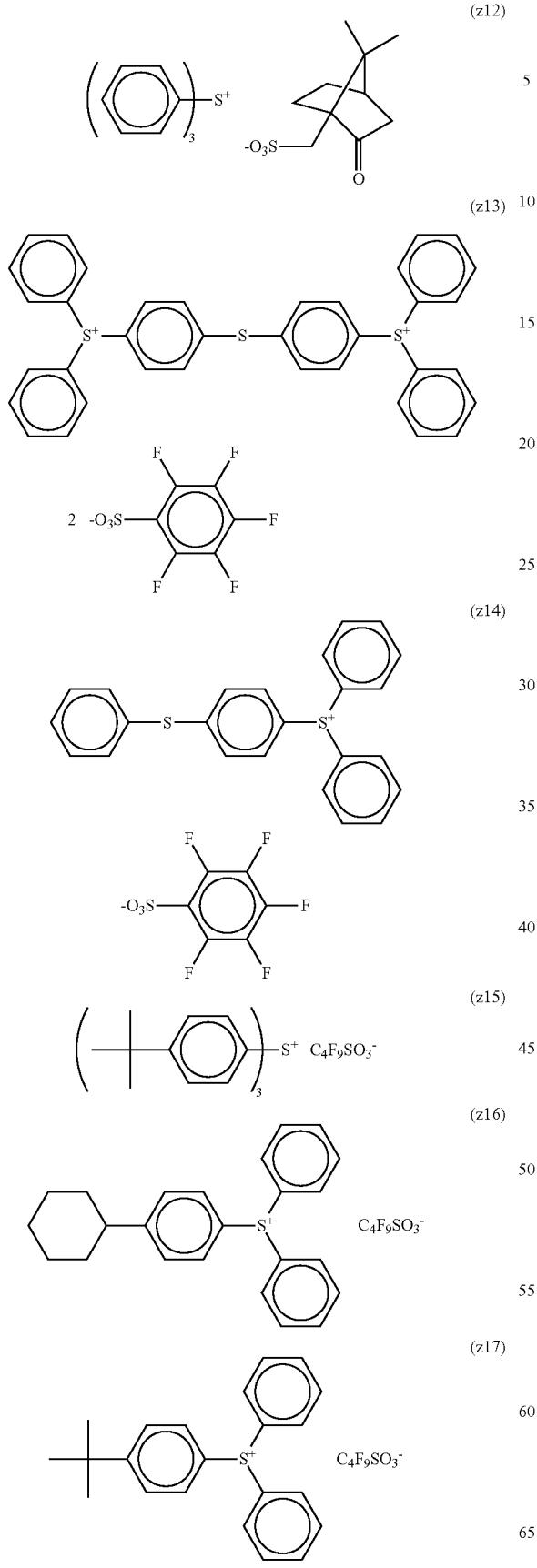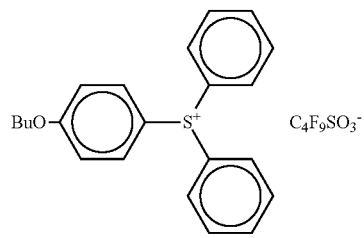

-continued
(z26) 
C₄F₉SO₃⁻
(z27) 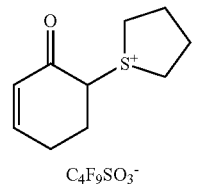
C₄F₉SO₃⁻
(z28) 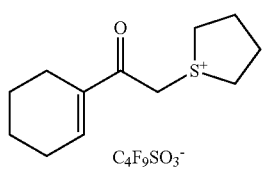
C₄F₉SO₃⁻
(z29) 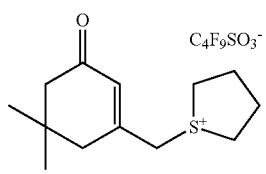
C₄F₉SO₃⁻
(z30) 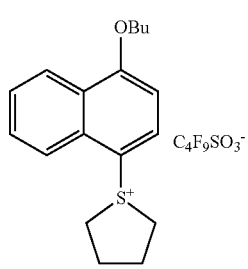
C₄F₉SO₃⁻
(z31) 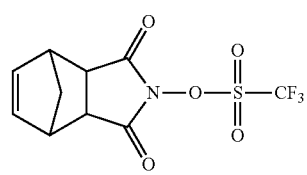
(z32) 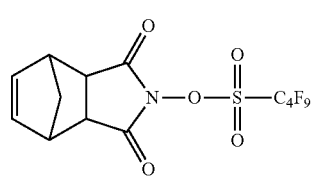
(z33) 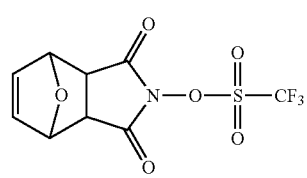
-continued
(z34) 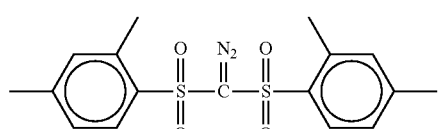
(z35) 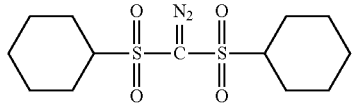
(z36) 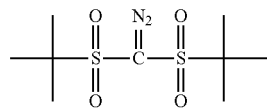
(z37) 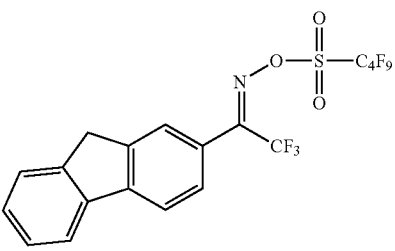
(z38) 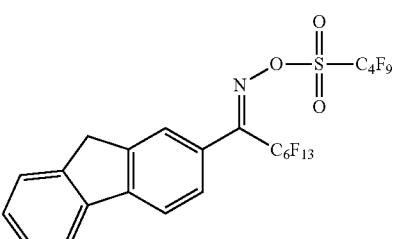
(z39) 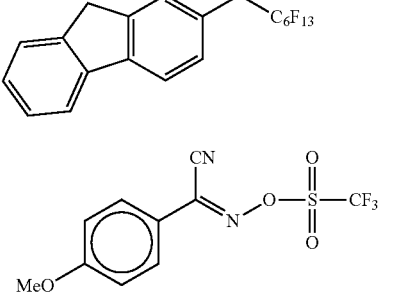
(z40) 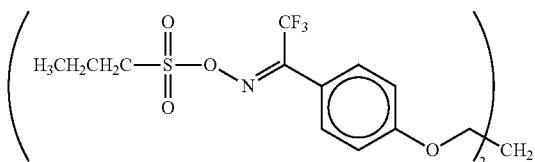
(z41) 
CF₃SO₃⁻
(z42) 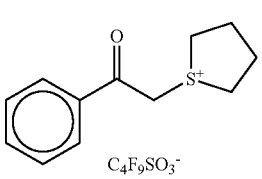
C₄F₉SO₃⁻

-continued
(z43)
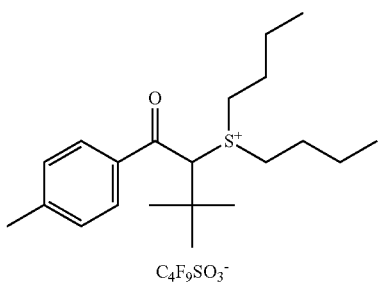
(z44)
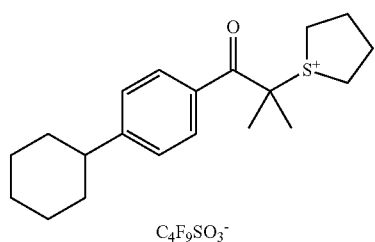
(z45)
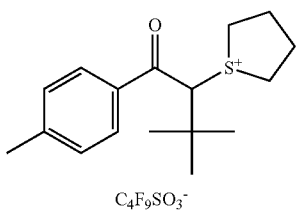
(z46)
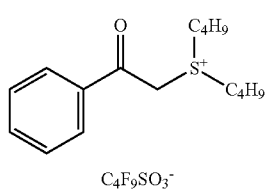
(z47)
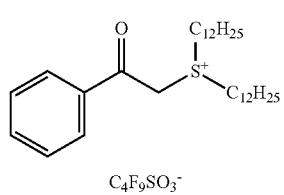
(z48)
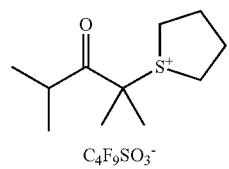
(z49)
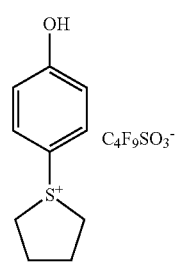
-continued
(z50)
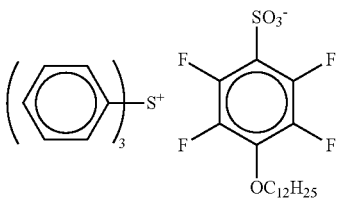
(z51)
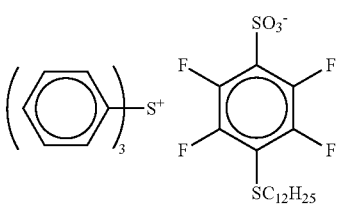
(z52)
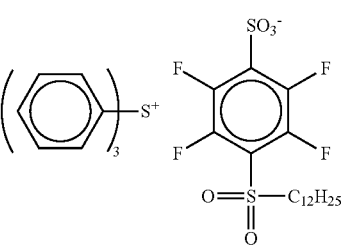
(z53)
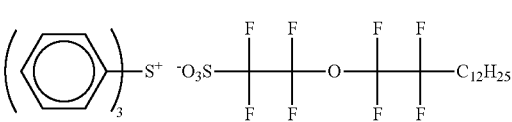
(z54)
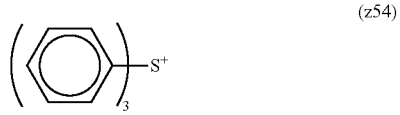
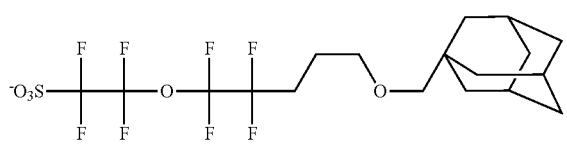
(z55)
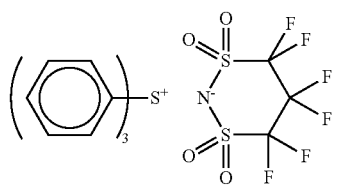
(z56)
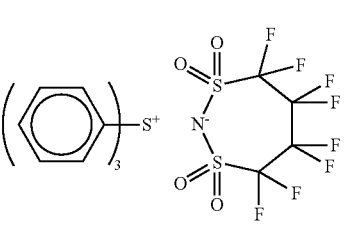

-continued
(z57)
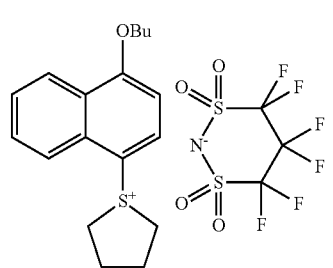
(z58)
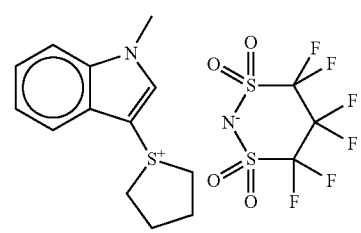
(z59)
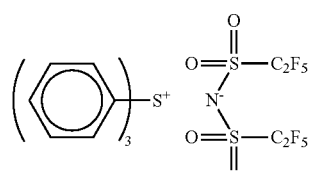
(z60)
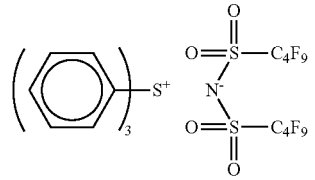
(z61)
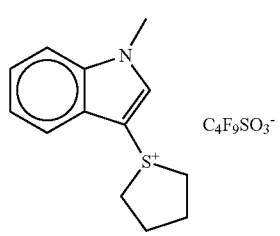
(z62)
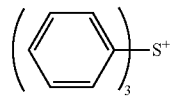
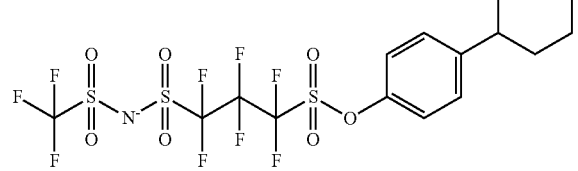
(z63)
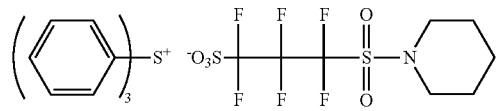
-continued
(z64)
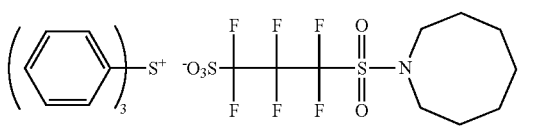
(z65)
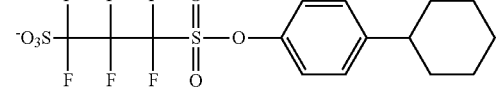
(z66)
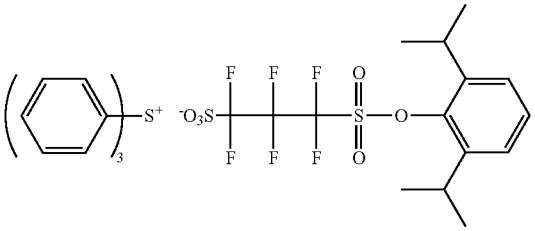
(z67)
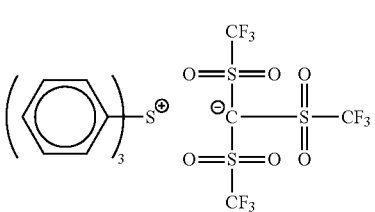
(z68)
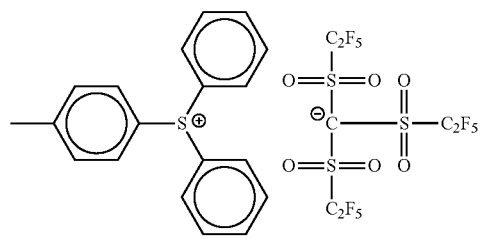
(z69)
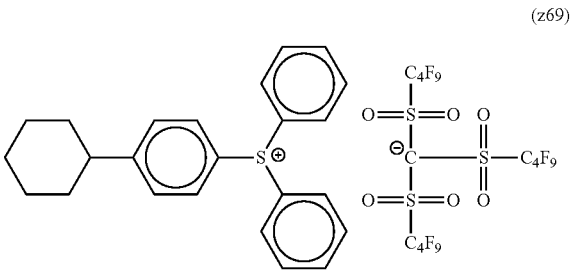
(z70)
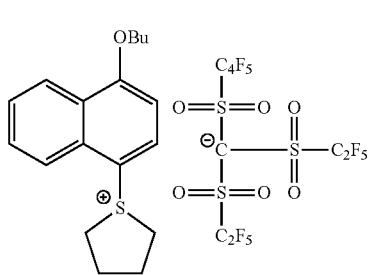

(z71) 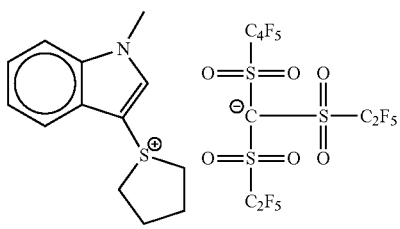

(z72) 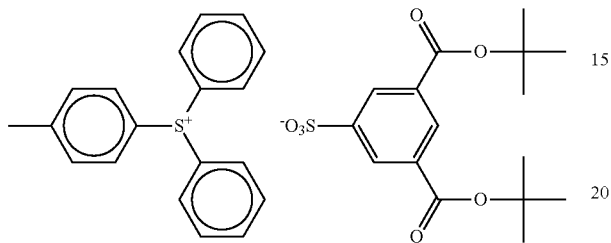

(z73) 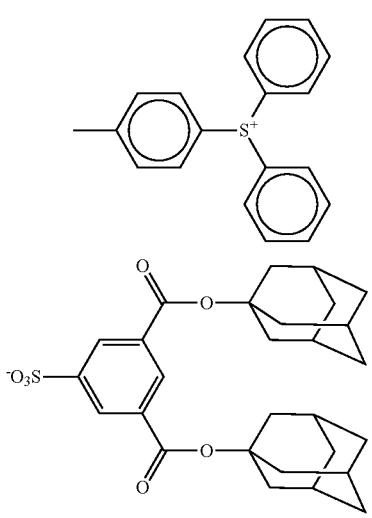

(z74) 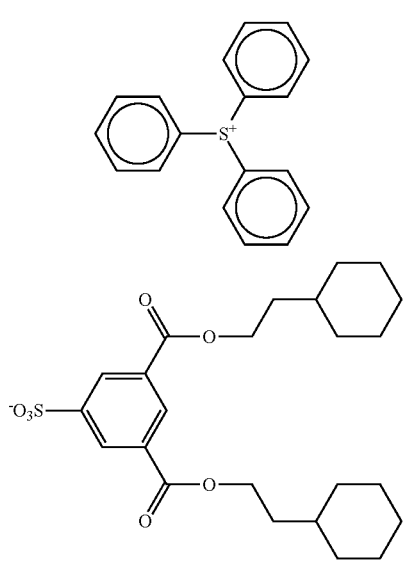

(z75) 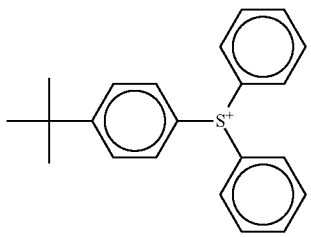

(z76) 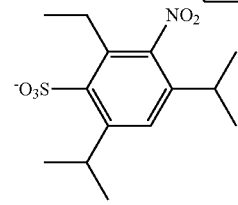

(z77) 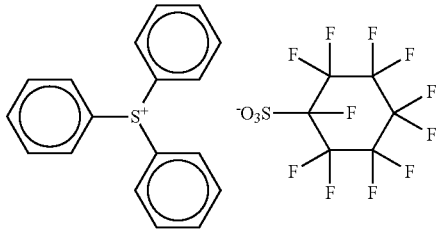

(z78) 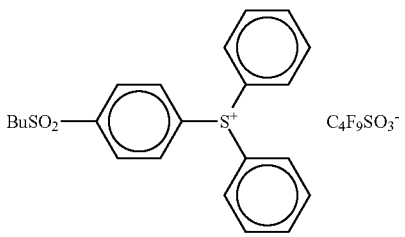

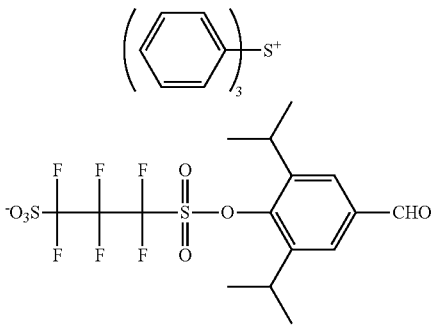

The photoacid generators may be used individually or in combination of two or more thereof. In the case of using two or more acid generators in combination, it is preferred that compounds which generate two kinds of organic acids that are different from each other by two or more in the total number of atoms exclusive of hydrogen atom included are combined.

The content of the photoacid generator is preferably from 0.1 to 20% by weight, more preferably from 0.5 to 10% by weight, still more preferably from 1 to 7% by weight, based on the total solid content of the positive resist composition.

(D) Solvent

The solvent which can be used for dissolving each component described above to prepare a positive resist composition includes, for example, an alkylene glycol monoalkyl ether carboxylate, an alkylene glycol monoalkyl ether, an alkyl lactate, an alkyl alkoxypropionate, a cyclic lactone having from 4 to 10 carbon atoms, a monoketone compound having from 4 to 10 carbon atoms which may contain a ring, an alkylene carbonate, an alkyl alkoxyacetate and an alkyl pyruvate.

The alkylene glycol monoalkyl ether carboxylate preferably includes, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

The alkylene glycol monoalkyl ether preferably includes, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

The alkyl lactate preferably includes, for example, methyl lactate, ethyl lactate, propyl lactate and butyl lactate.

The alkyl alkoxypropionate preferably includes, for example, ethyl 3-ethoxypropionate, methyl 3-methoxypropionate, methyl 3-ethoxypropionate and ethyl 3-methoxypropionate.

The cyclic lactone having from 4 to 10 carbon atoms preferably includes, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

The monoketone compound having from 4 to 10 carbon atoms which may contain a ring preferably includes, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonane, 5-nonane, 2-decanone, 3-decanone, 4-decanone, S-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

The alkylene carbonate preferably includes, for example, propylene carbonate, vinylene carbonate, ethylene carbonate and butylene carbonate.

The alkyl alkoxyacetate preferably includes, for example, 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

The alkyl pyruvate preferably includes, for example, methyl pyruvate, ethyl pyruvate and propyl pyruvate.

The solvent preferably used includes a solvent having a boiling point of 130° C. or more at normal temperature and normal pressure. Specifically, cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate are exemplified.

The solvents may be used individually or in combination of two or more thereof.

In the invention, a mixed solvent comprising a solvent containing a hydroxyl group in its structure and a solvent not containing a hydroxyl group in its structure may be used as the organic solvent.

As the solvent containing a hydroxyl group, for example, ethylene glycol, ethylene glycol monomethyl ether, ethylene glycol monoethyl ether, propylene glycol, propylene glycol monomethyl ether, propylene glycol monoethyl ether and ethyl lactate are exemplified. Of these solvents, propylene glycol monomethyl ether and ethyl lactate are particularly preferred.

As the solvent not containing a hydroxyl group, for example, propylene glycol monomethyl ether acetate, ethylethoxy propionate, 2-heptanone, γ-butyrolactone, cyclohexanone, butyl acetate, N-methylpyrrolidone, N,N-dimethylacetamide and dimethyl sulfoxide are exemplified. Of these solvents, propylene glycol monomethyl ether acetate, ethylethoxy propionate, 2-heptanone, γ-butyrolactone, cyclohexanone and butyl acetate are particularly preferred, and propylene glycol monomethyl ether acetate, ethylethoxy propionate and 2-heptanone are most preferred.

The mixing ratio (by weight) of the solvent containing a hydroxyl group and the solvent not containing a hydroxyl group is from 1/99 to 99/1, preferably from 10/90 to 90/10, more preferably from 20/80 to 60/40. A mixed solvent comprising 50% by weight or more of the solvent not containing a hydroxyl group is particularly preferred from the stand point of uniformity of coating.

The solvent is preferably a mixed solvent comprising two or more solvents including propylene glycol monomethyl ether acetate.

(E) Basic Compound

The positive resist composition of the invention preferably contains a basic compound (E) for the purpose of reducing fluctuations in performances occurred with the passage of time from exposure to heating.

The basic compound preferably includes compounds having a structure represented by any one of formulae (A) to (E) shown below.

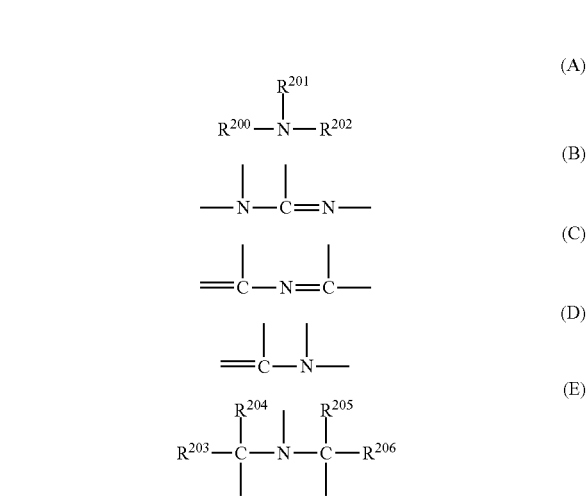

In formulae (A) to (E), $R^{200}$, $R^{201}$ and $R^{202}$, which may be the same or different, each represents a hydrogen atom, an alkyl group (preferably an alkyl group having from 1 to 20 carbon atoms), a cycloalkyl group (preferably a cycloalkyl group having from 3 to 20 carbon atoms) or an aryl group (preferably an aryl group having from 6 to 20 carbon atoms), or $R^{201}$ and $R^{202}$ may be combined with each other to form a ring.

In the alkyl groups, as an alkyl group having a substituent, an aminoalkyl group having from 1 to 20 carbon atoms, a hydroxyalkyl group having from 1 to 20 carbon atoms or a cyanoalkyl group having from 1 to 20 carbon atoms is preferred.

$R^{203}$, $R^{204}$, $R^{205}$ and $R^{206}$, which may be the same or different, each represents an alkyl group having from 1 to 20 carbon atoms.

The alkyl groups included in formulae (A) to (E) are preferably unsubstituted alkyl groups.

Preferable examples of the basic compound include a guanidine, an aminopyrrolidine, a pyrazole, a pyrazoline, a piperazine, an aminomorpholine, an aminoalkylmorpholine and a piperidine. More preferable examples of the basic compound include compounds having an imidazole structure, a diazabicyclo structure, an onium hydroxide structure, an onium carboxylate structure, a trialkylamine structure, an aniline structure or a pyridine structure, an alkylamine derivative having a hydroxy group and/or an ether bond, and an aniline derivative having a hydroxy group and/or an ether bond.

The compound having an imidazole structure includes, for example, imidazole, 2,4,5-triphenylimidazole and benzimidazole. The compound having a diazabicyclo structure includes, for example, 1,4-diazabicyclo[2,2,2]octane, 1,5-diazabicyclo[4,3,0]non-5-ene and 1,8-diazabicyclo[5,4,0]undec-7-ene. The compound having an onium hydroxide structure includes, for example, a triarylsulfonium hydroxide, phenacyl sulfonium hydroxide and a 2-oxoalkyl group-containing sulfonium hydroxide, specifically, triphenylsulfonium hydroxide, tris(tert-butylphenyl)sulfonium hydroxide, bis(tert-butylphenyl) iodonium hydroxide, phenacyl thiophenium hydroxide or 2-oxopropyl thiophenium hydroxide. The compound having an onium carboxylate structure includes, for example, a compound wherein an anion portion of the compound having an onium hydroxide structure is replaced by a carboxylate, e.g., acetate, adamantane-1-carboxylate or a perfluoroalkyl carboxylate. The compound having a trialkylamine structure includes, for example, tri(n-butyl) amine and tri(n-octyl)amine.

The compound having an aniline structure includes, for example, 2,6-diisopropylaniline, N,N-dimethylaniline, N,N-dibutylaniline and N,N-dihexylaniline. The alkylamine derivative having a hydroxy group and/or an ether bond includes, for example, ethanolamine, diethanolamine, triethanolamine and tris(methoxyethoxyethyl)amine. The aniline derivative having a hydroxy group and/or an ether bond includes, for example, N,N-bis(hydroxyethyl)aniline.

Further, at least one nitrogen-containing compound selected from an amine compound having a phenoxy group, an ammonium salt compound having a phenoxy group, an amine compound having a sulfonic acid ester group and an ammonium salt compound having a sulfonic acid ester group is exemplified as the basic compound.

The amine compound includes primary, secondary and tertiary amine compounds and is preferably an amine compound in which at least one alkyl group is connected to the nitrogen atom. The amine compound is more preferably a tertiary amine compound. The amine compound may have a cycloalkyl group (preferably a cycloalkyl group having from 3 to 20 carbon atoms) or an aryl group (preferably an aryl group having from 6 to 12 carbon atoms) connected to the nitrogen atom in addition to the alkyl group as long as at least one alkyl group (preferably an alkyl group having from 1 to 20 carbon atoms) is connected to the nitrogen atom. The amine compound preferably contains an oxygen atom in the alkyl chain to form an oxyalkylene group. The number of the oxyalkylene group is one or more, preferably from 3 to 9, more preferably from 4 to 6, in the molecule. Of the oxyalkylene group, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable.

The ammonium salt compound includes primary, secondary, tertiary and quaternary ammonium salt compounds and is preferably an ammonium salt compound in which at least one alkyl group is connected to the nitrogen atom. The ammonium salt compound may have a cycloalkyl group (preferably a cycloalkyl group having from 3 to 20 carbon atoms) or an aryl group (preferably an aryl group having from 6 to 12 carbon atoms) connected to the nitrogen atom in addition to the alkyl group as long as at least one alkyl group (preferably an alkyl group having from 1 to 20 carbon atoms) is connected to the nitrogen atom. The ammonium salt compound preferably contains an oxygen atom in the alkyl chain to form an oxyalkylene group. The number of the oxyalkylene group is one or more, preferably from 3 to 9, more preferably from 4 to 6, in the molecule. Of the oxyalkylene group, an oxyethylene group ($-CH_2CH_2O-$) or an oxypropylene group ($-CH(CH_3)CH_2O-$ or $-CH_2CH_2CH_2O-$) is preferable, and an oxyethylene group is more preferable. As the anion of the ammonium salt compound, for example, a halogen atom, a sulfonate, a borate or a phosphonate is exemplified and among them, a halogen atom or a sulfonate is preferable. The halogen atom is particularly preferably chloride, bromide or iodide. The sulfonate is particularly preferably an organic sulfonate having from 1 to 20 carbon atoms. The organic sulfonate includes an alkyl sulfonate having from 1 to 20 carbon atoms or an aryl sulfonate. The alkyl group of the alkyl sulfonate may have a substituent, and examples of the substituent include a fluorine atom, a chlorine atom, a bromine atom, an alkoxy group, an acyl group and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group in the aryl sulfonate includes a benzene ring, a naphthalene ring and an anthracene ring. The benzene ring, naphthalene ring or anthracene ring may have a substituent, and examples of the substituent include a straight-chain or branched alkyl group having from 1 to 6 carbon atoms or a cycloalkyl group having from 3 to 6 carbon atoms. Specific examples of the straight-chain or branched alkyl group and the cycloalkyl group include a methyl group, an ethyl group, a n-propyl group, an isopropyl group, a n-butyl group, an isobutyl group, a tert-butyl group, a n-hexyl group and a cyclohexyl group. Other examples of the substituent include an alkoxy group having from 1 to 6 carbon atoms, a halogen atom, a cyano group, a nitro group, an acyl group and an acyloxy group.

The amine compound having a phenoxy group and ammonium salt compound having a phenoxy group are compounds wherein a phenoxy group is connected at the terminal of the alkyl group opposite to the terminal at which the nitrogen atom of the amine compound or ammonium salt compound is connected to the alkyl group, respectively. The phenoxy group may have a substituent. Examples of the substituent for the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The position of the substituent may be any of 2-position to 6-position. The number of the substituent may be any of 1 to 5.

It is preferred to contain at least one oxyalkylene group between the phenoxy group and the nitrogen atom. The number of the oxyalkylene group is one or more, preferably from 3 to 9, more preferably from 4 to 6, in the molecule. Of the oxyalkylene group, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The sulfonic acid ester group in the amine compound having a sulfonic acid ester group and an ammonium salt compound having a sulfonic acid ester group may be any of an alkyl sulfonic acid ester group, a cycloalkyl sulfonic acid ester group and an aryl sulfonic acid ester group. In the alkyl sulfonic acid ester group, the alkyl group preferably has from 1 to 20 carbon atoms. In the cycloalkyl sulfonic acid ester group, the cycloalkyl group preferably has from 3 to 20 carbon atoms. In the aryl sulfonic acid ester group, the aryl group preferably has from 6 to 12 carbon atoms. The alkyl sulfonic acid ester group, cycloalkyl sulfonic acid ester group or aryl sulfonic acid ester group may have a substituent. Preferable examples of the substituent include a halogen atom, a cyano group, a nitro group, a carboxyl group, a carboxylic acid ester group and a sulfonic acid ester group.

It is preferred to contain at least one oxyalkylene group between the sulfonic acid ester group and the nitrogen atom. The number of the oxyalkylene group is one or more, preferably from 3 to 9, more preferably from 4 to 6, in the molecule. Of the oxyalkylene group, an oxyethylene group (—CH$_2$CH$_2$O—) or an oxypropylene group (—CH(CH$_3$)CH$_2$O— or —CH$_2$CH$_2$CH$_2$O—) is preferable, and an oxyethylene group is more preferable.

The basic compounds may be used individually or in combination of two or more thereof.

The amount of the basic compound used is ordinarily from 0.001 to 10% by weight, preferably from 0.01 to 5% by weight, based on the total solid content of the positive resist composition.

The ratio of the acid generator and the basic compound in the resist composition, i.e., acid generator/basic compound (molar ratio), is preferably from 2.5 to 300. Specifically, the molar ratio is preferably 2.5 or more from the standpoint of sensitivity and resolution, and it is preferably 300 or less from the standpoint of preventing the reduction in resolution due to thickening of the resist pattern with the passage of time after exposure to heat treatment. The molar ratio of acid generator/basic compound is more preferably from 5.0 to 200, still more preferably from 7.0 to 150.

(F) Surfactant

The positive resist composition of the invention preferably contains a surfactant (F), more preferably one or more of fluorine-base and/or silicon-base surfactants (a fluorine-base surfactant, a silicon-base surfactant and a surfactant containing both a fluorine atom and a silicon atom).

By the incorporation of the surfactant (F) into the positive resist composition of the invention, the positive resist composition can provide, with favorable sensitivity and resolution, a resist pattern having good adhesion property and less development defect, when an exposure light source of 250 nm or shorter, especially 220 nm or shorter, is used.

Examples of the fluorine-base and/or silicon-base surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,8881, 5,296,330, 5,436,098, 5,576,143, 5,294,511 and 5,824,451. Commercially available surfactants as described below can also be used as they are.

Examples of the commercially available surfactant used include fluorine-base or silicon-base surfactants, for example, Eftop EF301 or EF303 (produced by Shin-Akita Kasei Co., Ltd.), Florad FC430, FC431 or FC4430 (produced by Sumitomo 3M Ltd.), Megafac F171, F173, F176, F189, F113, F110, F177, F120 and R08 (produced by Dainippon Ink and Chemicals, Inc.), Surflon S-382, SC101, SC102, SC103, SC104, SC105 and SC106 (produced by Asahi Glass Co., Ltd.), Troysol S-366 (produced by Troy Chemical Corp.) GF-300 and GF-150 (produced by Toagosei Co., Ltd.), Surflon S-393 (produced by Seimi Chemical Co., Ltd.), Eftop EF121, EF122A, EF 122B, RF122C, EF125M, EF135M, EF351, EF352, EF801, EF802 and EF601 (produced by Jemco Inc.), PF636, PF656, PF6320 and PF6520 (produced by OMNOVA Solutions, Inc.) and FTX-204D, 208G, 218G, 230G, 204D, 208D, 212D, 218D and 222D (produced by Neos Co., Ltd.). A polysiloxane polymer KP-341 (produced by Shin-Etsu Chemical Co., Ltd.) is also used as the silicon-base surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene)) acrylate and/or (poly(oxyalkylene)) methacrylate is preferable. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting) group or poly(oxyethylene-oxypropylene block connecting) group may be used. Further, the copolymer of a monomer having a fluoroaliphatic group with a (poly(oxyalkylene)) acrylate (or methacrylate) may be not only a binary copolymer but also a ternary or higher copolymer obtained by copolymerizing simultaneously two or more different monomers having a fluoroaliphatic group with two or more different (poly(oxyalkylene)) acrylates (or methacrylates).

Examples of the polymer including a fluoroaliphatic group include commercially available surfactants, for example, Megafac F178, F-470, F-473, F-475, F-476 and F-472 (produced by Dainippon Ink and Chemicals, Inc.). Also, a copolymer of acrylate (or methacrylate) having a $C_6F_{13}$ group and (poly(oxyalkylene)) acrylate (or methacrylate) and a copolymer of acrylate (or methacrylate) having a $C_3F_7$ group, (poly(oxyethylene)) acrylate (or methacrylate) and (poly(oxypropylene)) acrylate (or methacrylate) are exemplified.

A surfactant other than the fluorine-base and/or silicon-base surfactant may be used in the invention. Specific examples thereof include a nonionic surfactant, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene-polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surfactants may be used individually or in combination of two or more thereof.

The amount of the surfactant (F) used is preferably from 0.01 to 10% by weight, more preferably from 0-1 to 5% by weight, based on the total amount of the positive resist composition (exclusive of the solvent).

(G) Carboxylic Acid Onium Salt

The positive resist composition of the invention may contain a carboxylic acid onium salt (G). The carboxylic acid onium salt includes, for example, a carboxylic acid sulfonium salt, a carboxylic acid iodonium salt and a carboxylic acid ammonium salt. Particularly, as the carboxylic acid onium salt (G), iodonium salt thereof and sulfonium salt thereof are preferred. Further, it is preferred that the carboxylate residue of carboxylic acid onium salt (G) according to the invention contains neither an aromatic group nor a carbon-carbon double bond. A particularly preferable anion moiety is a straight-chain or branched, monocyclic or polycyclic alkylcarboxylic acid anion having from 1 to 30 carbon atoms, and the anion of a carboxylic acid in which a part or all of the alkyl group is substituted with fluorine atoms is more preferable. An oxygen atom may be contained in the alkyl chain. This ensures the transparency to light of 220 nm or less, increases sensitivity and resolution, and improves pitch dependency and exposure margin.

The fluorine-substituted carboxylic acid anion includes, for example, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

The carboxylic acid onium salt (G) can be synthesized by reacting a sulfonium hydroxide, iodonium hydroxide or ammonium hydroxide with a carboxylic acid in an appropriate solvent in the presence of silver oxide.

The content of the carboxylic acid onium salt (G) in the resist composition is ordinarily from 0.1 to 20% by weight, preferably from 0.5 to 10% by weight, more preferably from 1 to 7% by weight, based on the total solid of the resist composition.

(H) Other Additives

The positive resist composition of the invention may contain, if desired, other additives, for example, a dye, a plasticizer, a photosensitizer, a light-absorbing agent, an alkali-soluble resin, a dissolution inhibiting agent or a compound accelerating dissolution in a developer (for example, a phenolic compound having a molecular weight of 1,000 or less, an alicyclic or aliphatic compound having a carboxyl group).

Such a phenol compound having a molecular weight of 1,000 or less can be easily synthesized by one skilled in the art with reference to methods described, for example, in JP-A-4-122938, JP-A-2-28531, U.S. Pat. No. 4,916,210 and European Patent 219,294.

Specific examples of the alicyclic or aliphatic compound containing a carboxyl group include a carboxylic acid derivative having a steroid structure, for example, cholic acid, deoxycholic acid or lithocholic acid, an adamantanecarboxylic acid derivative, adamantanedicarboxylic acid, cyclohexanecarboxylic acid and cyclohexanedicarboxylic acid, but the invention should not be construed as being limited thereto.

[3] Pattern Forming Method

The positive resist composition of the invention is preferably used in thickness of 30 to 500 nm, more preferably in thickness of 30 to 250 nm, still more preferably in thickness of 30 to 200 nm, in view of the improvement in resolution. Such a thickness can be achieved by setting the solid content concentration of the positive resist composition in a proper range to have appropriate viscosity, thereby improving the coating property and film-forming property.

The total solid content concentration of the positive resist composition is ordinarily from 1 to 10% by weight, preferably from 1 to 8.0% by weight, more preferably from 1.0 to 6.0% by weight.

The positive resist composition of the invention is used by dissolving the above-described components in a prescribed organic solvent, preferably in the mixed solvent described above, subjecting to filtration and coating on a prescribed substrate in the following manner. The filter used in the filtration is preferably a filter made of polytetrafluoroethylene, polyethylene or nylon having a pore size of 0.1 micron or less, more preferably 0.05 microns or less, still more preferably 0.03 microns or less.

Specifically, the positive resist composition is coated on a substrate (for example, silicon/silicon dioxide coating) as used for the production of a precise integrated circuit device by an appropriate coating method, for example, spinner or coater, and dried to form a photosensitive film. A known anti-reflective coating may be previously provided on the substrate.

The photosensitive film is irradiated with an actinic ray or radiation through a prescribed mask, preferably subjected to baking (heating) and then developed and rinsed. Thus, a good pattern can be obtained.

The actinic ray or radiation for the exposure includes, for example, an infrared ray, visible light, an ultraviolet ray, a far ultraviolet ray and an X-ray, and it is preferably a far ultraviolet ray having a wavelength of 250 nm or less, more preferably 220 nm or less, particularly preferably from 1 to 200 nm. Specific examples thereof include a KrF excimer laser (248 nm), an ArF excimer laser (193 nr), an $F_2$ excimer laser (157 µm) and an X-ray. An ArF excimer laser, an $F_2$ excimer laser and EUV (13 nm) are preferable.

Prior to the formation of resist film, an anti-reflective coating may be previously provided on the substrate.

As the anti-reflective coating, any of an inorganic coating type, for example, titanium, titanium dioxide, titanium nitride, chromium oxide, carbon or amorphous silicon and an organic coating type comprising a light-absorbing agent and a polymer material can be used. Also, a commercially available organic anti-reflective coating, for example, DUV-30 Series and DUV-40 Series (produced by Brewer Science, Inc.) and AR-2, AR-3 and AR-5 (produced by Shipley Co., Ltd.) are employed as the organic anti-reflective coating.

In the development process, an alkali developer as described below is used. The alkali developer used for the resist composition of the invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A solution prepared by adding an appropriate amount of an alcohol or a surfactant to the alkali developer described above is also used.

The alkali concentration in the alkali developer is ordinarily from 0.1 to 20% by weight.

The pH of the alkali developer is ordinarily from 10.0 to 15.0.

AS the rinse solution, pure water is used. Also, pure water to which added an appropriate amount of a surfactant can be used.

Further, after development processing or rinse processing, a process to remove the developer or rinse solution on the resist pattern can be performed by a supercritical fluid.

The development processing or rinse processing may be performed by forming paddle or by a paddle-less process.

In the immersion exposure, rinse processes may be conducted before and after the exposure.

In the patterning by the immersion exposure, the exposure (immersion exposure) with an actinic ray or radiation is performed in the state of filling between the resist film and a lens with a liquid (immersion liquid) having a refractive index higher than air. This makes it possible to increase resolution. As the immersion liquid, any liquid having a refractive index higher than air can be used, and pure water is preferably used.

The immersion liquid for use in the immersion exposure is described below.

The immersion liquid preferably has a temperature coefficient of refractive index as small as possible so as to be transparent to the exposure wavelength and to minimize the distortion of optical image projected on the resist. In particular, when an ArF excimer laser (wavelength: 193 nm) is used as the exposure light source, it is preferred to use water in view of easiness of availability and good handleability, in addition to the above described standpoint.

Further, in order to increase the refractive index, a medium having the refractive index of 1.5 or more can be used. The medium may be an aqueous solution or an organic solvent.

When water is used as the immersion liquid, in order to reduce the surface tension of water and to increase the surface activity, a trace amount of an additive (liquid) which does not dissolve the resist layer on a wafer and has a negligible influence on the optical coating of the lower surface of lens element may be added. As such an additive, an aliphatic alcohol having a refractive index almost equal to the refractive index of water is preferable, and specifically methyl alcohol, ethyl alcohol and isopropyl alcohol are exemplified. The addition of an alcohol having a refractive index almost equal to that of water is advantageous, because even if the alcohol component in water is evaporated and the concentration of the content is changed, the fluctuation in the refractive index of the liquid as a whole can be made extremely small. On the other hand, when an impurity opaque to the light of 193 nm or a substance largely different from water in a refractive index are mixed, the substance brings about the distortion of the optical image projected on the resist. Accordingly, water is preferably distilled water. Alternatively, pure water filtered through an ion exchange filter may be used.

The electric resistance of water is desirably 18.3 MΩcm or less, TOC (organic substance concentration) is desirably 20 ppb or less and water is desirably subjected to deaeration treatment.

Further, by increasing the refractive index of the immersion liquid, it is possible to improve the lithographic performance. From this point of view, an additive for increasing the refractive index may be added to water or heavy water ($D_2O$) may be used in place of water.

The positive resist composition of the invention can increase the contact angle (particularly, receding contact angle) of the film surface because the resin (HR) included in the resist composition is localized on the surface. When a resist film is formed, the receding contact angle of water to the resist film is preferably 65° or more, more preferably 70° or more. When only the resin (HR) is dissolved in a solvent and coated to form a film, the receding contact angle of the film is preferably from 70° to 110°. By adjusting the amount of the resin (HR) added, the receding contact angle of resist film is controlled from 60° to 80°. The receding contact angle as used herein means that measured at normal temperature and normal pressure. The receding contact angle is a contact angle of a receding side when a droplet starts to sliding downward due to tilt of the resist film.

A resist protective layer (hereinafter also referred to as a "topcoat") may be provided between the resist film composed of the positive resist composition of the invention and the immersion liquid so as not to bring the resist film into direct contact with the immersion liquid. By the formation of topcoat, dissolution of the resist component from the resist film to the immersion liquid is prevented to achieve the effect, for example, decrease in the development defect.

The necessary functions required of the topcoat are the coating aptitude on the upper layer of the resist, the transparency to radiation, particularly the transparency to light of 193 nm, and the immersion liquid-insolubility. It is preferred that the topcoat is not mixed with the resist and can be coated uniformly on the upper layer of the resist.

From the standpoint of the transparency to light of 193 nm, a polymer not containing an aromatic ring is preferable as the topcoat. Specifically, a hydrocarbon polymer, an acrylate polymer, polymethacrylic acid, polyacrylic acid, polyvinyl ether, a silicon-containing polymer and a fluorine-containing polymer are exemplified. Taking contamination of the optical lens due to dissolution of impurity from the topcoat in the immersion liquid, it is preferred that the content of remaining monomer component of the polymer included in the topcoat is as small as possible.

For removing the topcoat, a developer may be used or a remover may be used separately. As the remover, a solvent having low penetration into the resist is preferable. In view of capability of performing removal process at the same time with the development process of the resist, it is preferred that the topcoat is removable with an alkaline developer. From the standpoint of removal by the alkaline developer, the topcoat is preferably acidic, but from the standpoint of non-intermixture with the resist, it may be neutral or alkaline.

The resolution increases when there is no difference in the refractive indexes between the topcoat and the immersion liquid. In the case where water is used as the immersion liquid in the immersion exposure by an ArF excimer laser (wavelength: 193 nm), the refractive index of the topcoat is preferably near the refractive index of water. From the standpoint that the refractive index of the topcoat is approximated to that of the immersion liquid, it is preferred that the topcoat includes a fluorine atom. Further, in view of the transparency and refractive index, the topcoat is preferably a thin film.

It is preferred that the topcoat is not mixed with the resist and further it is also not mixed with the immersion liquid. From this point of view, when the immersion liquid is water, the topcoat solvent is preferably a medium which is hardly soluble in the resist solvent and water-insoluble. When the immersion liquid is an organic solvent, the topcoat may be water-soluble or water-insoluble.

EXAMPLES

The present invention will be described in more detail with reference to the following examples, but the invention should not be construed as being limited thereto.

Specific examples of the resin (A) according to the invention are set forth below, but the invention should not be construed as being limited thereto. The composition (molar ratio of repeating units corresponding to each repeating unit in a left-to-right order), weight average molecular weight (Mw) and dispersity (Mw/Mn) of each resin are also described in the table shown below.

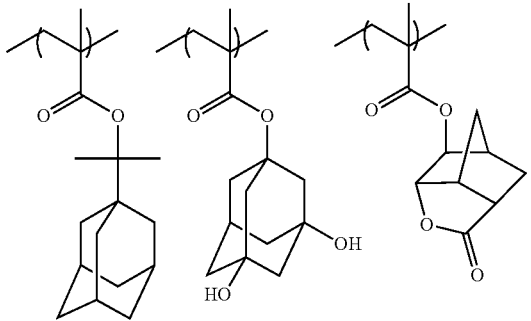
(1)

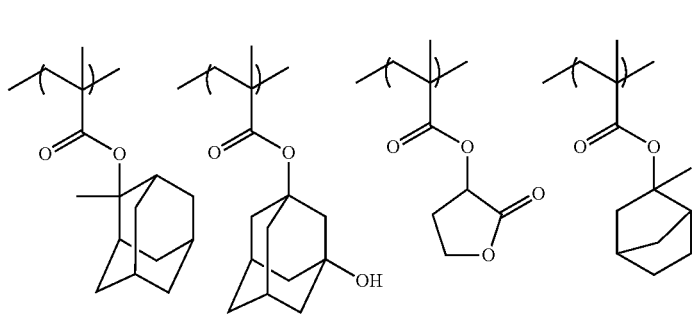
(16)

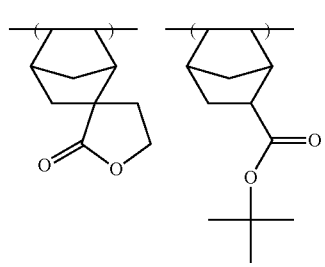
(17)

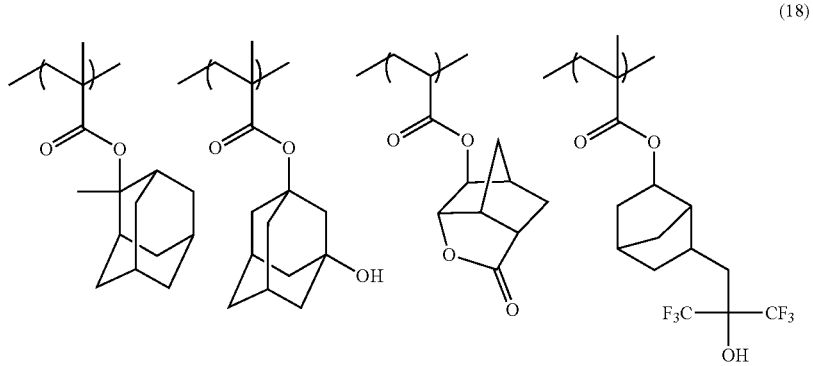
(18)

-continued
(19)
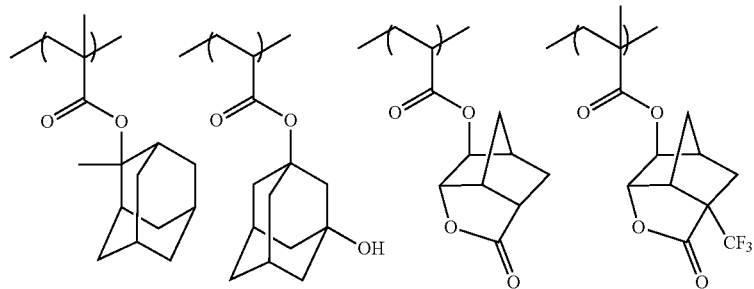
(20)
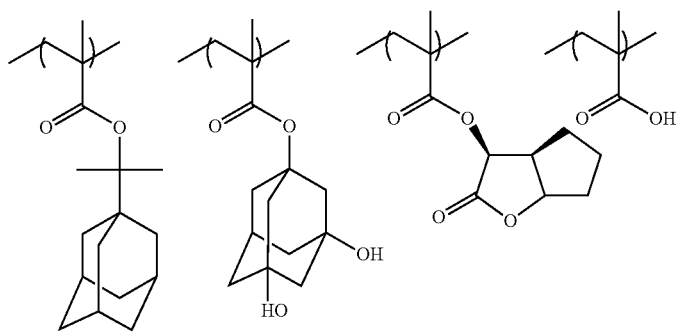
(21)
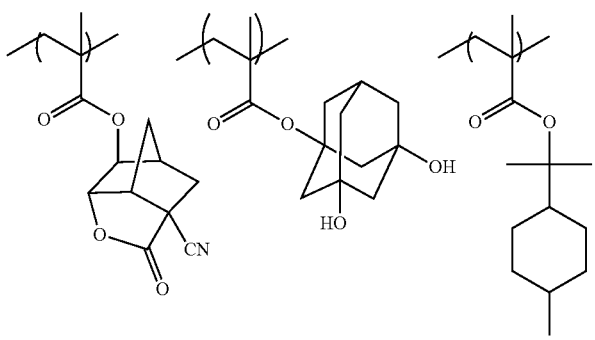
(22)
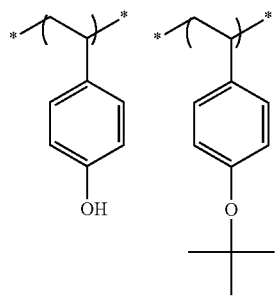

(23)

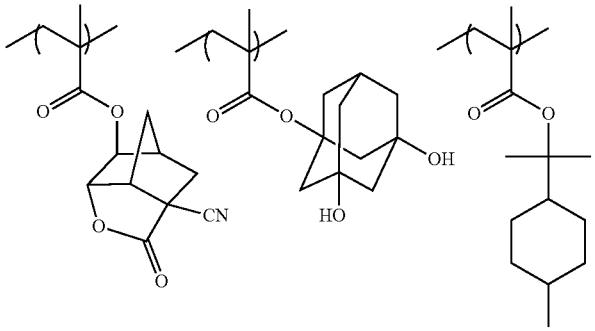

(24)

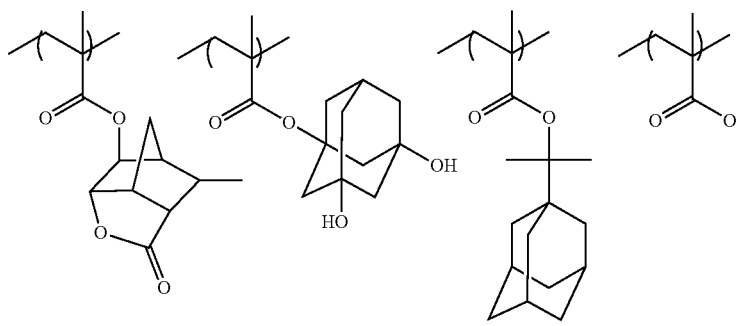

(25)

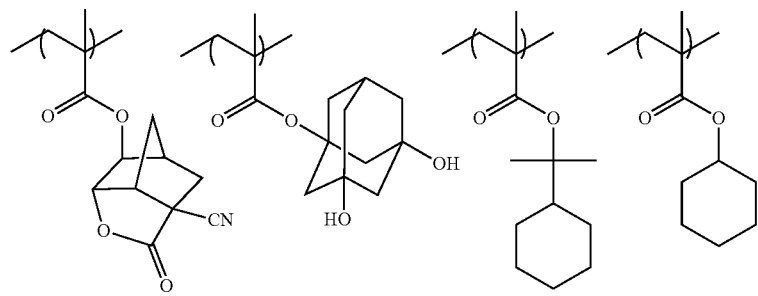

| Resin (A) | Composition (molar ratio of repeating units corresponding to each repeating unit in a left-to-right order) | Mw | Mw/Mn |
|---|---|---|---|
| 1 | 50/10/40 | 8,300 | 1.7 |
| 16 | 45/10/40/5 | 9,900 | 1.6 |
| 17 | 50/50 | 9,700 | 1.4 |
| 18 | 40/10/40/10 | 8,700 | 1.6 |
| 19 | 40/10/25/25 | 8,100 | 1.6 |
| 20 | 40/10/40/10 | 8,400 | 1.6 |
| 21 | 40/10/50 | 8,800 | 1.6 |
| 22 | 50/50 | 9,700 | 1.4 |
| 23 | 50/10/40 | 7,600 | 1.7 |
| 24 | 40/20/30/10 | 7,500 | 1.7 |
| 25 | 40/10/40/10 | 9,500 | 1.7 |

Synthesis Example of Resin (HR)

Synthesis Example 1

Synthesis of Resin (HR-1)

A monomer solution was prepared by dissolving 28 g of tert-butyl methacrylate and 53 g of 2,2,3,3,4,4,4-heptafluorobutyl methacrylate in 120 ml of cyclohexanone. In a separate vessel maintained under a nitrogen atmosphere, 4 g of a polymerization initiator (V-601, produced by Wako Pure Chemical Industries, Ltd.) was dissolved in 10 ml of cyclohexanone to prepare an initiator solution. In a polymerization tank maintained under a nitrogen atmosphere, 10 ml of cyclohexanone was charged and temperature was raised to 100° C. with stirring. The monomer solution and the initiator solution were supplied in the polymerization tank maintained at 100° C. over a period of 4 hours. After the completion of the dropwise addition, the polymerization solution was stirred for 2 hours while maintaining the polymerization temperature at 100° C. Then, the polymerization solution was cooled to room temperature and removed from the polymerization tank. The polymerization solution was dropwise added to one liter of aqueous methanol to deposit a polymer, followed by filtration. The resulting wet polymer was dried at 20 mmHg (2.66 kPa) and 40° C. for 40 hours to obtain the desired Resin (HR-1).

The weight average molecular weight thereof measured by GPC method and calculated in terms of standard polystyrene was 8,800 and the dispersity was 2.1.

Synthesis Example 2

Synthesis of Resin (HR-15)

A monomer solution was prepared by dissolving 24 g of (trimethylsilyl)propyl methacrylate and 40 g of 3,5-bis[2,2,2-trifluoro-1-(trifluoromethyl)-1-hydroxyethyl]cyclohexyl methacrylate in 300 ml of propylene glycol monomethyl ether acetate (hereinafter referred to as "PGMEA"). In a separate vessel maintained under a nitrogen atmosphere, 4 g of a polymerization initiator (V-601, produced by Wako Pure Chemical Industries, Ltd.) was dissolved in 14 ml of PGMEA to prepare an initiator solution. In a polymerization tank maintained under a nitrogen atmosphere, 10 ml of PGMEA was charged and temperature was raised to 80° C. with stirring. The monomer solution and the initiator solution were supplied in the polymerization tank maintained at 80° C. over a period of 4 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 3 liters of hexane to deposit a polymer, followed by filtration. The resulting wet polymer was dried at 20 mmHg (2.66 kPa) and 40° C. for 40 hours to obtain the desired Resin (HR-15).

The polymer composition ratio (by mole) of the resin determined by $^1$H-NMR was 60/40. The weight average molecular weight thereof measured by GPC method and calculated in terms of standard polystyrene was 9,800 and the dispersity was 2.2.

Synthesis Example 3

Synthesis of Resin (HR-26)

In a tank for preparation of monomer solution maintained under a nitrogen atmosphere, 22 g of hexafluoroisopropyl acrylate, 22 g of 2-(methylcyclohexyl)isopropyl methacrylate and 50 mg of 4-methoxyphenol (hereinafter referred to as "MEHQ") as a polymerization inhibitor were dissolved in 200 ml of PGMEA to prepare a monomer solution. The quantity of MEHQ was determined by sampling the monomer solution and found to be 27 mol ppm based on the monomer and 0.11% by mole to the polymerization initiator.

In a separate vessel maintained under a nitrogen atmosphere, 2 g of azobisisobutyronitrile as a polymerization initiator was dissolved in 6 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer, followed by filtration. The resulting wet polymer was dried at 20 mmHg (2.66 kPa) and 40° C. for 40 hours to obtain the desired Resin (HR-26).

The polymer composition ratio (by mole) of the resin determined by $^1$H-NMR was 50/50. The weight average molecular weight thereof measured by GPC method and calculated in terms of standard polystyrene was 8,000 and the dispersity was 2.0.

Synthesis Example 4

Synthesis of Resin (HR-64)

In a tank for preparation of monomer solution maintained under a nitrogen atmosphere, 50 g of 3,5-bis[2,2,2-trifluoro-1-(trifluoromethyl)-1-hydroxyethyl]cyclohexyl methacrylate, 22 g of 4-tert-butylcyclohexyl methacrylate and 50 mg of MEHQ as a polymerization inhibitor were dissolved in 300 ml of PGMEA to prepare a monomer solution. The quantity of MEHQ was determined by sampling the monomer solution and found to be 25 mol ppm based on the monomer and 0.1% by mole to the polymerization initiator.

In a separate vessel maintained under a nitrogen atmosphere, 3 g of azobisisobutyronitrile as a polymerization initiator was dissolved in 10 ml of PGMEA to prepare an initiator solution. In a polymerization tank maintained under a nitrogen atmosphere, 2 ml of PGMEA was charged and temperature was raised to 100° C. with stirring. The monomer solution and the initiator solution were supplied in the polymerization tank maintained at 100° C. over a period of 4 hours. After the completion of the dropwise addition, the polymerization solution was stirred for 2 hours while maintaining the polymerization temperature at 100° C. Then, the polymerization solution was cooled to room temperature and removed from the polymerization tank. The polymerization solution was dropwise added to 3 liters of hexane to deposit a polymer, followed by filtration. The resulting wet polymer was dried at 20 mmHg (2.66 kPa) and 40° C. for 40 hours to obtain the desired Resin (HR-64).

The polymer composition ratio (by mole) of the resin determined by $^1$H-NMR was 50/50. The weight average molecular weight thereof measured by GPC method and calculated in terms of standard polystyrene was 7,900 and the dispersity was 1.9.

Synthesis Example 5

Synthesis of Resin (HR-30)

In a tank for preparation of monomer solution maintained under a nitrogen atmosphere, 11 g of allyltrimethylsilane, 20 g of tert-butyl α-trifluoromethylacrylate and 1 g of methyl mercaptopropionate as a chain transfer agent were dissolved in 60 ml of tetrahydrofuran (hereinafter referred to as "THF") to prepare a monomer solution.

In a separate vessel maintained under a nitrogen atmosphere, 1 g of a polymerization initiator (V-65, produced by Wako Pure Chemical Industries, Ltd.) was dissolved in 5 ml of THF to prepare an initiator solution. In a polymerization tank maintained under a nitrogen atmosphere, 5 ml of THF was charged and temperature was raised to 65° C. with stirring. The monomer solution and the initiator solution were supplied in the polymerization tank maintained at 65° C. over a period of 2 hours. After the completion of the dropwise addition, the polymerization solution was stirred for 2 hours while maintaining the polymerization temperature at 65° C. Then, the polymerization solution was cooled to room temperature, 20 ml of THF was added thereto to dilute, and removed from the polymerization tank. The polymerization solution was dropwise added to one liter of aqueous methanol to deposit a polymer, followed by filtration. The resulting wet polymer was dried at 20 mmHg (2.66 kPa) and 40° C. for 40 hours to obtain the desired Resin (HR-30).

The polymer composition ratio (by mole) of the resin determined by $^1$H-NMR was 50/50. The weight average molecular weight thereof measured by GPC method and calculated in terms of standard polystyrene was 6,500 and the dispersity was 1.6.

Synthesis Example 6

Synthesis of Resin (HR-41)

In a tank for preparation of monomer solution maintained under a nitrogen atmosphere, 9 g of hexafluoroisopropyl methacrylate, 26 g of 4-tert-butylstyrene and 4 g of methyl mercaptopropionate as a chain transfer agent were dissolved in 160 ml of a mixed solution of PGMEA/cyclohexanone (6/4) to prepare a monomer solution.

In a separate vessel maintained under a nitrogen atmosphere, 1 g of a polymerization initiator (V-601) was dissolved in 10 ml of a mixed solution of PGMEA/cyclohexanone (6/4) to prepare an initiator solution. In a polymerization tank maintained under a nitrogen atmosphere, 6 ml of a mixed solution of PGMEA/cyclohexanone (6/4) was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 1.5 liters of aqueous methanol to deposit a polymer, followed by filtration. The resulting wet polymer was dried at 20 mmHg (2.66 kPa) and 40° C. for 40 hours to obtain the desired Resin (HR-41).

The polymer composition ratio (by mole) of the resin determined by $^1$H-NMR was 20/80. The weight average molecular weight thereof measured by GPC method and calculated in terms of standard polystyrene was 7,500 and the dispersity was 1.8.

Synthesis Example 7

Synthesis of Resin (HR-13)

A monomer solution was prepared by dissolving 16 g of (trimethylsilyl)propyl methacrylate and 27 g of 2-(methylcyclohexyl)isopropyl methacrylate in 200 ml of cyclohexanone. In a separate vessel maintained under a nitrogen atmosphere, 2 g of a polymerization initiator (V-601) was dissolved in 10 ml of cyclohexanone to prepare an initiator solution. In a polymerization tank maintained under a nitrogen atmosphere, 6 ml of cyclohexanone was charged and temperature was raised to 80° C. with stirring. The monomer solution and the initiator solution were supplied in the polymerization tank maintained at 80° C. over a period of 4 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer, followed by filtration.

The resulting wet polymer was washed with 2 liters of methanol, followed by filtration and redissolved in cyclohexanone and filtered through a polyethylene filter of 0.1 μm. Then, PGMEA was added to the filtrate while removing cyclohexanone by heating under a reduced pressure to perform solvent substitution, whereby a PGMEA solution containing 20% of Resin (HR-13) was obtained.

The polymer composition ratio (by mole) of the resin determined by $^1$H-NMR was 40/60. The weight average molecular weight thereof measured by GPC method and calculated in terms of standard polystyrene was 13,000 and the dispersity was 2.2.

Synthesis Example 8

Synthesis of Resin (HR-58)

A monomer solution was prepared by dissolving 24 g of hexafluoroisopropyl methacrylate and 14 g of tert-butyl methacrylate in 160 ml of PGMEA. In a separate vessel maintained under a nitrogen atmosphere, 2 g of a polymerization initiator (V-601) was dissolved in 10 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 1.5 liters of aqueous methanol to deposit a polymer. Then, the supernatant solution at the precipitation purification was removed, and the resulting residue was moved to a centrifugal machine and removed the liquid to obtain a wet polymer. To the wet polymer was added one liter of methanol to perform rinsing and the rinse solution was removed.

The resulting wet polymer was dissolved in 500 ml of PGMEA and the solution was passed through a polyethylene filter of 0.1 μm. The solution was concentrated to obtain a PGMEA solution containing 20% of Resin (HR-58).

The polymer composition ratio (by mole) of the resin determined by $^1$H-NMR was 50/50. The weight average molecular weight thereof measured by GPC method and calculated in terms of standard polystyrene was 10,200 and the dispersity was 2.2.

Synthesis Example 9

Synthesis of Resin (HR-37)

In a tank for preparation of monomer solution maintained under a nitrogen atmosphere, 11 g of allyltrimethylsilane, 24 g of 2,5-dimethylpentyl-α-trifluoromethylacrylate and 10 mg of MEHQ as a polymerization inhibitor were dissolved in 160 ml of PGMEA to prepare a monomer solution. The quantity of MEHQ was determined by sampling the monomer solution and found to be 5 mol ppm based on the monomer and 0.05% by mole to the polymerization initiator.

In a separate vessel maintained under a nitrogen atmosphere, 2 g of a polymerization initiator (V-65, produced by Wako Pure Chemical Industries, Ltd.) was dissolved in 10 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer. Then, the supernatant solution at the precipitation purification was removed, and the resulting residue was moved to a centrifugal machine and removed the liquid to obtain a wet polymer. To the wet polymer was added one liter of methanol to perform rinsing and the rinse solution was removed.

The resulting wet polymer was dissolved in 500 ml of PGMEA and the solution was passed through a polyethylene filter of 0.1 µm. The solution was concentrated to obtain a PGMEA solution containing 20% of Resin (HR-37).

The polymer composition ratio (by mole) of the resin determined by $^1$H-NMR was 50/50. The weight average molecular weight thereof measured by GPC method and calculated in terms of standard polystyrene was 5,500 and the dispersity was 1.5.

Synthesis Example 10

Synthesis of Resin (HR-12)

In a tank for preparation of monomer solution maintained under a nitrogen atmosphere, 16 g of (trimethylsilyl)propyl methacrylate, 27 g of 4-text-butylcyclohexyl methacrylate and 10 mg of MEHQ as a polymerization inhibitor were dissolved in 200 ml of cyclohexanone to prepare a monomer solution. The quantity of MEHQ was determined by sampling the monomer solution and found to be 13 mol ppm based on the monomer and 0.1% by mole to the polymerization initiator.

In a separate vessel maintained under a nitrogen atmosphere, 1 g of azobisisobutyronitrile as a polymerization initiator was dissolved in 20 ml of cyclohexanone to prepare an initiator solution. In a polymerization tank maintained under a nitrogen atmosphere, 6 ml of cyclohexanone was charged and temperature was raised to 100° C. with stirring. The monomer solution and the initiator solution were supplied in the polymerization tank maintained at 100° C. over a period of 4 hours. After the completion of the dropwise addition, the polymerization solution was stirred for 2 hours while maintaining the polymerization temperature at 100° C. Then, the polymerization solution was cooled to room temperature and removed from the polymerization tank. The polymerization solution was dropwise added to 2 liters of aqueous methanol to deposit a polymer. Then, the supernatant solution at the precipitation purification was removed, and the resulting residue was moved to a centrifugal machine and removed the liquid to obtain a wet polymer. To the wet polymer was added 2 liters of methanol to perform rinsing and the rinse solution was removed. The resulting wet polymer was dissolved in 500 ml of cyclohexanone and the solution was passed through a polyethylene filter of 0.1 µm. The solution was concentrated to obtain a cyclohexanone solution containing 20% of Resin (HR-12).

The polymer composition ratio (by mole) of the resin determined by $^1$H-NMR was 40/60. The weight average molecular weight thereof measured by GPC method and calculated in terms of standard polystyrene was 15,000 and the dispersity was 2.2.

Synthesis Example 11

Synthesis of Resin (HR-25)

In a tank for preparation of monomer solution maintained under a nitrogen atmosphere, 22 g of hexafluoroisopropyl acrylate, 22 g of 4-tert-butylcyclohexyl methacrylate and 6 g of methyl mercaptopropionate as a chain transfer agent were dissolved in 200 ml of cyclohexanone to prepare a monomer solution.

In a separate vessel maintained under a nitrogen atmosphere, 3 g of azobisisobutyronitrile as a polymerization initiator was dissolved in 10 ml of cyclohexanone to prepare an initiator solution. In a polymerization tank maintained under a nitrogen atmosphere, 6 ml of cyclohexanone was charged and temperature was raised to 100° C. with stirring. The monomer solution and the initiator solution were supplied in the polymerization tank maintained at 100° C. over a period of 2 hours. After the completion of the dropwise addition, the polymerization solution was stirred for 2 hours while maintaining the polymerization temperature at 100° C. Then, the polymerization solution was cooled to room temperature and removed from the polymerization tank. The polymerization solution was dropwise added to 2 liters of aqueous methanol to deposit a polymer. Then, the supernatant solution at the precipitation purification was removed, and the resulting residue was moved to a centrifugal machine and removed the liquid to obtain a wet polymer. To the wet polymer was added 2 liters of methanol to perform rinsing and the rinse solution was removed. The resulting wet polymer was dissolved in 500 ml of cyclohexanone and the solution was passed through a polyethylene filter of 0.1 µm. The solution was concentrated to obtain a cyclohexanone solution containing 20% of Resin (HR-25).

The polymer composition ratio (by mole) of the resin determined by $^1$H-NMR was 50/50. The weight average molecular weight thereof measured by GPC method and calculated in terms of standard polystyrene was 7,800 and the dispersity was 2.0.

Synthesis Example 12

Synthesis of Resin (HR-34)

In a tank for preparation of monomer solution maintained under a nitrogen atmosphere, 15 g of (3-methacroyloxy)propylethyl-POSS (also known as 1-(3-methacroyloxy)propyl-3,5,7,9,11,13,15-heptaethylpentacyclo [9.5.1.1.$^{3,9}$.1.$^{5,15}$.1.$^{7,13}$]octasiloxane), 36 g of 2-ethylhexyl methacrylate and 2 g of methyl mercaptopropionate as a chain transfer agent were dissolved in 240 ml of PGMEA to prepare a monomer solution.

In a separate vessel maintained under a nitrogen atmosphere, 1 g of AIBN as a polymerization initiator was dissolved in 10 ml of PGMEA to prepare an initiator solution. In a polymerization tank maintained under a nitrogen atmosphere, 4 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer. Then, the supernatant solution at the precipitation purification was removed, and the resulting residue was moved to a centrifugal machine and removed the liquid to obtain a wet polymer. To the wet polymer was added 2 liters of methanol to perform rinsing and the rinse solution was removed.

The resulting wet polymer was dissolved in 500 ml of PGMEA and the solution was passed through a polyethylene filter of 0.1 µm. The solution was concentrated to obtain a PGMEA solution containing 20% of Resin (HR-34).

The polymer composition ratio (by mole) of the resin determined by $^1$H-NMR was 10/90. The weight average molecular weight thereof measured by GPC method and calculated in terms of standard polystyrene was 8,000 and the dispersity was 1.8.

Synthesis Example 13

Synthesis of Resin (HR-20)

In a tank for preparation of monomer solution maintained under a nitrogen atmosphere, 44 g of hexafluoroisoproyl acrylate, 2 g of methyl mercaptopropionate as a chain transfer agent and 10 mg of MEHQ as a polymerization inhibitor were dissolved in 200 ml of PGMEA to prepare a monomer solution. The quantity of MEHQ was determined by sampling the monomer solution and found to be 13 mol ppm based on the monomer and 0.1% by mole to the polymerization initiator.

In a separate vessel maintained under a nitrogen atmosphere, 1 g of AIBN as a polymerization initiator was dissolved in 10 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer. Then, the supernatant solution at the precipitation purification was removed, and the resulting residue was moved to a centrifugal machine and removed the liquid to obtain a wet polymer. To the wet polymer was added 2 liters of methanol to perform rinsing and the rinse solution was removed.

The resulting wet polymer was dissolved in 500 ml of PGMEA and the solution was passed through a polyethylene filter of 0.1 µm. The solution was concentrated to obtain a PGMEA solution containing 20% of Resin (HR-20).

The weight average molecular weight thereof measured by GPC method and calculated in terms of standard polystyrene was 6,500 and the dispersity was 1.2.

Synthesis Example 14

Synthesis of Resin (HR-63)

In a tank for preparation of monomer solution maintained under a nitrogen atmosphere, 50 g of 3,5-bis[2,2,2-trifluoro-1-(trifluoromethyl)-1-hydroxyethyl]cyclohexyl methacrylate, 2 g of methyl mercaptopropionate as a chain transfer agent and 10 mg of MEHQ as a polymerization inhibitor were dissolved in 240 ml of PGMEA to prepare a monomer solution. The quantity of MEHQ was determined by sampling the monomer solution and found to be 13 mol ppm based on the monomer and 0.1% by mole to the polymerization initiator.

In a separate vessel maintained under a nitrogen atmosphere, 1 g of AIBN as a polymerization initiator was dissolved in 6 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous hexane to deposit a polymer. Then, the supernatant solution at the precipitation purification was removed, and the resulting residue was moved to a centrifugal machine and removed the liquid to obtain a wet polymer. To the wet polymer was added 2 liters of hexane to perform rinsing and the rinse solution was removed.

The resulting wet polymer was dissolved in 500 ml of PGMEA and the solution was passed through a polyethylene filter of 0.1 µm. The solution was concentrated to obtain a PGMEA solution containing 20% of Resin (HR-63).

The weight average molecular weight thereof measured by GPC method and calculated in terms of standard polystyrene was 6,800 and the dispersity was 1.6.

Synthesis Example 15

Synthesis of Comparative Resin (HR-100)

In 130 ml of cyclohexanone were dissolved 28 g of tert-butyl methacrylate and 4 g of a polymerization initiator (V-601) to prepare a solution for adding dropwise. In a polymerization tank maintained under a nitrogen atmosphere, 10 ml of cyclohexanone was charged and temperature was raised to 100° C. with stirring. The solution for adding dropwise was supplied in the polymerization tank maintained at 100° C. over a period of 4 hours. After the completion of the dropwise addition, the polymerization solution was stirred for 2 hours while maintaining the polymerization temperature at 100° C. Then, the polymerization solution was cooled to room temperature and removed from the polymerization tank. The polymerization solution was dropwise added to one liter of aqueous methanol to deposit a polymer, followed by filtration. The resulting wet polymer was dried at 20 mmHg (2.66 kPa) and 40° C. for 40 hours to obtain the desired Comparative Resin (HR-100).

The weight average molecular weight thereof measured by GPC method and calculated in terms of standard polystyrene was 8,700 and the dispersity was 2.1.

Synthesis Example 16

Synthesis of Resin (HR-11)

In a tank for preparation of monomer solution maintained under a nitrogen atmosphere, 34 g of hexafluoroisopropyl methacrylate, 56 g of styrene and 50 mg of MEHQ as a polymerization inhibitor were dissolved in 200 ml of PGMEA to prepare a monomer solution.

In a separate vessel maintained under a nitrogen atmosphere, 2 g of azobisisobutyronitrile as a polymerization initiator was dissolved in 6 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer, followed by filtration. The resulting wet polymer was dried at 20 mmHg (2.66 kPa) and 40° C. for 40 hours to obtain the desired Resin (HR-11).

The polymer composition ratio (by mole) of the resin determined by $^1$H-NMR was 70/30. The weight average molecular weight thereof measured by GPC method and calculated in terms of standard polystyrene was 10,200 and the dispersity was 2.2.

Synthesis Example 17

Synthesis of Resin (HR-24)

In a tank for preparation of monomer solution maintained under a nitrogen atmosphere, 24 g of hexafluoroisopropyl methacrylate, 14 g of hexyl methacrylate and 50 mg of MEHQ as a polymerization inhibitor were dissolved in 200 ml of PGMEA to prepare a monomer solution.

In a separate vessel maintained under a nitrogen atmosphere, 2 g of azobisisobutyronitrile as a polymerization initiator was dissolved in 6 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer, followed by filtration. The resulting wet polymer was dried at 20 mmHg (2.66 kPa) and 40° C. for 40 hours to obtain the desired Resin (HR-26).

The polymer composition ratio (by mole) of the resin determined by $^1$H-NMR was 50/50. The weight average molecular weight thereof measured by GPC method and calculated in terms of standard polystyrene was 8,800 and the dispersity was 1.9.

Synthesis Example 18

Synthesis of Resin (HR-61)

In a tank for preparation of monomer solution maintained under a nitrogen atmosphere, 9 g of 3,5-trifluoromethylphenyl methacrylate, 6.3 g of 2-(1,3-dioxobutoxy)ethyl methacrylate and 1,1-dimethyl-1-(4-methylcyclohexyl)methyl methacrylate and 50 mg of MEHQ as a polymerization inhibitor were dissolved in 200 ml of PGMEA to prepare a monomer solution.

In a separate vessel maintained under a nitrogen atmosphere, 2 g of azobisisobutyronitrile as a polymerization initiator was dissolved in 6 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer, followed by filtration. The resulting wet polymer was dried at 20 mmHg (2.66 kPa) and 40° C. for 40 hours to obtain the desired Resin (HR-61).

The polymer composition ratio (by mole) of the resin determined by $^1$H-NMR was 30/30/40. The weight average molecular weight thereof measured by GPC method and calculated in terms of standard polystyrene was 9,600 and the dispersity was 1.6.

Synthesis Example 19

Synthesis of Resin (HR-81)

In a tank for preparation of monomer solution maintained under a nitrogen atmosphere, 8.6 g of trimethylsilylmethyl methacrylate and 15 g of 10-camphorsulfonylmethacrylamide were dissolved in 200 ml of PGMEA which had been bubbled with oxygen acting as a polymerization inhibiting component for one minute to prepare a monomer solution.

In a separate vessel maintained under a nitrogen atmosphere, 2 g of azobisisobutyronitrile as a polymerization initiator was dissolved in 6 ml of PGMEA to prepare an initiator solution. In a polymerization tank maintained under a nitrogen atmosphere, 6 ml of PGMEA was charged and temperature was raised to 80° C. with stirring. The monomer solution and the initiator solution were supplied in the polymerization tank maintained at 80° C. over a period of 2 hours. After the completion of the dropwise addition, the polymerization solution was stirred for 2 hours while maintaining the polymerization temperature at 80° C. Then, the polymerization solution was cooled to room temperature and removed from the polymerization tank. The polymerization solution was dropwise added to 2 liters of aqueous methanol to deposit a polymer, followed by filtration. The resulting wet polymer was dried at 20 mmHg (2.66 kPa) and 40° C. for 40 hours to obtain the desired Resin (HR-81).

The polymer composition ratio (by mole) of the resin determined by $^1$H-NMR was 50/50. The weight average molecular weight thereof measured by GPC method and calculated in terms of standard polystyrene was 8,600 and the dispersity was 2.3.

The synthesis examples are summarized in the following table.

TABLE 2

| Synthesis Example | Resin | Process 1 Separately Dropwise Addition of Two Solutions | Process 2 Presence of Polymerization Restraining Component | Process 3 Presence of Chain Transfer Agent | Process 4 Solvent Substitution |
|---|---|---|---|---|---|
| 1 | HR-1 | Yes | No | No | No |
| 2 | HR-15 | Yes | No | No | No |
| 3 | HR-26 | Yes | Yes | No | No |
| 4 | HR-64 | Yes | Yes | No | No |
| 5 | HR-30 | Yes | No | Yes | No |
| 6 | HR-41 | Yes | No | Yes | No |
| 7 | HR-13 | Yes | No | No | Yes |
| 8 | HR-58 | Yea | No | No | Yes |
| 9 | HR-37 | Yes | Yes | No | Yes |
| 10 | HR-12 | Yes | Yes | No | Yes |
| 11 | HR-25 | Yes | No | Yes | Yes |
| 12 | HR-34 | Yes | No | Yes | Yes |
| 13 | HR-20 | Yes | Yes | Yes | Yes |
| 14 | HR-63 | Yes | Yes | Yes | Yes |
| 15 | HR-100 | No | No | No | No |
| 16 | HR-11 | Yes | Yes | No | No |
| 17 | HR-24 | Yes | Yes | No | No |
| 18 | HR-61 | Yea | Yes | No | No |
| 19 | HR-81 | Yes | Yes | No | No |

Examples 1 to 17 and Comparative Examples 1 to 2

Evaluation Method of Resist

<Quantitative Determination of High Molecular Weight Component in Polymer>

Quantitative determination of the high molecular weight component in the polymer was performed using GPC according to the analytical condition and quantitation method shown below.

Apparatus: HLC-8120GPC produced by Tosoh Corp.
Detector: Differential refractive index (RI) detector
Column: TSK-GEL produced by Tosoh Corp. (4 columns)
Quantitation: A solution having a polymer content of 2% by weight was prepared and a peak area Ap of the polymer was determined using GPC.

Then, a solution having a polymer content of 20% by weight was prepared and a peak area Ah of a high molecular weight component in the polymer was determined using GPC.

Using the peak areas Ap and Ah thus-obtained, the area ratio (%) of the high molecular weight component in the resin is calculated according to the calculation formula shown below. Since the polymer concentration for the peak area Ap is one tenth of the polymer concentration for the peak area Ah, the peak area Ap is decupled for comparison with for the peak area Ah in the calculation formula.

$$\frac{Ah}{(Ap \times 10) + Ah} \times 100 \, (\%)$$

Examples 1 to 19 and Comparative Examples 1 to 2

Each of the components was dissolved in the solvent as shown in Table 3 to prepare a solution having solid content concentration of 7% by weight. The solution was filtered by a polyethylene filter having a pore size of 0.1 μm to prepare a positive resist composition. The positive resist composition thus-prepared was evaluated by the method described below. The results obtained are shown in Table 3.

The weight % of the Resin (HR) is based on the total solid content of the resist composition.

[Evaluation Method of Resist]

<Evaluation of Coating Defect>

Each photosensitive resin composition having the composition shown in Table 3 below was uniformly coated on an 8 inch silicon substrate subjected to a hexamethyldisilazane treatment by a spin coater and heated and dried on a hot plate at 120° C. for 60 seconds to form a resist film having a thickness of 100 nm. A number of the coating defect of the resist film was measured by an apparatus, KLA2360 produced by KLA Tencor Corp. The number of the coating defect is indicated as a relative value taking the number of the coating defect of Comparative Example 1 as a standard (1). The smaller the value the better the coating defect performance.

<Evaluation of Development Defect>

Each photosensitive resin composition having the composition shown in Table 3 below was uniformly coated on an 8 inch silicon substrate subjected to a hexamethyldisilazane treatment by a spin coater and heated and dried on a hot plate at 120° C. for 60 seconds to form a resist film having a thickness of 100 nm. The resist film was heated on a hot plate at 110° C. for 90 seconds without conducting image exposure, developed with an aqueous 2.38% by weight tetramethylammonium hydroxide solution at 23° C. for 60 seconds, rinsed with pure water for 30 seconds and dried. The development defect of the sample wafer thus-obtained was measured by an apparatus, KLA2360 produced by KLA Tencor Corp. The number of the development defect is indicated as a relative value taking the number of the development defect of Comparative Example 1 as a standard (1).

<Evaluation of Water Followability>

Each positive resin composition having the composition shown in Table 3 below was coated on a silicon wafer and baked at 120° C. for 60 seconds to form a resist film having a thickness of 160 nm. Pure water 2 was filled between the wafer 1 having the positive resin composition coated thereon and a quartz glass substrate 3 as shown in FIG. 1. Under this condition, the quartz glass substrate 3 was moved (scanned) parallel to the surface of the resist-coated substrate 1 and the aspect of pure water 2 following to the scanning was visually observed. The scanning speed of the quartz glass substrate 3 was gradually increased and a limit scanning speed at which the pure water 2 could not follow the scanning speed of the quartz glass substrate 3 and a water droplet started to remain on the receding side was determined thereby evaluating the water followability. As the limit scanning speed increases, the water can follow higher scanning speed and the water followability on the resist film is better.

<Quantitative Determination of Acid Generated>

Each resin composition having the composition shown in Table 3 below was coated on an 8 inch silicon substrate and heated and baked at 120° C. for 60 seconds to form a resist film having a thickness of 150 nm. The resist film was exposed overall by an exposure device equipped with a light source having a wavelength of 193 nm at 20 mJ/cm². On the resist film, 5 ml of pure water obtained by the deionization treatment using an ultra pure water production system (Milli-Q Jr. produced by Nihon Millipore K. K.) was dropped. After maintaining the pure water on the resist film for 50 seconds, the pure water was collected and the concentration of the acid eluted from the resist film was determined by LC-MS.

LC device: 2659 produced by Waters Corp.

MS device; Esquire 3000plus produced by Bruker Daltonics Inc.

The detected intensity of the ion species having a mass of 299 (corresponding to nonaflate anion) was measured by the LC-MS device and the elution amount of the nonafluorobutanesulfonic acid (Acid (a)) was determined. Also, in the same manner, the detected intensity of the ion species having a mass of 292 (corresponding to an anion of Acid (b)) was measured by the LC-MS device and the elution amount of Acid (b) shown below was determined.

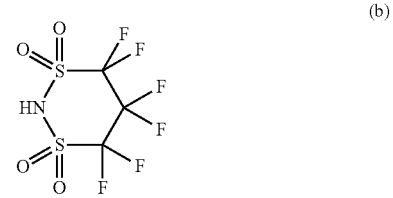 [SMILES: O=S1(=O)NS(=O)(=O)C(F)(F)C(F)(F)C1(F)F]

(b)

The results of evaluation obtained are shown in Table 3.

TABLE 3

| | | | | | | | | Results of Evaluation | | | |
|---|---|---|---|---|---|---|---|---|---|---|---|
| | | Composition | | | | | Peak Area of | | Elution Amount of Acid Generated ($\times 10^{-13}$ mol/cm$^2$) | | Water |
| | Resin (A) (2 g) | Photoacid Generator (mg) | Solvent (weight ratio) | Basic Compound (mg) | Resin (HR) (% by weight) | Sur- factant (mg) | High Molecular Weight Component | Coating Defect | Development Defect | Acid (a) | Acid (b) | Follow- ability |
| Example 1 | 1 | z2 (80) | SL-1/SL-2 (40/60) | N-5 (7) | HR-1 (1.0) | W-4 (3) | <0.1 | 0.003 | 0.003 | 2 | — | 200 |
| Example 2 | 1 | Z2 (80) | SL-2/SL-4 (60/40) | N-2 (7) | HR-15 (6.0) | W-2 (3) | <0.1 | 0.003 | 0.003 | 2 | — | 200 |
| Example 3 | 1 | Z2 (80) | SL-1/SL-2 (40/60) | N-3 (6) | HR-26 (2.0) | W-1 (3) | <0.1 | 0.003 | 0.002 | 2 | — | 200 |
| Example 4 | 17 | z55/z23 (100/25) | SL-2/SL-4 (60/40) | N-5/N-1 (7/7) | HR-37 (0.4) | W-3 (3) | <0.1 | 0.002 | 0.002 | 2 | 2 | 250 |
| Example 5 | 18 | z55/z23 (75/75) | SL-2/SL-4 (60/40) | N-5/N-1 (7/7) | HR-30 (0.3) | W-3 (3) | <0.1 | 0.003 | 0.002 | 2 | 2 | 250 |
| Example 6 | 17 | Z55 (100) | SL-2/SL-4 (60/40) | N-5/N-1 (7/7) | HR-41 (0.4) | W-3 (3) | <0.1 | 0.003 | 0.002 | — | 2 | 250 |
| Example 7 | 16 | Z55 (100) | SL-2/SL-4 (60/40) | N-1 (10) | HR-13 (2.0) | W-5 (3) | <0.1 | 0.003 | 0.002 | — | 2 | 200 |
| Example 8 | 19 | Z2 (80) | SL-2 (100) | N-7 (7) | HR-58 (0.5) | W-3 (2) | <0.1 | 0.003 | 0.002 | 2 | — | 200 |
| Example 9 | 20 | Z2 (80) | SL-1 (100) | N-7 (7) | HR-64 (3.0) | W-1 (2) | <0.1 | 0.003 | 0.002 | 2 | — | 200 |
| Example 10 | 21 | Z23 (80) | SL-2/SL-5 (60/40) | N-3 (6) | HR-12 (1.0) | W-1 (2) | <0.1 | 0.002 | 0.002 | 2 | — | 250 |
| Example 11 | 22 | z2/z42 (50/40) | SL-2/SL-5 (60/40) | N-3 (6) | HR-25 (2.0) | W-1 (2) | <0.1 | 0.002 | 0.002 | 4 | — | 250 |
| Example 12 | 23 | Z2 (80) | SL-2/SL-3 (60/40) | N-7 (7) | HR-34 (1.5) | W-1 (2) | <0.1 | 0.002 | 0.002 | 2 | — | 250 |
| Example 13 | 24 | z2/z15 (50/75) | SL-2/SL-3 (60/40) | N-4 (6) | HR-20 (2.0) | W-1 (3) | <0.1 | 0.001 | 0.001 | 2 | — | 250 |
| Example 14 | 25 | z55/z15 (50/75) | SL-2 (100) | N-8 (7) | HR-63 (2.0) | W-1 (2) | <0.1 | 0.001 | 0.001 | 1 | 2 | 200 |
| Example 15 | 1 | Z2 (80) | SL-2/SL-4 (60/40) | N-9 (7) | HR-11 (1.5) | W-5 (3) | <0.1 | 0.003 | 0.002 | 2 | — | 200 |
| Example 16 | 1 | Z2 (80) | SL-2/SL-4 (60/40) | N-10 (7) | HR-24 (1.5) | W-5 (3) | <0.1 | 0.002 | 0.003 | 2 | — | 200 |
| Example 17 | 1 | Z2 (80) | SL-2/SL-4 (60/40) | N-9 (7) | HR-25 (1.5) | W-5 (3) | <0.1 | 0.002 | 0.001 | 2 | — | 200 |
| Example 18 | 1 | Z2 (80) | SL-2/SL-4 60/40 | N-9 (7) | HR-61 (1.5) | W-5 (3) | <0.1 | 0.002 | 0.001 | 1 | — | 200 |
| Example 19 | 1 | Z2 (80) | SL-2/SL4 60/40 | N-9 (7) | HR-81 (1.5) | W-5 (3) | <0.1 | 0.002 | 0.002 | 2 | — | 200 |
| Comparative Example 1 | 1 | Z2 (80) | SL-2/SL-4/SL-6 40/59/1 | N-6 (10) | HR-100 (1.0) | W-4 (5) | 0.2 | 1 | 1 | 3 | — | 200 |
| Comparative Example 2 | 1 | Z2 (80) | SL-2/SL-4/SL-6 40/59/1 | N-6 (10) | — | W-4 (5) | — | 0.05 | 0.9 | 10 | — | 50 |

The codes of Resins (A), the photoacid generators and Resins (HR) shown in Table 2 correspond to those described hereinbefore, respectively. With respect to the basic compounds, surfactants and solvents, the codes thereof and the corresponding compounds are set forth below, respectively,
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,6-Triphenylimidazole
N-7: Tris(methoxyethoxyethyl)amine
N-8: 2-phenylbenzimidazole

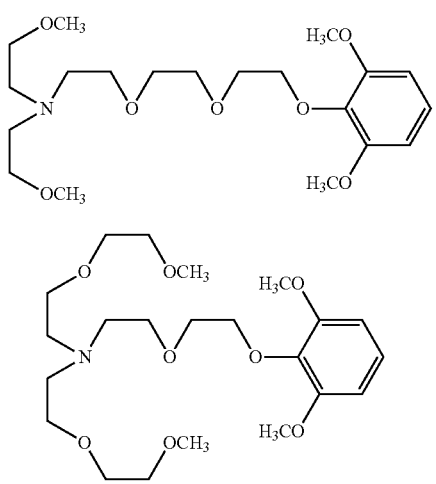

W-1: Megafac F176 (produced by Dainippon Ink and Chemicals, Inc.) (fluorine-based)
W-2: Megatac R08 (produced by Dainippon Ink and Chemicals, Inc.) (fluorine- and silicon-based)
W-3: Polysiloxane polymer KP-341 (produced by Shin-Etsu Chemical Co., Ltd.) (silicon-based)
W-4: Troysol S-366 (produced by Troy Chemical Corp.)
W-5: PF6320 (produced by OMNOVA Inc.) (fluorine-based)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate This application is based on Japanese Patent application JP 2007-65324, filed Mar. 14, 2007, and Japanese Patent application JP 2008-11716, filed Jan. 22, 2008, the entire contents of which are hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A positive resist composition comprising:
(A) a resin which has a monocyclic or polycyclic alicyclic hydrocarbon structure and increases solubility in an alkali developer by an action of an acid;
(B) a compound which generates an acid upon irradiation of an actinic ray or radiation;
(C) a resin having a fluorine atom and not having a lactone structure; and
(D) a solvent;
wherein:
the resin (C) is to be localized on a surface of a resist film so as to hydrophobilize the surface of a resist film and is a resin in which a peak area of a high molecular weight component having a molecular weight of 30,000 or more is 0.1% or less of a total peak area in a molecular weight distribution measured by gel permeation chromatography, the resin (C) is produced by a method comprising supplying continuously or intermittently a solution containing a polymerizable monomer from a first tank and a solution containing a polymerization initiator from a second tank, said first and second tanks being separated from each other, to a polymerization system heated at polymerization temperature to undergo radical polymerization;
the resin (C) has neither an acid decomposable group nor an alkali-soluble group; and
the amount of the resin (C) added is from 0.1 to 10% by weight, based on the total solids content of the resin composition.

2. The positive resist composition as claimed in claim 1, wherein the resin (C) comprises as a fluorine atom-containing moiety a group or structure selected from a perfluoroalkyl group having from 1 to 4 carbon atoms and a fluorinated alcohol group.

3. The positive resist composition as claimed in claim 1, wherein the resin (C) has a silicon atom.

4. The positive resist composition as claimed in claim 1, wherein the resin (C) is a resin containing a repeating unit represented by any one of formulas (C-1) to (C-III):

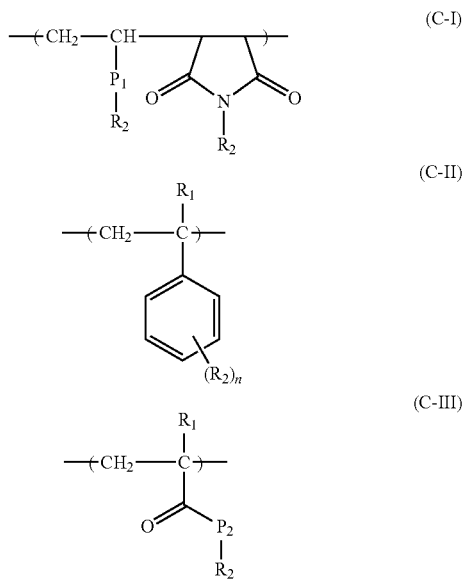

wherein $R_1$ each independently represents a hydrogen atom or a methyl group; $R_2$ each independently represents a hydrocarbon group having at least one —$CH_3$ partial structure; $P_1$ represents a single bond, an alkylene group, an ether group or a connecting group including two or more of these groups; $P_2$ represents a connecting group selected from —O—, —NR— (wherein R represents a hydrogen atom or an alkyl group) and —$NHSO_2$—;
and n represents an integer of 1 to 4.

5. The positive resist composition as claimed in claim 1, wherein the resin (A) is a resin containing at least one repeating unit selected from the group consisting of a repeating unit having a partial structure including an alicyclic hydrocarbon represented by any one of formula (pI) to (pV) and a repeating unit represented by formula (II-AB):

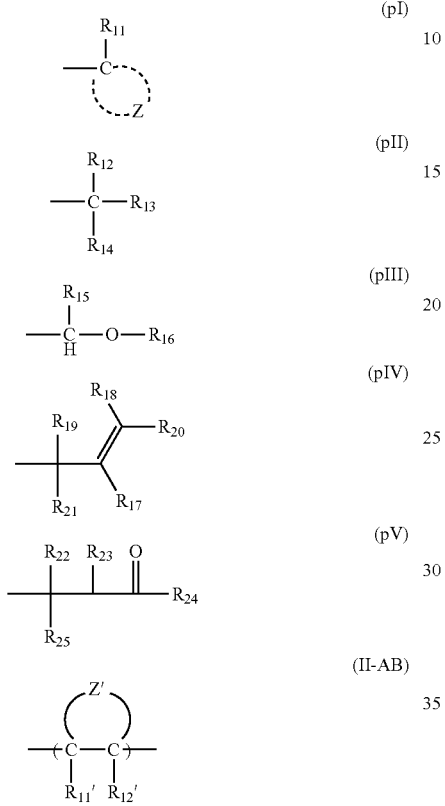

wherein in formulae (pI) to (pV), $R_{11}$ represents a methyl group, an ethyl group, an n-propyl group, an isopropyl group, an n-butyl group, an isobutyl group or a sec-butyl group, and Z represents an atomic group necessary for forming a cycloalkyl group together with the carbon atom;

$R_{12}$ to $R_{16}$ each independently represents a straight-chain or branched alkyl group having from 1 to 4 carbon atoms or a cycloalkyl group, provided that at least one of Ru to $R_{14}$ or either $R_{15}$ or $R_{16}$ represents a cycloalkyl group;

$R_{17}$ to $R_{21}$ each independently represents a hydrogen atom, a straight-chain or branched alkyl group having from 1 to 4 carbon atoms or a cycloalkyl group, provided that at least one of $R_{17}$ to $R_{21}$ represents a cycloalkyl group and either $R_{19}$ or $R_{21}$ represents a straight-chain or branched alkyl group having from 1 to 4 carbon atoms or a cycloalkyl group;

$R_{22}$ to $R_{25}$ each independently represents a hydrogen atom, a straight-chain or branched alkyl group having from 1 to 4 carbon atoms or a cycloalkyl group, provided that at least one of $R_{22}$ to $R_{25}$ represents a cycloalkyl group; or, alternatively, $R_{23}$ and $R_{24}$ may be combined with each other to form a ring; and wherein in formula (II-AB), R11' and $R_{12}$' each independently represents a hydrogen atom, a cyano group, a halogen atom or an alkyl group; and Z' represents an atomic group necessary for forming an alicyclic structure together with the connected two carbon atoms (C-C).

6. The positive resist composition as claimed in claim 1, wherein the resin (A) is a resin containing at least two repeating units selected from the group consisting of a repeating unit having a partial structure including an alicyclic hydrocarbon represented by any one of formula (pI) to (pV) and a repeating unit represented by formula (II-AB).

7. The positive resist composition as claimed in claim 1, wherein the resin (A) contains a repeating unit including a lactone group.

8. The positive resist composition as claimed in claim 1, wherein the resin (A) contains a repeating unit represented by formula (AI):

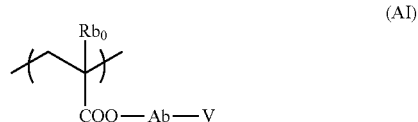

wherein in formula (AI), $R_{b0}$ represents a hydrogen atom, a halogen atom or an alkyl group having from 1 to 4 carbon atoms;

$A_b$ represents a single bond, an alkylene group, a divalent connecting group including a monocyclic or polycyclic alicyclic hydrocarbon structure, an ether group, an ester group, a carbonyl group or a divalent group formed by combining these groups; and V represents a group represented by any one of formulas (LC1-1) to (LC1-16):

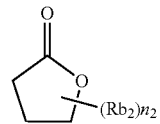

LC1-1

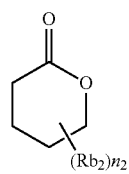

LC1-2

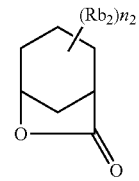

LC1-3

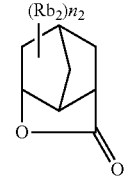

LC1-4

LC1-5
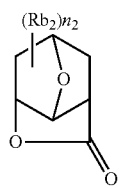

LC1-6
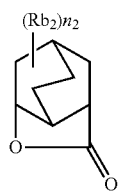

LC1-7
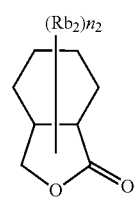

LC1-8
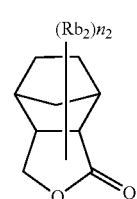

LC1-9
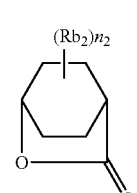

LC1-10
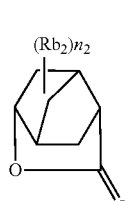

LC1-11
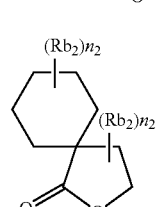

LC1-12
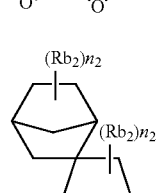

LC1-13
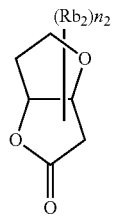

LC1-14
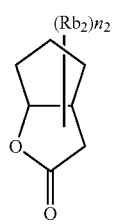

LC1-15
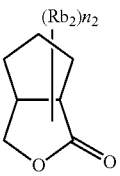

LC1-16
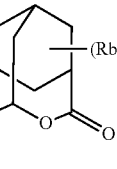

wherein the substituent $R_{b2}$ is selected from the group consisting of an alkyl group having from 1 to 8 carbon atoms, a cycloalkyl group having from 4 to 7 carbon atoms, an alkoxy group having from 1 to 8 carbon atoms, an alkoxycarbonyl group having from 2 to 8 carbon atoms, a carboxyl group, a halogen atom, a hydroxy group, a cyano group and an acid-decomposable group; and $n_2$ represents an integer of 0 to 4, provided that when $n_2$ is 2 or more, the plural $R_{b2}$s may be the same or different from each other, or the plural $R_{b2}$s may be combined with each other to form a ring.

9. The positive resist composition as claimed in claim 8, wherein $A_b$ is a connecting group represented by -$Ab_1$-$CO_2$-, and $Ab_1$ is a straight-chain or branched alkylene group or a monocyclic or polycyclic cycloalkylene group.

10. The positive resist composition as claimed in claim 1, wherein the resin (C) has a group which is decomposed by an action of an alkali developer to increase solubility in the alkali developer.

11. The positive resist composition as claimed in claim 1, wherein the resist composition contains the resin (C) in an amount of 0.1 to 5% by mass, based on the entire solid components of the resist composition.

12. The positive resist composition as claimed in claim 1, wherein the resin (C) has any one of the repeating units shown below:

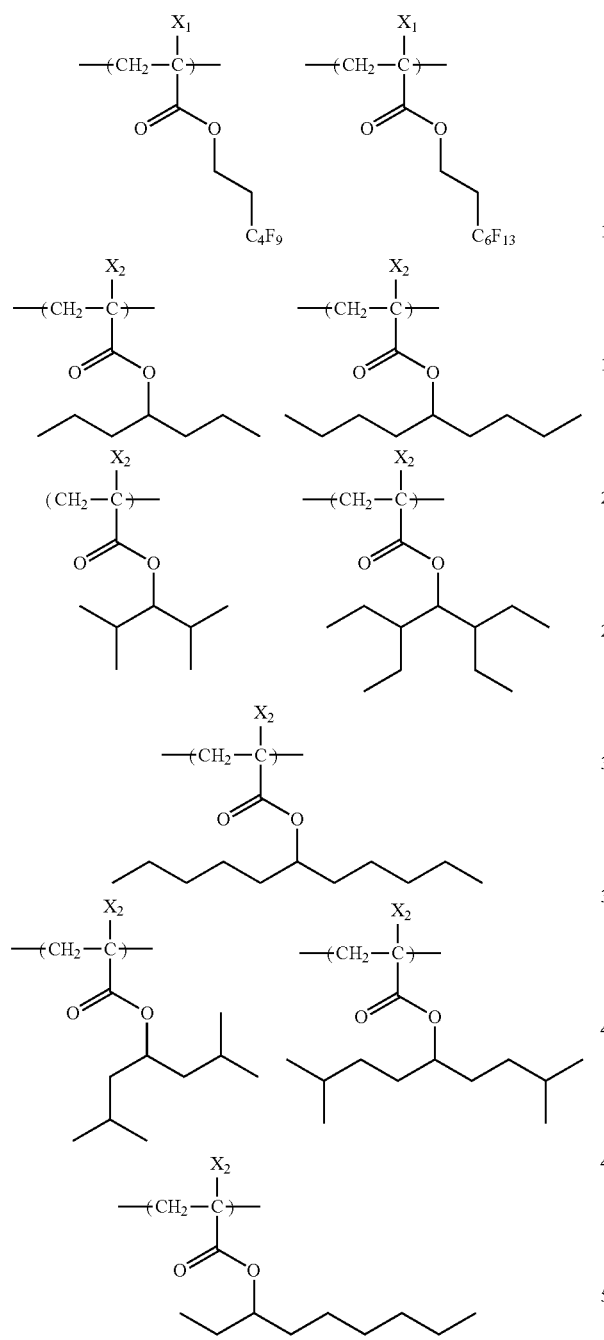

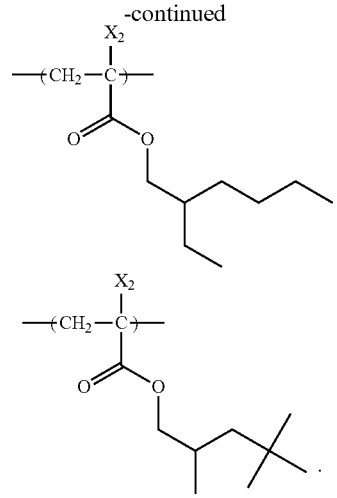

13. A pattern-forming method comprising:
forming a resist film with a positive resist composition; and
exposing and developing the resist film, wherein the positive resist composition comprises:
(A) a resin which has a monocyclic or polycyclic alicyclic hydrocarbon structure and increases solubility in an alkali developer by an action of an acid;
(B) a compound which generates an acid upon irradiation of an actinic ray or radiation;
(C) a resin having a fluorine atom and not having a lactone structure; and
(D) a solvent;
wherein:
the resin (C) is to be localized on a surface of a resist film so as to hydrophobilize the surface of a resist film and is a resin in which a peak area of a high molecular weight component having a molecular weight of 30,000 or more is 0.1% or less of a total peak area in a molecular weight distribution measured by gel permeation chromatography,
the resin (C) is produced by a method comprising supplying continuously or intermittently a solution containing a polymerizable monomer from a first tank and a solution containing a polymerization initiator from a second tank, said first and second tanks being separated from each other, to a polymerization system heated at polymerization temperature to undergo radical polymerization;
the resin (C) has neither an acid decomposable group nor an alkali-soluble group; and
the amount of the resin (C) added is from 0.1 to 10% by weight, based on the total solids content of the resin composition.

* * * * *